(12) United States Patent
Tanaka et al.

(10) Patent No.: US 11,217,668 B2
(45) Date of Patent: Jan. 4, 2022

(54) SEMICONDUCTOR DEVICE AND MANUFACTURING METHOD THEREOF

(71) Applicant: SEMICONDUCTOR ENERGY LABORATORY CO., LTD., Atsugi (JP)

(72) Inventors: Tetsuhiro Tanaka, Tokyo (JP); Kazuki Tanemura, Kanagawa (JP); Daisuke Matsubayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/736,862

(22) Filed: Jan. 8, 2020

(65) Prior Publication Data

US 2020/0152671 A1 May 14, 2020

Related U.S. Application Data

(62) Division of application No. 15/220,498, filed on Jul. 27, 2016, now Pat. No. 10,553,690.

(30) Foreign Application Priority Data

Aug. 4, 2015 (JP) .................................. 2015-154018
Feb. 10, 2016 (JP) .................................. 2016-023269

(51) Int. Cl.
*H01L 29/786* (2006.01)
*H01L 29/40* (2006.01)
(Continued)

(52) U.S. Cl.
CPC ........ *H01L 29/408* (2013.01); *H01L 23/5223* (2013.01); *H01L 27/1207* (2013.01);
(Continued)

(58) Field of Classification Search
CPC ........... H01L 27/1251; H01L 29/42384; H01L 29/42344; H01L 29/7869; H01L 29/792
See application file for complete search history.

(56) References Cited

U.S. PATENT DOCUMENTS 5,528,032 A 6/1996 Uchiyama
5,744,864 A 4/1998 Cillessen et al.
(Continued)

FOREIGN PATENT DOCUMENTS

JP 63-239117 A 10/1988
JP 06-275697 A 9/1994
(Continued)

*Primary Examiner* — Xiaoming Liu
(74) *Attorney, Agent, or Firm* — Fish & Richardson P.C.

(57) ABSTRACT

A miniaturized transistor with reduced parasitic capacitance and highly stable electrical characteristics is provided. High performance and high reliability of a semiconductor device including the transistor is achieved. A first conductor is formed over a substrate, a first insulator is formed over the first conductor, a layer that retains fixed charges is formed over the first insulator, a second insulator is formed over the layer that retains fixed charges, and a transistor is formed over the second insulator. Threshold voltage $V_{th}$ is controlled by appropriate adjustment of the thicknesses of the first insulator, the second insulator, and the layer that retains fixed charges.

16 Claims, 43 Drawing Sheets

(51) Int. Cl.
  *H01L 49/02* (2006.01)
  *H01L 27/12* (2006.01)
  *H01L 23/522* (2006.01)
  *H01L 27/06* (2006.01)
  *H01L 21/8258* (2006.01)

(52) U.S. Cl.
  CPC ...... *H01L 27/1225* (2013.01); *H01L 27/1251* (2013.01); *H01L 27/1255* (2013.01); *H01L 28/00* (2013.01); *H01L 28/60* (2013.01); *H01L 29/78648* (2013.01); *H01L 29/78696* (2013.01); *H01L 21/8258* (2013.01); *H01L 27/0629* (2013.01); *H01L 27/0688* (2013.01)

(56) References Cited

U.S. PATENT DOCUMENTS

| | | | |
|---|---|---|---|
| 7,157,773 B2 | 1/2007 | Kato et al. |
| 7,674,650 B2 | 3/2010 | Akimoto et al. |
| 7,692,223 B2 | 4/2010 | Isobe et al. |
| 7,791,072 B2 | 9/2010 | Kumomi et al. |
| 7,803,640 B2 | 9/2010 | Izumi |
| 7,851,279 B2 | 12/2010 | Takano et al. |
| 8,022,469 B2 | 9/2011 | Takano et al. |
| 8,067,775 B2 | 11/2011 | Miyairi et al. |
| 8,237,166 B2 | 8/2012 | Kumomi et al. |
| 8,384,080 B2 | 2/2013 | Taniguchi et al. |
| 8,486,774 B2 | 7/2013 | Terai et al. |
| 8,541,846 B2 | 9/2013 | Saito |
| 8,547,771 B2 | 10/2013 | Koyama |
| 8,581,332 B2 | 11/2013 | Takano et al. |
| 8,674,979 B2 | 3/2014 | Hayakawa |
| 8,692,252 B2 | 4/2014 | Takata et al. |
| 8,847,230 B2 | 9/2014 | Terai et al. |
| 8,896,049 B2 | 11/2014 | Isobe et al. |
| 8,947,158 B2 | 2/2015 | Watanabe |
| 8,962,457 B2 | 2/2015 | Watanabe |
| 8,995,174 B2 | 3/2015 | Koyama |
| 9,024,317 B2 | 5/2015 | Endo et al. |
| 9,029,851 B2 | 5/2015 | Miyairi et al. |
| 9,184,173 B2 | 11/2015 | Takano et al. |
| 9,269,822 B2 | 2/2016 | Yamamoto et al. |
| 9,287,258 B2 | 3/2016 | Saito |
| 9,799,666 B2 | 10/2017 | Saito |
| 9,893,194 B2 | 2/2018 | Yamamoto et al. |
| 10,020,309 B2 | 7/2018 | Saito |
| 10,424,582 B2 | 9/2019 | Saito |
| 2004/0246765 A1* | 12/2004 | Kato | G11C 11/404 365/149 |
| 2008/0145985 A1* | 6/2008 | Chi | H01L 27/11573 438/199 |
| 2010/0059744 A1 | 3/2010 | Yin et al. |
| 2012/0292615 A1 | 11/2012 | Saito |
| 2013/0191673 A1 | 7/2013 | Koyama et al. |
| 2014/0035028 A1* | 2/2014 | Takano | H01L 27/13 257/326 |
| 2015/0008428 A1* | 1/2015 | Yamamoto | H01L 29/40114 257/43 |
| 2015/0011046 A1 | 1/2015 | Tanaka et al. |
| 2015/0054571 A1 | 2/2015 | Watanabe et al. |
| 2015/0149795 A1 | 5/2015 | Watanabe |
| 2015/0228677 A1 | 8/2015 | Miyairi et al. |
| 2015/0263175 A1 | 9/2015 | Koyama |
| 2016/0043110 A1 | 2/2016 | Atsumi et al. |
| 2018/0233597 A1 | 8/2018 | Yamamoto et al. |

FOREIGN PATENT DOCUMENTS

| | | |
|---|---|---|
| JP | 11-505377 | 5/1999 |
| JP | 2002-353342 A | 12/2002 |
| JP | 2004-039965 A | 2/2004 |
| JP | 2009-033141 A | 2/2009 |
| JP | 2012-059860 A | 3/2012 |
| JP | 2012-257187 A | 12/2012 |
| JP | 2013-048246 A | 3/2013 |
| JP | 5215589 | 6/2013 |
| JP | 2013-247143 A | 12/2013 |
| JP | 2015-035597 A | 2/2015 |
| JP | 2015-079950 A | 4/2015 |
| JP | 2015-079951 A | 4/2015 |
| WO | WO-2009/004919 | 1/2009 |
| WO | WO-2011/102205 | 8/2011 |

\* cited by examiner

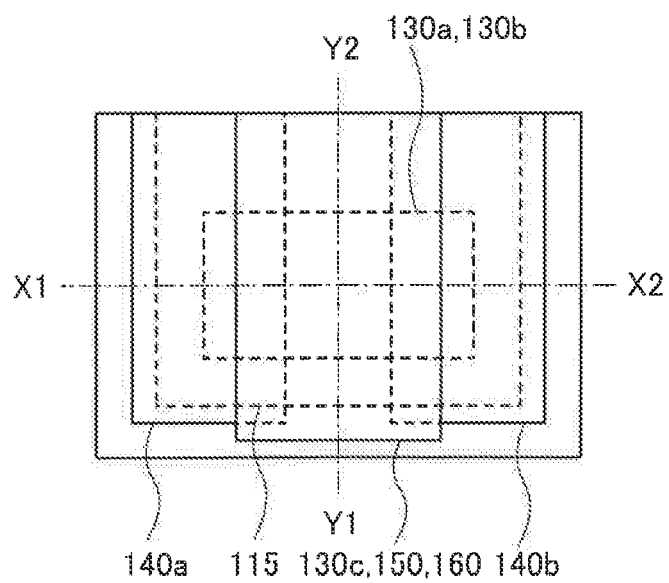
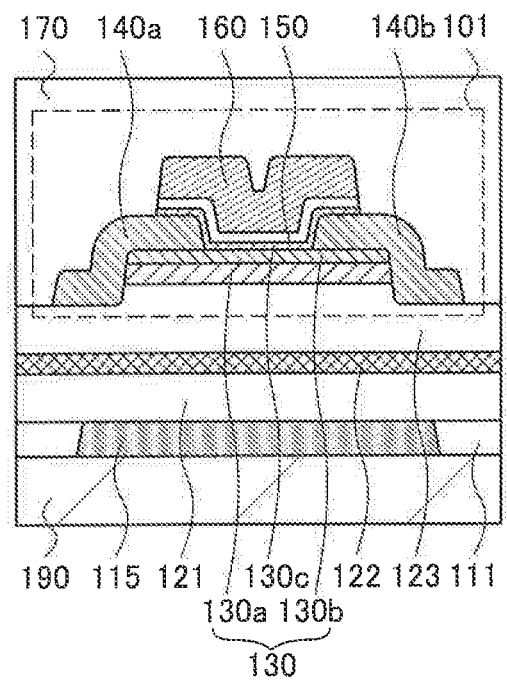
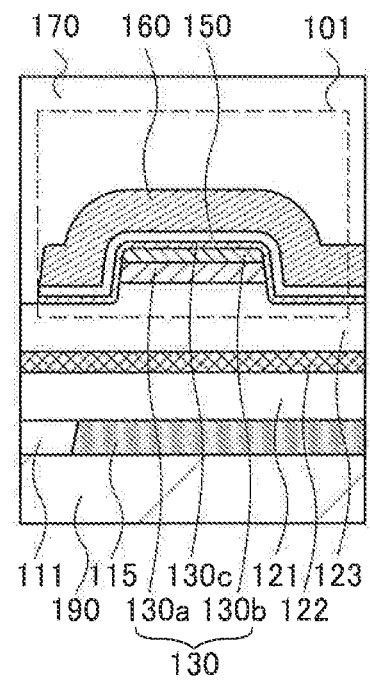

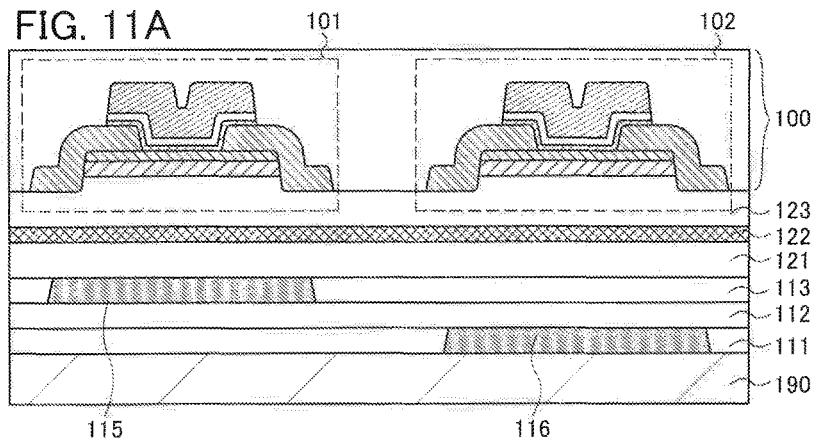
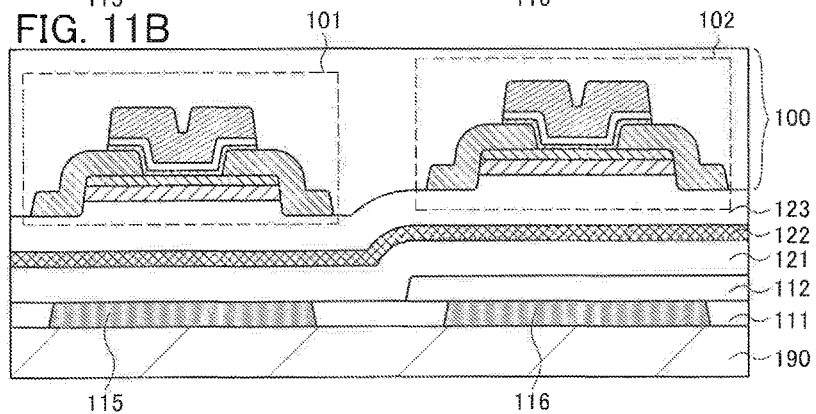
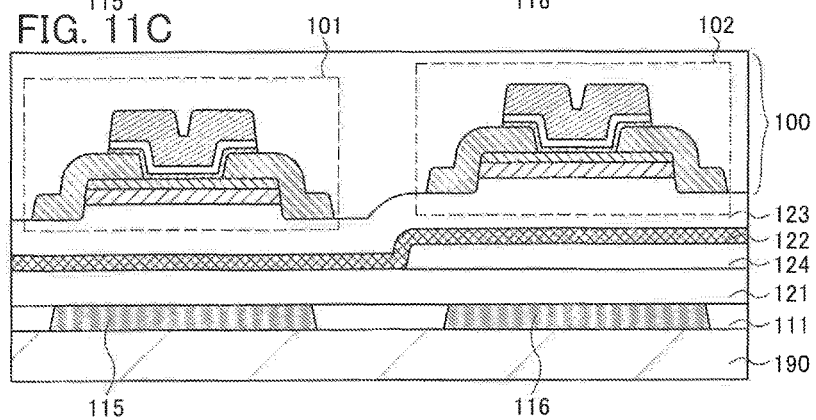

FIG. 36A1
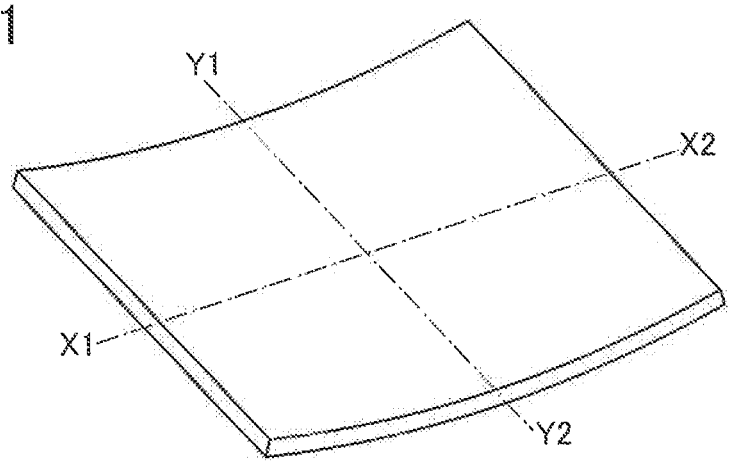
FIG. 36A2
FIG. 36A3
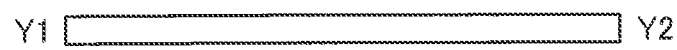
FIG. 36B1
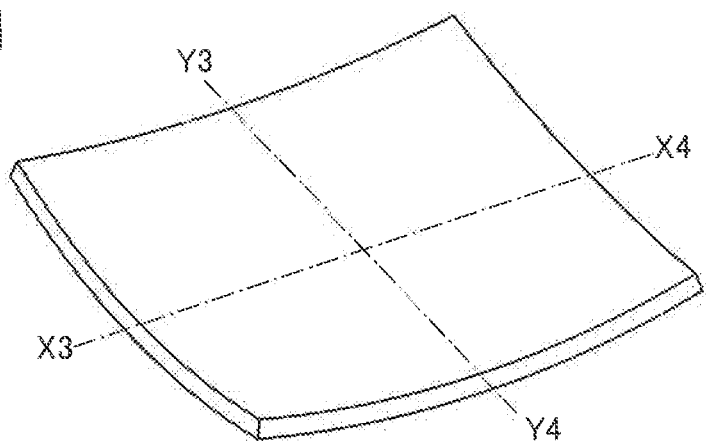
FIG. 36B2
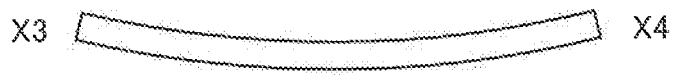
FIG. 36B3

SEMICONDUCTOR DEVICE AND MANUFACTURING METHOD THEREOF

CROSS-REFERENCE TO RELATED APPLICATIONS

This application is a divisional of U.S. application Ser. No. 15/220,498, filed Jul. 27, 2016, now allowed, which claims the benefit of foreign priority applications filed in Japan as Serial No. 2015-154018 on Aug. 4, 2015, and Serial No. 2016-023269 on Feb. 10, 2016, all of which are incorporated by reference.

BACKGROUND OF THE INVENTION

1. Field of the Invention

The present invention relates to, for example, an oxide, a transistor, a semiconductor device, and manufacturing methods thereof. The present invention relates to, for example, an oxide, a display device, a light-emitting device, a lighting device, a power storage device, a memory device, a processor, an imaging device, and an electronic device. The present invention relates to methods for manufacturing an oxide, a display device, a liquid crystal display device, a light-emitting device, a memory device, a processor, an imaging device, and an electronic device. The present invention relates to methods for driving a semiconductor device, a display device, a liquid crystal display device, a light-emitting device, a memory device, a processor, an imaging device, and an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

In this specification and the like, a semiconductor device refers to any device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a pixel circuit and a driver circuit are formed over the same substrate, it is preferable to use polycrystalline silicon, which can be used to form a transistor having high field-effect mobility. As a method for forming polycrystalline silicon, high-temperature heat treatment or laser light treatment which is performed on amorphous silicon has been known.

In recent years, transistors including oxide semiconductors (typically, an In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

In addition, a transistor including an amorphous oxide semiconductor is disclosed (see Patent Document 3). An oxide semiconductor can be formed by a sputtering method or the like, and thus can be used for a semiconductor of a transistor in a large display device. A transistor including an oxide semiconductor has high field-effect mobility; therefore, a high-performance display device where a pixel circuit and a driver circuit are formed over the same substrate can be obtained. Moreover, there is an advantage that capital investment can be reduced because part of production equipment for a transistor including amorphous silicon can be retrofitted and utilized.

It is known that a transistor including an oxide semiconductor has an extremely low leakage current in an off state. For example, a low-power-consumption CPU utilizing the low leakage current characteristic of a transistor including an oxide semiconductor is disclosed (see Patent Document 4). It is also disclosed that a transistor having high field-effect mobility can be obtained by a well potential formed using an active layer including an oxide semiconductor (see Patent Document 5).

Miniaturization of transistors has been progressing with an increase in the degree of integration of circuits. Miniaturization of transistors may cause deterioration of the electrical characteristics of the transistors, such as on-state current, off-state current, threshold voltage, and a subthreshold swing (S value). In general, a decrease in channel length leads to a decrease in on-state current, an increase in off-state current, an increase in fluctuation of threshold, and an increase in S value.

Thus, in the case where a miniaturized integrated circuit is formed, the threshold voltage ($V_{th}$) needs to be controlled in order to achieve desired switching operation. The threshold voltage ($V_{th}$) is an important parameter that determines the switching characteristics of transistors, and a difference from the desired value hinders circuit operation.

REFERENCES

Patent Documents

[Patent Document 1] Japanese Published Patent Application No. S63-239117
[Patent Document 2] Japanese Translation of PCT International Application No. H11-505377
[Patent Document 3] Japanese Patent No. 5215589
[Patent Document 4] Japanese Published Patent Application No. 2012-257187
[Patent Document 5] Japanese Published Patent Application No. 2012-59860

SUMMARY OF THE INVENTION

An object of one embodiment disclosed in this specification is to provide a normally-off semiconductor device, which is in a non-conduction state (also referred to as an off state) even when the gate voltage of the transistor is 0 V. Another object is to provide a semiconductor device including a miniaturized transistor. Another object is to provide a highly integrated semiconductor device. Another object is to provide a semiconductor device with improved on-state current characteristics. Another object is to provide a low-power semiconductor device. Another object is to provide a highly reliable semiconductor device. Another object is to provide a semiconductor device having favorable characteristics.

Another object of one embodiment of the disclosed invention is to achieve high performance, high reliability, and high productivity of a semiconductor device including the transistor. Alternatively, an object of one embodiment of the disclosed invention is to provide a semiconductor device in which oxygen is easily supplied to a channel layer of the transistor. Another object is to provide a novel semiconductor device. Note that the descriptions of these objects do not exclude the existence of other objects. Note that one embodiment of the disclosed invention does not necessarily achieve all the objects listed above. Other objects will be apparent from and can be derived from the description of the specification, the drawings, the claims, and the like.

A transistor provided in a semiconductor device includes a first conductor over a substrate, a first insulator over the first conductor, a charge retention layer over the first insulator, a second insulator over the charge retention layer, and a transistor over the second insulator.

In the above structure, the charge retention layer includes any one of hafnium oxide, hafnium oxynitride, aluminum oxide, and aluminum oxynitride.

A transistor provided in a semiconductor device includes a first transistor and a second transistor over a substrate. The first transistor is provided over a first conductor, a first insulator, a first charge retention layer, and a second insulator. The second transistor is provided over a second conductor, a third insulator, a second charge retention layer, and a fourth insulator. The thickness of the first insulator and the thickness of the third insulator are different from each other.

A transistor provided in a semiconductor device includes a first transistor and a second transistor over a substrate. The first transistor is provided over a first conductor, a first insulator, a first charge retention layer, and a second insulator. The second transistor is provided over a second conductor, a third insulator, a second charge retention layer, and a fourth insulator. The thickness of the second insulator and the thickness of the fourth insulator are different from each other.

A transistor provided in a semiconductor device includes a first transistor and a second transistor over a substrate. The first transistor is provided over a first conductor, a first insulator, a first charge retention layer, and a second insulator. The second transistor is provided over a second conductor, a third insulator, a second charge retention layer, and a fourth insulator. The thickness of the first charge retention layer and the thickness of the second charge retention layer are different from each other.

In the transistor provided in the semiconductor device, the first charge retention layer or the second charge retention layer includes any one of hafnium oxide, hafnium oxynitride, aluminum oxide, and aluminum oxynitride.

One embodiment of the present invention is an electronic device including the semiconductor device having any of the above structures and at least one of a battery, an antenna, a housing, and an operation switch.

The threshold voltage of the semiconductor device can be adjusted to an appropriate value. Alternatively, degradation of electrical characteristics of the semiconductor device due to miniaturization can be suppressed.

A transistor having a high on-state current can be provided. A semiconductor device including a transistor capable of high-speed operation can be provided. A transistor of the present invention can have favorable driving characteristics because of its high on-state current and low off-state current. A transistor with high and stable electrical characteristics can be provided even when the transistor is miniaturized.

Also in a semiconductor device including the transistor, high performance, high reliability, and high productivity can be achieved. Alternatively, a novel semiconductor device can be provided. Note that the description of these effects does not exclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 2A to 2C are a top view and cross-sectional views illustrating one embodiment of a semiconductor device.

FIGS. 11A to 11C are cross-sectional views each illustrating one embodiment of a semiconductor device.

FIGS. 36A1, 36A2, 36A3, 36B1, 36B2, and 36B3 are perspective views and cross-sectional views illustrating semiconductor devices of one embodiment of the present invention.

DETAILED DESCRIPTION OF THE INVENTION

Figure 1:
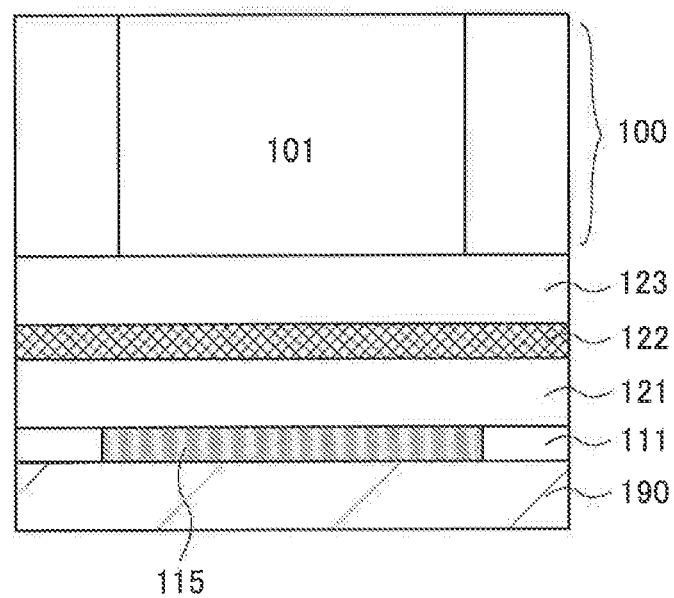
FIG. 1 is a cross-sectional view illustrating one embodiment of a semiconductor device.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. The same hatching pattern is applied to portions having similar functions, and the portions are not especially denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and a current can flow through the drain, the channel region, and the source. Note that in this specification and the like, a channel region refers to a region through which current mainly flows.

Functions of a source and a drain are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Embodiment 1

In this embodiment, one embodiment of a semiconductor device is described with reference to FIG. 1, FIGS. 2A to 2C, FIG. 3, FIGS. 4A and 4B, FIGS. 5A to 5C, FIGS. 6A to 6C, and FIGS. 7A to 7C.

<Structural Example 1 of Semiconductor Device>

In this embodiment, a structure of a semiconductor device that includes a layer including a transistor, a first insulator, a fixed charge layer, a second insulator, and a layer including a conductor is described. FIG. 1 illustrates a semiconductor device that includes, over a substrate 190, an insulator 111 including a conductor 115, an insulator 121, a fixed charge layer 122, an insulator 123, and a layer 100 including a transistor 101.

Since electrons (hereinafter, referred to as fixed charges) exist at an interface between the fixed charge layer 122 and the insulator 123 and an interface between the fixed charge layer 122 and the insulator 121 and inside the fixed charge layer 122, the fixed charge layer 122 is negatively charged. As detailed later, the conductor 115, the insulator 121, and the fixed charge layer 122 function as a capacitor as in the case of application of a negative voltage to the conductor 115, and consequently the threshold voltage of the transistor 101 can be shifted in the positive direction. The shift of the threshold voltage in the positive direction can allow the transistor 101 to be a normally-off transistor, which is in a non-conduction state (also referred to as an off state) even when the gate voltage is 0 V.

Note that the conductor 115 may have other functions as long as it functions at least as one electrode of the capacitor by forming a stacked-layer structure with the fixed charge layer 122 and the insulator 121.

For example, the conductor 115 may function as a second gate electrode (also referred to as a back gate electrode) of the transistor 101. For example, when a voltage equal to that of the gate electrode of the transistor 101 is applied to the conductor 115, electric fields can be applied from upper and lower sides of an oxide semiconductor 130, so that the on-state current of the transistor can be increased. In addition, the off-state current of the transistor can be reduced.

The conductor 115 may function as a wiring. For example, in the case where a plurality of transistors and other structure bodies are stacked, the conductor 115 may also function as a wiring through which a voltage is applied to a transistor other than the transistor 101 or the structure bodies.

The voltage applied to the conductor 115 may be variable or fixed. When the voltage applied to the conductor 115 is variable, a circuit controlling the voltage may be electrically connected to the conductor 115.

Note that in the structure, fixed charges are required not to be transferred out of the fixed charge layer 122. Thus, electrons can be effectively held inside the fixed charge layer 122 or at the interface with another insulator when the electron affinity of each of the insulators 121 and 123 is smaller than that of the fixed charge layer 122 and the bandgap of each of the insulators 121 and 123 is larger than that of the fixed charge layer 122. In addition, the total thickness of the insulator 121, the fixed charge layer 122, and the insulator 123 is preferably set to a thickness with which the tunnel effect is not a problem. For example, the physical thickness is preferably 5 nm or more.

The fixed charge layer 122 allows control of the threshold voltage of the transistor 101. A transistor having a low leakage current in a non-conduction state can be provided. A transistor with stable electrical characteristics can be provided. A transistor having a high on-state current can be provided. A transistor having a small subthreshold swing value can be provided. A highly reliable transistor can be provided.

<Transistor Structure 1>

An example of a transistor of one embodiment of the present invention is described below. FIGS. 2A to 2C are a top view and cross-sectional views illustrating the transistor of one embodiment of the present invention. FIG. 2A is a top view, FIG. 2B is a cross-sectional view taken along the dashed-dotted line X1-X2 in FIG. 2A, and FIG. 2C is a cross-sectional view taken along the dashed-dotted line Y1-Y2 in FIG. 2A. Note that for simplification of the figure, some components in the top view in FIG. 2A are not illustrated.

One embodiment of the present invention includes the insulator 111 formed over the substrate 190, the conductor 115 embedded in the insulator 111, the insulator 121 formed over the conductor 115, the fixed charge layer 122 formed over the insulator 121, the insulator 123 formed over the fixed charge layer 122, and the transistor 101 and an insulator 170 which are formed over the insulator 123.

The transistor 101 includes a conductor 160 which functions as a gate electrode, the insulator 150 which functions as a gate insulating layer, the oxide semiconductor 130 which includes a region where a channel is formed, a conductor 140a which functions as one of a source and a drain, and a conductor 140b which functions as the other of the source and the drain.

The oxide semiconductor 130 includes an oxide semiconductor 130a, an oxide semiconductor 130b over the oxide semiconductor 130a, and an oxide semiconductor 130c over the oxide semiconductor 130b. When the transistor 101 is turned on, a current flows (a channel is formed) in the oxide semiconductor 130b. In contrast, although a current might flow in the vicinity of the interface (a mixed region in some cases) between the oxide semiconductor 130b and the oxide semiconductor 130a or 130c, the rest of the oxide semiconductors 130a and 130c might function as insulators.

Figure 3:
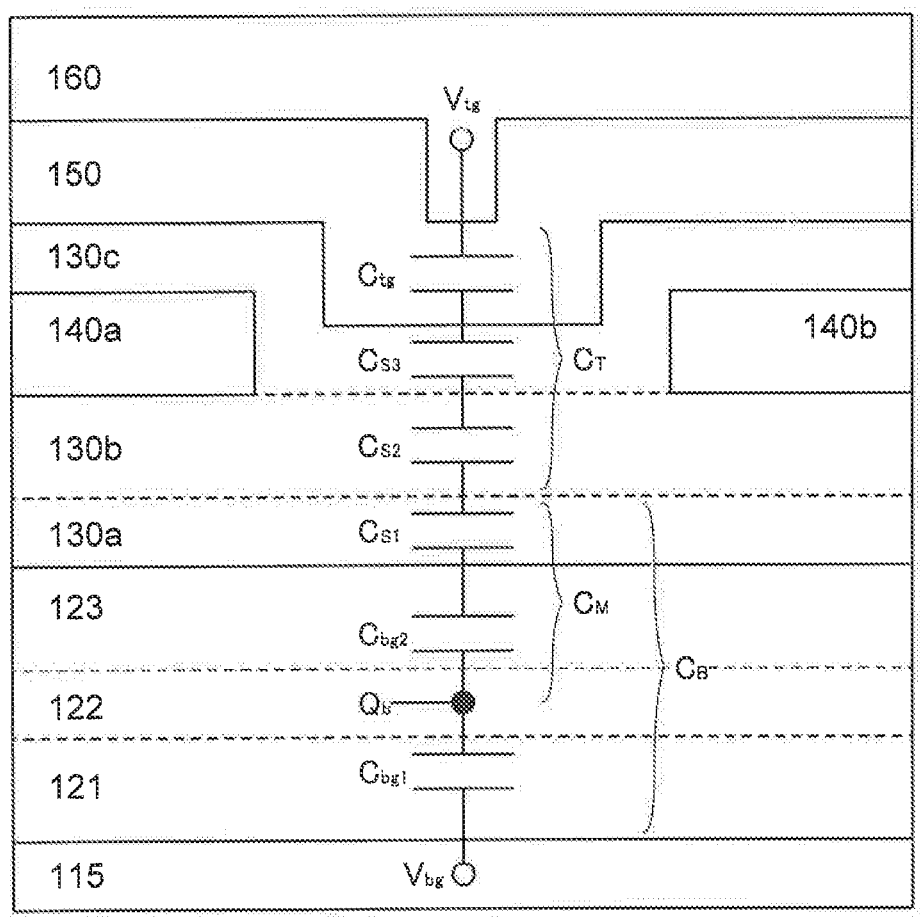
FIG. 3 illustrates a cross-sectional view and an equivalent circuit of the semiconductor device.

FIG. 3 shows an equivalent circuit corresponding to the stacked-layer structure in addition to a schematic cross-sectional view of the semiconductor device illustrated in FIGS. 2A to 2C. Note that the same components as those of the semiconductor device in FIGS. 2A to 2C are denoted by the same reference numerals.

The amount of charge per unit area of the fixed charge layer 122 is denoted by $Q_b$ (the middle of the fixed charge layer is assumed as the centroid of charge). The combined capacitance of the insulator 121 and the fixed charge layer 122 per unit area is denoted by $C_{bg1}$, and that of the fixed charge layer 122 and the insulator 123 per unit area is denoted by $C_{bg2}$. The capacitance of the oxide semiconductors 130a, 130b, and 130c and the insulator 150 per unit area are denoted by $C_{S1}$, $C_{S2}$, $C_{S3}$, and $C_{tg}$, respectively. The potential of the conductor 115 is denoted by $V_{bg}$, and that of the conductor 160 is denoted by $V_{tg}$.

Thus, the stacked-layer structure including the conductor 160 to the conductor 115 in the semiconductor device illustrated in FIGS. 2A to 2C and FIG. 3 can be shown as an equivalent circuit having capacitance corresponding to the insulator 121, the fixed charge layer 122, the insulator 123, the oxide semiconductors 130a, 130b, and 130c, and the insulator 150 between the conductors 160 and 115.

The variation $\Delta V_{th}$ in the threshold voltage $V_{th}$ due to the amount of charge $Q_b$ in the fixed charge layer 122 per unit area can be expressed by Formula (1). Note that $C_B$ denotes the combined capacitance of $C_{bg2}$, $C_{bg1}$, and $C_{S1}$ per unit area, $C_M$ denotes the combined capacitance of $C_{bg2}$ and $C_{S1}$ per unit area, and $C_T$ denotes the combined capacitance of $C_{S2}$, $C_{S3}$, and $C_{tg}$ per unit area.

[Formula 1]

$$\Delta V_{th} = -\frac{C_B}{C_T}\frac{Q_b}{C_{bg1}} = -\frac{C_M Q_b}{C_T(C_M + C_{bg1})} \quad (1)$$

Figure 4A:
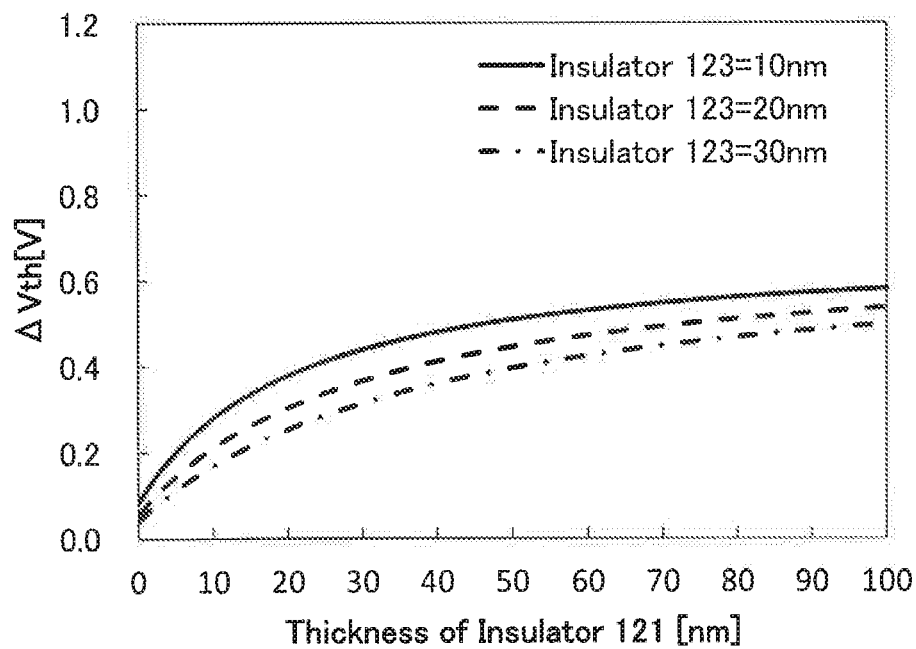
FIGS. 4A and 4B are graphs relating to Formula (1) for one embodiment of a semiconductor device.
Figure 4B:
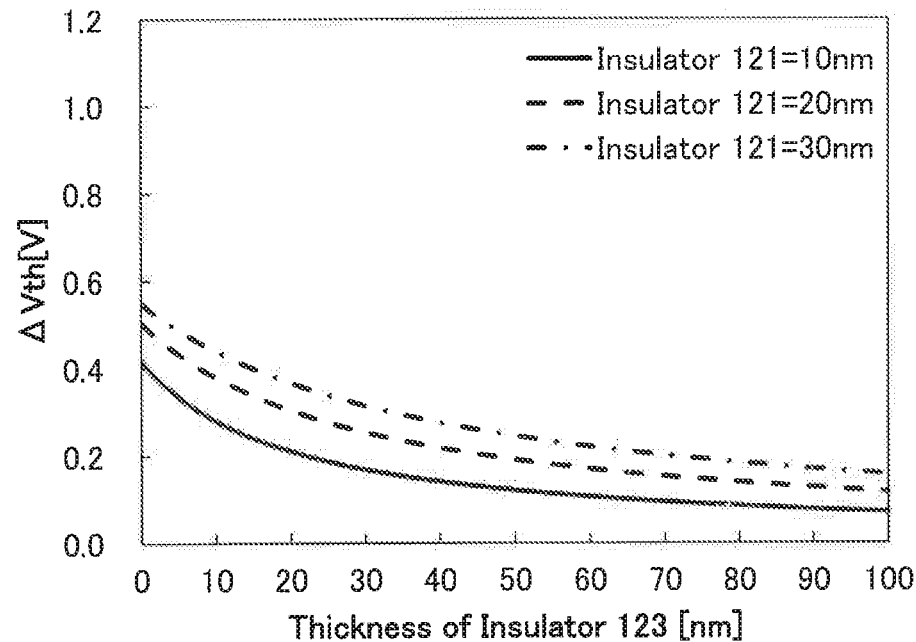

FIGS. 4A and 4B show the results of the variation $\Delta V_{th}$ in the equivalent circuit in FIG. 3, which are calculated from Formula (1). It is assumed in the calculations that the insulators 121 and 123 each have a dielectric constant of 4.1 and their thicknesses are variables, the fixed charge layer 122 has a dielectric constant of 16.4 and a thickness of 20 nm, that the oxide semiconductors 130a, 130b, and 130c each have a dielectric constant of 15 and their thicknesses are respectively 20 nm, 15 nm, and 5 nm, and that the insulator 150 has a dielectric constant of 4.1 and a thickness of 10 nm.

In addition, $Q_b$ is determined on the assumption that the middle of the film (10 nm away from each interface) is the centroid of negative charge at $-1 \times 10^{12}$ e/cm$^2$ in the fixed charge layer 122. Therefore, the capacitance of the insulator 121 per unit area and a half of the capacitance of the fixed charge layer 122 per unit area form the combined capacitance $C_{bg1}$. In addition, the capacitance of the insulator 123 per unit area and a half of the capacitance of the fixed charge layer 122 per unit area form the combined capacitance $C_{bg2}$.

FIG. 4A shows the results of the variation $\Delta V_{th}$ calculated in 1 nm steps between 0 and 100 nm of the thickness of the insulator 121. The solid line indicates the results obtained with the 10-nm-thick insulator 123. The broken line indicates the results obtained with the 20-nm-thick insulator 123. The dashed-dotted line indicates the results obtained with the 30-nm-thick insulator 123.

FIG. 4A and Formula (1) reveal that a decrease in $C_{bg1}$ increases the absolute value of the variation $\Delta V_{th}$. In other words, when $Q_b$ is a negative value, an increase in the thickness of the insulator 121 between the fixed charge layer 122 and the conductor 115 increases the variation $\Delta V_{th}$ of the threshold voltage $V_{th}$ in the positive direction.

FIG. 4B shows the results of the variation $\Delta V_{th}$ calculated in 1 nm steps between 0 and 100 nm of the thickness of the insulator 123. The solid line indicates the results obtained with the 10-nm-thick insulator 121. The broken line indicates the results obtained with the 20-nm-thick insulator 121. The dashed-dotted line indicates the results obtained with the 30-nm-thick insulator 121.

FIG. 4B and Formula (1) reveal that an increase in $C_M$ increases the variation $\Delta V_{th}$. In other words, when $Q_b$ is a negative value, a decrease in the thickness of the insulator 123 between the fixed charge layer 122 and the transistor 101 increases the variation of the threshold voltage $V_{th}$ in the positive direction.

Furthermore, as $Q_b$ becomes negatively large, the variation $\Delta V_{th}$ becomes large. In other words, an increase in the thickness of the fixed charge layer 122 increases the variation of the threshold voltage $V_{th}$ in the positive direction.

For example, when fixed charges are localized at the interface between the fixed charge layer 122 and the insulator 121, an increase in the thickness of the fixed charge layer 122 hardly changes the variation in the threshold voltage $V_{th}$. In contrast, when fixed charges are not localized at the interface between the fixed charge layer 122 and the insulator 121, an increase in the thickness of the fixed charge layer 122 increases the variation $\Delta V_{th}$ in the threshold voltage.

Small $C_T$ and large $C_B$ lead to a large variation $\Delta V_{th}$ and can improve controllability. In other words, the threshold voltage $V_{th}$ can be controlled by appropriate adjustment of the thicknesses of all the layers forming the transistor 101 and the thicknesses of the insulator 121, the fixed charge layer 122, and the insulator 123.

There is no particular limitation on the substrate that can be used as the substrate 190. For example, a glass substrate of barium borosilicate glass, aluminoborosilicate glass, or the like, a ceramic substrate, a quartz substrate, or a sapphire substrate, or the like can be used. Alternatively, a single crystal semiconductor substrate or a polycrystalline semiconductor substrate of silicon, silicon carbide, or the like, a compound semiconductor substrate of silicon germanium, gallium arsenide, indium arsenide, or indium gallium arsenide, or the like, a silicon-on-insulator (SOI) substrate, a germanium-on-insulator (GOI) substrate, or the like can be used. Further alternatively, any of these substrates provided with a semiconductor element may be used.

Alternatively, a flexible substrate may be used as the substrate. A transistor may be directly formed over a flexible substrate; or alternatively, a transistor may be formed over a substrate and then separated from the substrate and transferred to a flexible substrate. For separation of the transistor from the substrate and transfer to the flexible substrate, a separation layer may be provided between the substrate and the transistor including the oxide semiconductor.

As the insulator 111, a silicon oxide film, a silicon oxynitride film, or the like can be used. As the insulator 111, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator formed of such a material functions as a layer that prevents entry of an impurity such as hydrogen from the substrate. The insulator 111 may have a stacked-layer structure.

The conductor 115 can be formed using a metal film containing an element selected from molybdenum, titanium, tantalum, tungsten, aluminum, copper, chromium, neodymium, and scandium, a metal nitride film containing any of the above elements as its component (e.g., a titanium nitride film, a molybdenum nitride film, or a tungsten nitride film), or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. The conductor 115 can have a stacked-layer structure of the above conductive material and the above metal material.

Each of the insulators 121 and 123 is preferably an insulator containing oxygen, such as a silicon oxide film or a silicon oxynitride film. Note that as the insulator 123, an insulator containing excessive oxygen (containing oxygen in excess of that in the stoichiometric composition) is preferably used. When such an insulator containing excess oxygen is provided in contact with the oxide semiconductor 130, oxygen vacancies in the oxide semiconductor 130 can be compensated. Note that the insulators 121 and 123 are not necessarily formed of the same material.

The insulators 121 and 123 may each have a stacked-layer structure. For example, an insulating film containing excess oxygen is provided in contact with the oxide semiconductor 130 and covered by a barrier film, whereby the composition of the oxide can be almost the same as the stoichiometric composition or can be in a supersaturated state containing more oxygen than that in the stoichiometric composition. It is also possible to prevent entry of an impurity such as hydrogen into the oxide semiconductor 130.

For the fixed charge layer 122, hafnium oxide, hafnium oxynitride, aluminum oxide, aluminum oxynitride, gallium oxide, gallium oxynitride, yttrium oxide, yttrium oxynitride, zirconium oxide, zirconium oxynitride, silicon nitride, tantalum oxide, titanium oxide, strontium titanium oxide (STO), barium strontium titanium oxide (BST), or the like can be used. Note that the fixed charge layer 122 may have a stacked-layer structure of two or more layers; in that case, the stacked-layer structure is not limited to being formed of the same materials and may be formed of different materials.

As any of the insulator 121, the insulator 123, and the fixed charge layer 122, a substance having barrier properties against oxygen or hydrogen is preferably used. When such a material is used, release of oxygen from the oxide semiconductor 130 or entry of an impurity such as hydrogen from the outside can be prevented.

When the insulators 121 and 123 are formed using silicon oxide and the fixed charge layer 122 is formed using hafnium oxide, the insulators 121 and 123 may be formed by a chemical vapor deposition method (including a CVD method and an atomic layer deposition (ALD) method) and the fixed charge layer 122 may be formed by a sputtering method. Note that using a sputtering method for the formation of the fixed charge layer 122 might easily crystallize the fixed charge layer 122 at low temperature to generate a large amount of fixed charges.

An oxide semiconductor applicable to the oxide semiconductor 130 preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

An oxide semiconductor has a wide energy gap of 3.0 eV or more. A transistor including an oxide semiconductor film obtained by processing of the oxide semiconductor in an appropriate condition and a sufficient reduction in the carrier density of the oxide semiconductor can have much lower leakage current between a source and a drain in an off state (off-state current) than a conventional transistor including silicon.

The case where the oxide semiconductor 130 contains indium, an element M, and zinc is considered. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. A favorable range of the atomic ratio of indium to the element M and zinc (x:y:z) of the oxide semiconductor 130 is described with reference to FIGS. 20A and 20B.

Figure 20A:
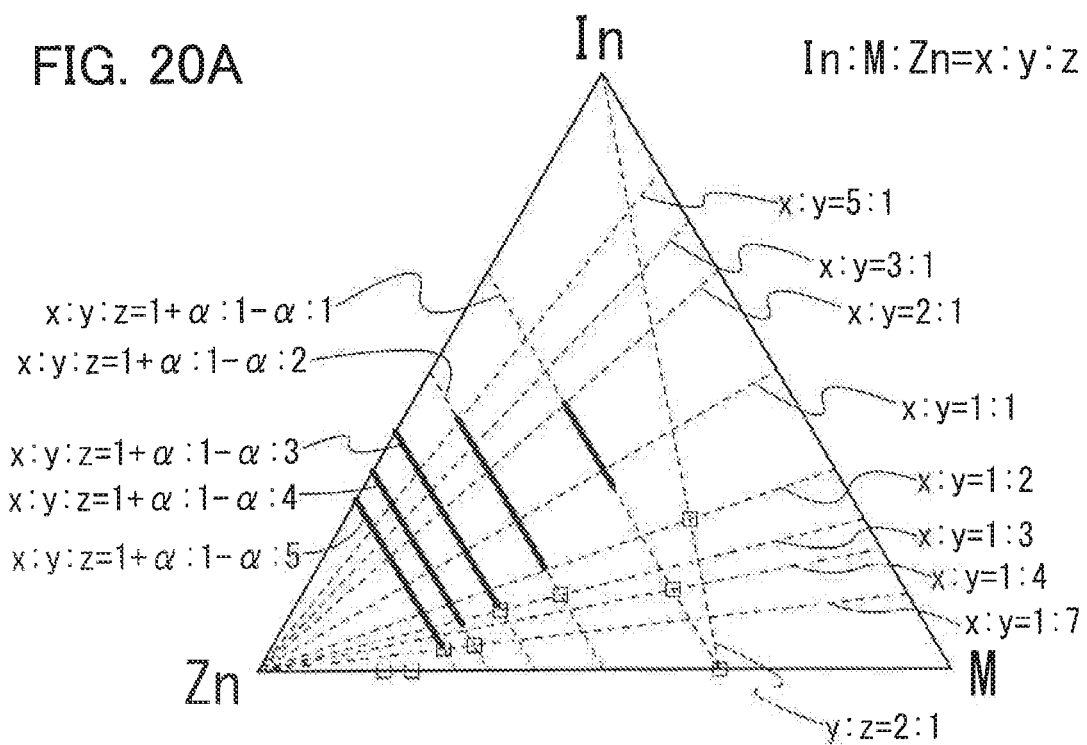
FIGS. 20A and 20B show atomic ratios in an oxide semiconductor of one embodiment of the present invention.
Figure 20B:
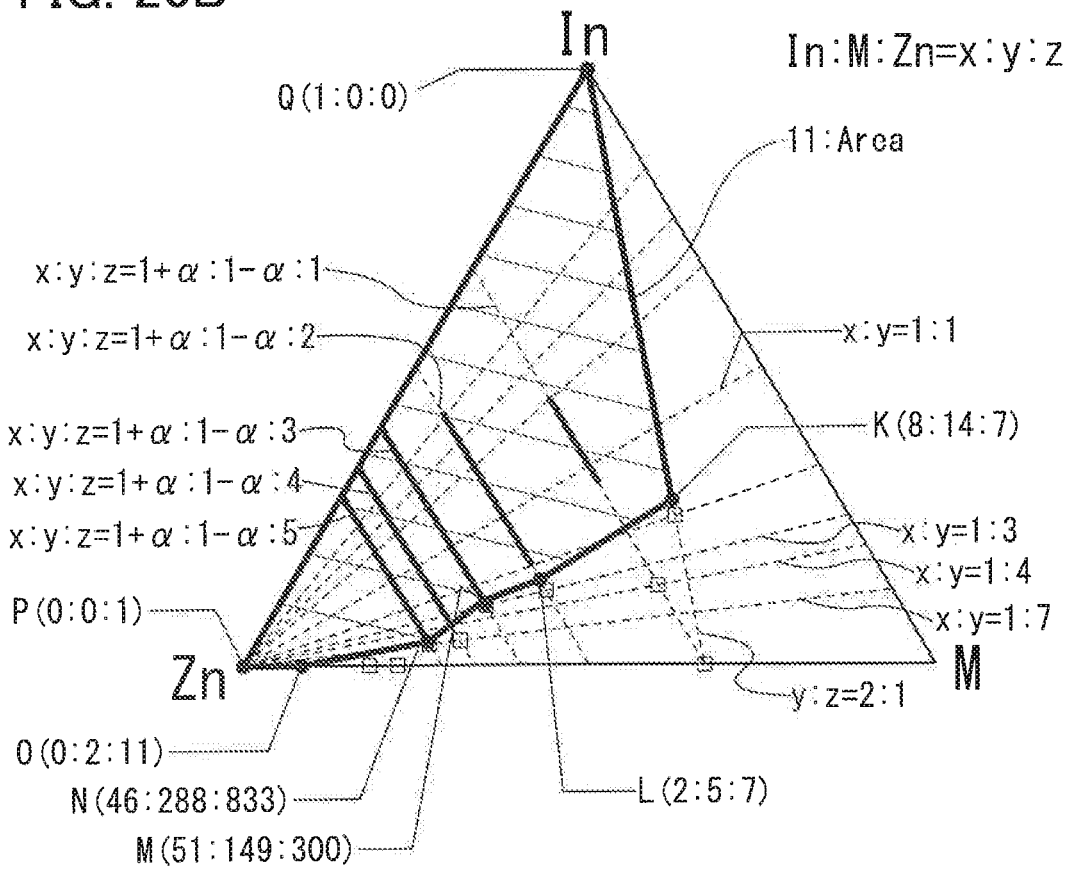

FIGS. 20A and 20B show the ranges of the atomic ratios of indium to the element M and zinc in the oxide semiconductor 130. Here, FIGS. 20A and 20B show examples in which the element M is Ga. Note that the proportion of oxygen atoms is not shown in FIGS. 20A and 20B.

For example, it is known that there is a homologous series represented by $InMO_3(ZnO)_m$ (m is a natural number) as one of oxide semiconductors containing indium, the element M, and zinc. Here, for example, the case where the element M is Ga is considered. It is known that regions denoted by thick lines in FIGS. 20A and 20B indicate compositions which allow a single-phase solid solution range when powders of $In_2O_3$, $Ga_2O_3$, and ZnO are mixed and sintered at 1350° C., for example. Coordinates denoted by square symbols in FIGS. 20A and 20B correspond to known compositions with which a spinel crystal structure is likely to be mixed.

For example, a compound represented by $ZnM_2O_4$, such as $ZnGa_2O_4$, is known as having a spinel crystal structure. Furthermore, when the composition is in the neighborhood of the composition of $ZnGa_2O_4$ as illustrated in FIGS. 20A and 20B, that is, the ratio of x to y and z is close to 0:2:1, a spinel crystal structure is likely to be formed or mixed.

The oxide semiconductor 130 is preferably a c-axis aligned crystalline oxide semiconductor (CAAC-OS) film. The CAAC-OS film having no spinel crystal structure is preferred. In addition, to increase carrier mobility, the indium content is preferably increased.

In the oxide semiconductor 130 containing indium, the element M, and zinc, the s orbital of heavy metal mainly contributes to carrier transfer, and when the indium content in the oxide semiconductor is increased, overlaps of the s orbitals of In atoms are increased; therefore, an oxide semiconductor having a high content of indium has higher mobility than an oxide semiconductor having a low content of indium. Therefore, an oxide semiconductor having a high content of indium is used as the oxide semiconductor 130, whereby the carrier mobility can be increased.

Accordingly, the atomic ratio of indium to the element M and zinc, x:y:z, in the oxide semiconductor 130 is preferably within the range of an area 11 shown in FIG. 20B, for example. Here, the area 11 includes atomic ratios within the range of an area surrounded by line segments that connect first coordinates K (x:y:z=8:14:7), second coordinates L (x:y:z=2:5:7), third coordinates M (x:y:z=51:149:300), fourth coordinates N (x:y:z=46:288:833), fifth coordinates O (x:y:z=0:2:11), sixth coordinates P (x:y:z=0:0:1), and seventh coordinates Q (x:y:z=1:0:0), in this order. Note that the area 11 also includes coordinates positioned on the straight line.

When x:y:z is within the area 11 in FIG. 20B, a spinel crystal structure is not observed or is hardly observed by nanobeam diffraction. Thus, an excellent CAAC-OS film can be obtained. Furthermore, carrier scattering or the like at the boundary between a CAAC structure and a spinel crystal structure can be reduced; therefore, when the oxide semiconductor 130 is used for a transistor, the transistor can have high field-effect mobility. In addition, the transistor can have high reliability.

An influence of impurities in the oxide semiconductor 130 is described. In order to obtain stable electrical characteristics of the transistor, it is effective to reduce the concentration of impurities in the oxide semiconductor 130 to have lower carrier density so that the oxide semiconductor 130 is highly purified. The carrier density of the oxide semiconductor 130 is set to be higher than or equal to $1 \times 10^{-9}/cm^3$, and lower than $8 \times 10^{11}/cm^3$, preferably lower than $1 \times 10^{11}/cm^3$, further preferably lower than $1 \times 10^{10}/cm^3$. In order to reduce the concentration of impurities in the oxide semiconductor 130, the concentration of impurities in a film adjacent to the oxide semiconductor 130 is preferably reduced.

When nitrogen is contained in the oxide semiconductor 130, the carrier density is increased in some cases. The concentration of nitrogen in the oxide semiconductor 130 measured by SIMS is set to be lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

When hydrogen is contained in the oxide semiconductor 130, the carrier density is increased in some cases. Furthermore, hydrogen contained in the oxide semiconductor 130 as an impurity is moved to the surface of the oxide and bonds to oxygen near the surface, whereby a water molecule is formed and released in some cases. At this time, an oxygen vacancy $V_O$ is formed in a site of O that has been released as a water molecule. For this reason, it is preferable to reduce sufficiently the concentration of hydrogen in the oxide semiconductor 130. Therefore, the amount of water molecules in the oxide semiconductor 130 detected by thermal desorption spectrometry (TDS) (converted into the number of water molecules) is $1.0 \times 10^{21}/cm^3$ ($1.0/nm^3$) or less, preferably $1.0 \times 10^{20}/cm^3$ ($0.1/nm^3$) or less at a surface temperature ranging from 100° C. to 700° C. or from 100° C. to 500° C.

Here, the method of measuring the amount of released water molecules using TDS analysis is described below.

The total amount of released gas from a measurement sample in TDS analysis is proportional to the integral value of the ion intensity of the released gas. The total amount of released gas can be calculated by comparison with a reference sample.

For example, the number of released water molecules ($N_{H2O}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 18 which are obtained in the TDS analysis are assumed to originate from a water molecule. Note that $CH_4$, which is a gas having the mass-to-charge ratio of 18, is not taken into consideration because it is unlikely to be present. Furthermore, a water molecule including a hydrogen molecule having a mass number of 2 or 3 which is an isotope of hydrogen and a water molecule including an oxygen atom having a mass number of 17 or 18 which is an isotope of an oxygen atom are not taken into consideration because the proportions of such molecules in the natural world are minimal.

$$N_{O2} = \frac{N_{H2}}{S_{H2}} \times S_{O2} \times \alpha \qquad \text{[Formula 2]}$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{H2O}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen is measured with, for example, a thermal desorption spectroscopy apparatus produced by ESCO Ltd., EMD-WA1000S/W using a silicon substrate containing a certain amount of hydrogen atoms as the reference sample.

Note that $N_{H2O}$ is the number of the released water molecules. The number of released water molecules in the case of being converted into hydrogen atoms is twice the number of the released water molecules.

Note that in the oxide semiconductor, it is difficult for hydrogen as an impurity to exist as a water molecule because hydrogen is in the state of a hydrogen atom, a hydrogen ion, a hydrogen molecule, a hydroxy group, a hydroxide ion, and the like.

By using an oxide semiconductor including a crystal whose hydrogen concentration is sufficiently lowered for a channel formation region of a transistor, the transistor can have stable electrical characteristics. That is, a fluctuation in electrical characteristics can be inhibited and reliability can be improved. Furthermore, a semiconductor device with low power consumption can be provided.

In addition to the insulator 150, a barrier film may be provided between the oxide semiconductor 130 and the conductor 160 in the semiconductor device illustrated in FIGS. 2A to 2C. Alternatively, the oxide semiconductor 130c may have a barrier property.

The conductors 160, 140a, and 140b can be formed using a material similar to that of the conductor 115. Examples of the material are a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); and the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Moreover, a stacked-layer structure of the above conductive material and the above metal material can be employed.

The insulator 150 is preferably an insulator containing oxygen, such as a silicon oxide film or a silicon oxynitride film. Note that as the insulator 150, an insulator containing excessive oxygen (containing oxygen in excess of that in the stoichiometric composition) is preferably used. When such an insulator containing excess oxygen is provided in contact with the oxide semiconductor 130, oxygen vacancies in the oxide semiconductor 130 can be compensated.

As the insulator 150, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator formed of such a material functions as a layer that prevents release of oxygen from the oxide semiconductor 130 or entry of an impurity such as hydrogen from the outside.

The insulator 150 may have a stacked-layer structure. For example, an insulating film containing excess oxygen is provided in contact with the oxide semiconductor 130 and covered by a barrier film, whereby the composition of the oxide can be almost the same as the stoichiometric composition or can be in a supersaturated state containing more oxygen than that in the stoichiometric composition. It is also possible to prevent entry of an impurity such as hydrogen into the oxide semiconductor 130.

With the above structure, the shift of the threshold voltage in the positive direction can allow the transistor that includes the oxide semiconductor to be a normally-off transistor, which is in a non-conduction state (an off state) even when the gate voltage is 0 V.

The threshold voltages can be controlled by appropriate adjustment of the thicknesses of the insulator 121, the fixed charge layer 122, and the insulator 123. A transistor having a low leakage current in a non-conduction state can be provided. A transistor with stable electrical characteristics can be provided. A transistor having a high on-state current can be provided. A transistor having a small subthreshold swing value can be provided. A highly reliable transistor can be provided.

<Transistor Structure 2>

Figure 5A:
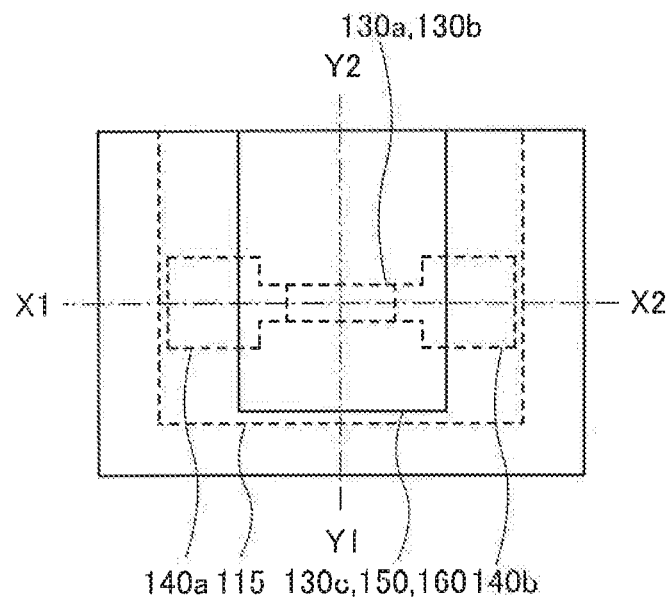
FIGS. 5A to 5C are a top view and cross-sectional views illustrating one embodiment of a semiconductor device.
Figure 5B:
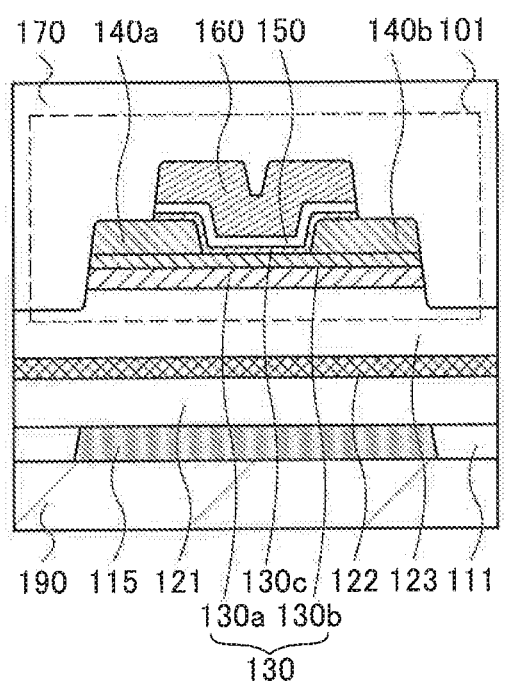
Figure 5C:
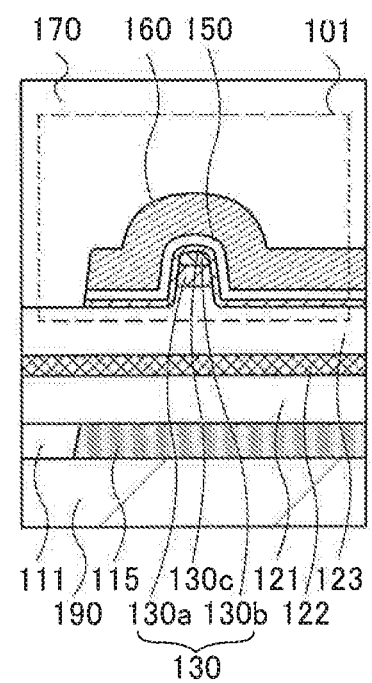

FIGS. 5A to 5C illustrate an example of a structure that can be used for the transistor 101. FIG. 5A illustrates a top surface of the transistor 101. For simplification of the figure, some films are omitted in FIG. 5A. FIG. 5B is a cross-sectional view taken along the dashed-dotted line X1-X2 in FIG. 5A, and FIG. 5C is a cross-sectional view taken along the dashed-dotted line Y1-Y2 in FIG. 5A.

In the transistor 101 in each of FIGS. 5A to 5C, components having the same functions as the components in the transistor 101 in FIGS. 2A to 2C are denoted by the same reference numerals. The transistor 101 formed over the substrate 190 includes the conductor 160 which functions as a gate electrode, the insulator 150 which functions as a gate insulating layer, the oxide semiconductor 130 which includes the oxide semiconductors 130a, 130b, and 130c, the conductor 140a which functions as one of a source electrode and a drain electrode, and the conductor 140b which functions as the other of the source electrode and the drain electrode.

In the structure illustrated in FIGS. 5A to 5C, the edges of the conductors 140a and 140b on three sides are aligned with part of the edge of the oxide semiconductor 130. Hence, the conductors 140a and 140b and the oxide semiconductor 130 can be formed at the same time. Accordingly, the number of masks and steps can be reduced, and yield and productivity can be improved.

In the structure, a region of the oxide semiconductor 130b where a channel is formed can be electrically surrounded by an electric field of the conductor 160 which functions as a gate electrode. A structure in which a semiconductor is electrically surrounded by an electric field of a gate electrode is referred to as a surrounded channel (s-channel) structure. Thus, the channel might be formed in the entire oxide semiconductor 130b which faces the conductor 160 with the insulator 150 interposed therebetween. In the s-channel structure, a large amount of current can flow between a source and a drain of the transistor, so that a high on-state current can be obtained. Furthermore, a voltage is applied from all directions to a region where a channel is formed, and thus, a transistor in which leakage current is suppressed can be provided.

<Transistor Structure 3>

Figure 6A:
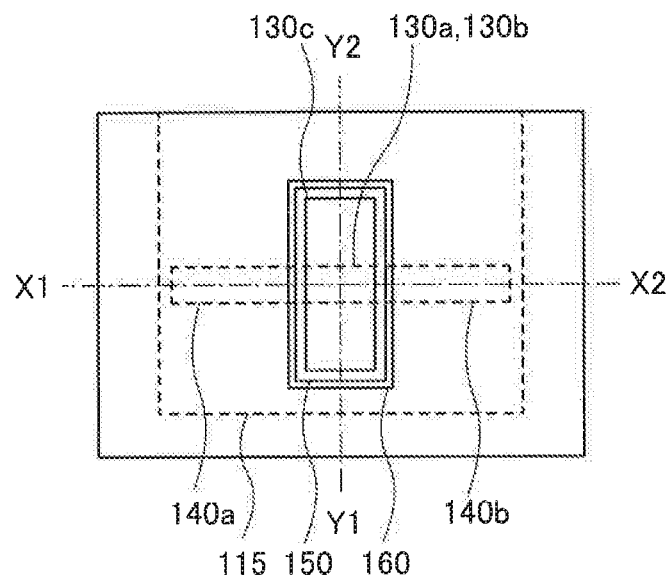
FIGS. 6A to 6C are a top view and cross-sectional views illustrating one embodiment of a semiconductor device.
Figure 6B:
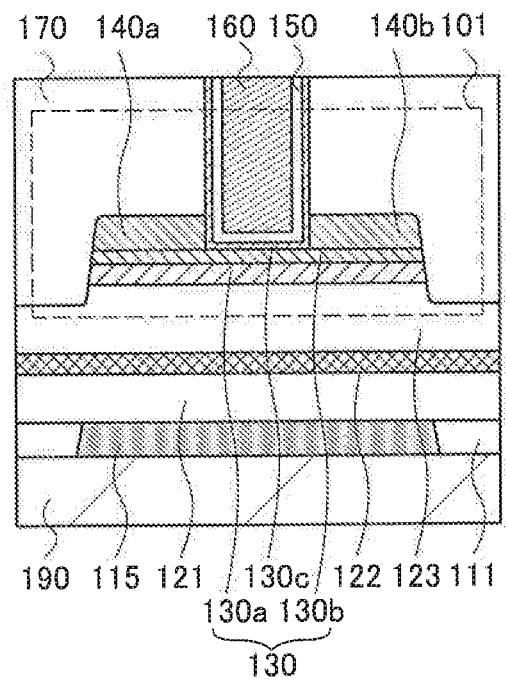
Figure 6C:
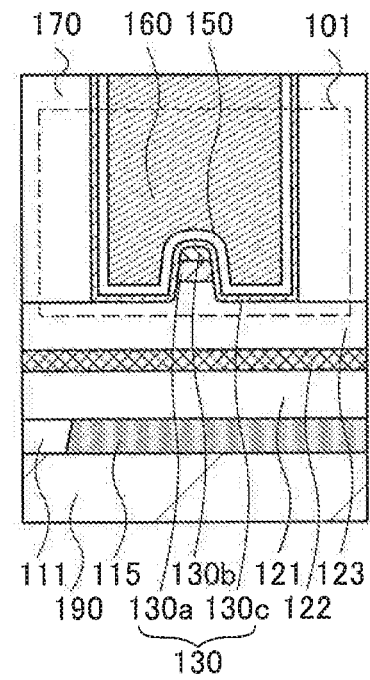

FIGS. 6A to 6C illustrate an example of a structure that can be applied to the transistor 101. FIG. 6A illustrates a top surface of the transistor 101. For simplification of the figure, some films are omitted in FIG. 6A. FIG. 6B is a cross-sectional view taken along the dashed-dotted line X1-X2 in FIG. 6A, and FIG. 6C is a cross-sectional view taken along the dashed-dotted line Y1-Y2 in FIG. 6A.

In the transistor 101 in each of FIGS. 6A to 6C, components having the same functions as the components in the transistor 101 in FIGS. 2A to 2C are denoted by the same reference numerals. The transistor 101 formed over the substrate 190 includes the conductor 160 which functions as a gate electrode, the insulator 150 which functions as a gate insulating layer, the oxide semiconductor 130 which includes the oxide semiconductors 130a, 130b, and 130c, the conductor 140a which functions as one of a source electrode and a drain electrode, and the conductor 140b which functions as the other of the source electrode and the drain electrode.

In the structure illustrated in FIGS. 6A to 6C, the oxide semiconductor 130c, the insulator 150, and the conductor 160 are formed in an opening formed in the insulator 170. In addition, one edge of each of the conductors 140a and 140b is aligned with the edge of the opening formed in the insulator 170. Furthermore, the edges of the conductors 140a and 140b on three sides are aligned with part of the edge of the oxide semiconductor 130. Hence, the conductors 140a and 140b can be formed at the same time as the oxide semiconductor 130 or the opening in the insulator 170. Accordingly, the number of masks and steps can be reduced, and yield and productivity can be improved.

Since the transistor 101 illustrated in FIGS. 6A to 6C has a structure in which the conductors 140a and 140b hardly overlap with the conductor 160, the parasitic capacitance added to the conductor 160 can be reduced. Thus, the transistor 101 with a high operation frequency can be provided.

In the structure, a region of the oxide semiconductor 130b where a channel is formed can be electrically surrounded by an electric field of the conductor 160 which functions as a gate electrode. Because of the s-channel structure, the channel might be formed in the entire oxide semiconductor 130b, which faces the conductor 160 with the insulator 150 interposed therebetween. In the s-channel structure, a large amount of current can flow between a source and a drain of the transistor, so that a high on-state current can be obtained. Furthermore, a voltage is applied from all directions to a region where a channel is formed, and thus, a transistor in which leakage current is suppressed can be provided.

<Transistor Structure 4>

Figure 7A:
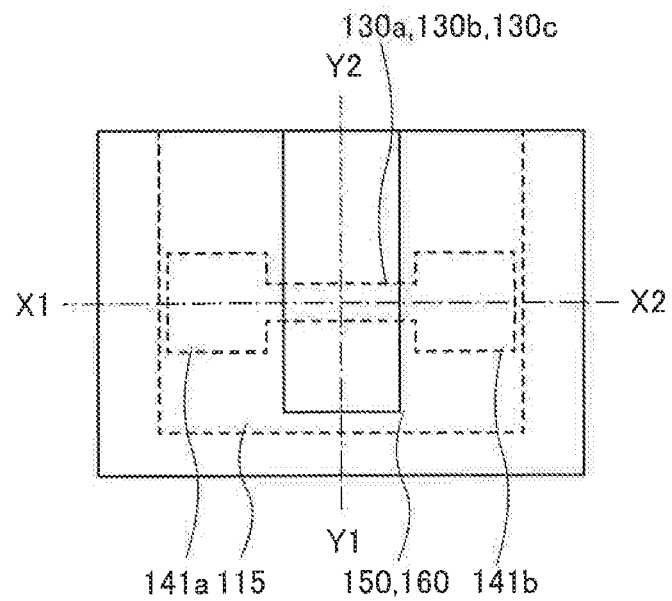
FIGS. 7A to 7C are a top view and cross-sectional views illustrating one embodiment of a semiconductor device.
Figure 7B:
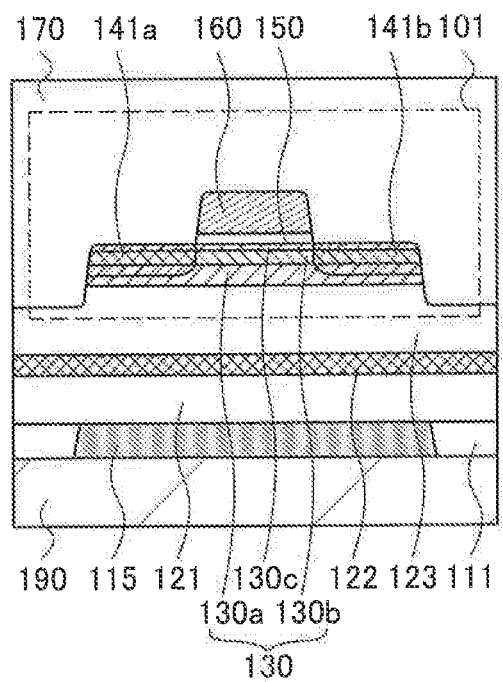
Figure 7C:
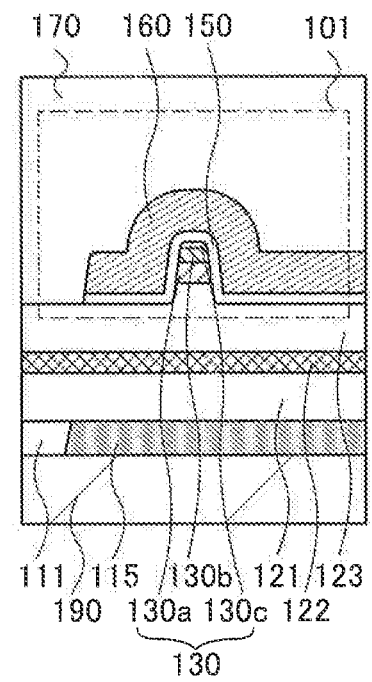

FIGS. 7A to 7C illustrate an example of a structure that can be applied to the transistor 101. FIG. 7A illustrates a top surface of the transistor 101. For simplification of the figure, some films are omitted in FIG. 7A. FIG. 7B is a cross-sectional view taken along the dashed-dotted line X1-X2 in FIG. 7A, and FIG. 7C is a cross-sectional view taken along the dashed-dotted line Y1-Y2 in FIG. 7A.

In the transistor 101 in each of FIGS. 7A to 7C, components having the same functions as the components in the transistor 101 in FIGS. 2A to 2C are denoted by the same reference numerals. The transistor 101 formed over the substrate 190 includes the conductor 160 which functions as a gate electrode, the insulator 150 which functions as a gate insulating layer, and the oxide semiconductor 130 which includes the oxide semiconductors 130a, 130b, and 130c. In addition, in the structure, the oxide semiconductor 130 includes a region 141a which functions as one of a source region and a drain region and a region 141b which functions as the other of the source region and the drain region.

In the structure illustrated in FIGS. 7A to 7C, the region 141a which functions as the one of the source region and the drain region and the region 141b which functions as the other of the source region and the drain region are provided in the oxide semiconductor 130. The regions can be formed in such a manner that an impurity such as boron, phosphorus, or argon is added to the oxide semiconductor 130 using the conductor 160 as a mask. Alternatively, the regions can be formed in such a manner that the insulator 170 is formed of an insulator containing hydrogen, such as a silicon nitride film, and hydrogen is diffused to part of the oxide semiconductor 130. Accordingly, the number of masks or steps can be reduced, and yield and productivity can be improved.

In the structure, a region of the oxide semiconductor 130b where a channel is formed can be electrically surrounded by an electric field of the conductor 160 which functions as a gate electrode. Because of the s-channel structure, a channel might be formed in the entire oxide semiconductor 130b, which faces the conductor 160 with the insulator 150 interposed therebetween. In the s-channel structure, a large amount of current can flow between a source and a drain of the transistor, so that a high on-state current can be obtained. Furthermore, a voltage is applied from all directions to a region where a channel is formed, and thus, a transistor in which leakage current is suppressed can be provided.

The structures, the methods, and the like described in this embodiment can be combined as appropriate with any of the structures, the methods, and the like described in the other embodiments and examples.

Embodiment 2

In this embodiment, one embodiment of a semiconductor device is described with reference to FIGS. 8A and 8B and FIGS. 9A and 9B.

<Structural Example 2 of Semiconductor Device>

Figure 8A:
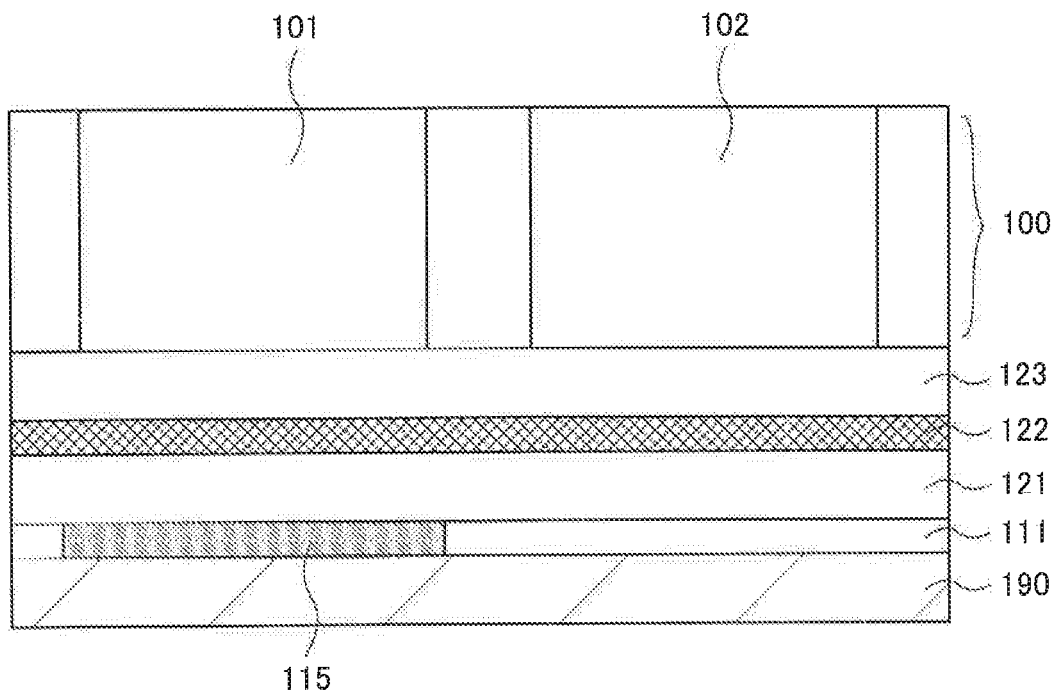
FIGS. 8A and 8B are cross-sectional views illustrating one embodiment of a semiconductor device.
Figure 8B:
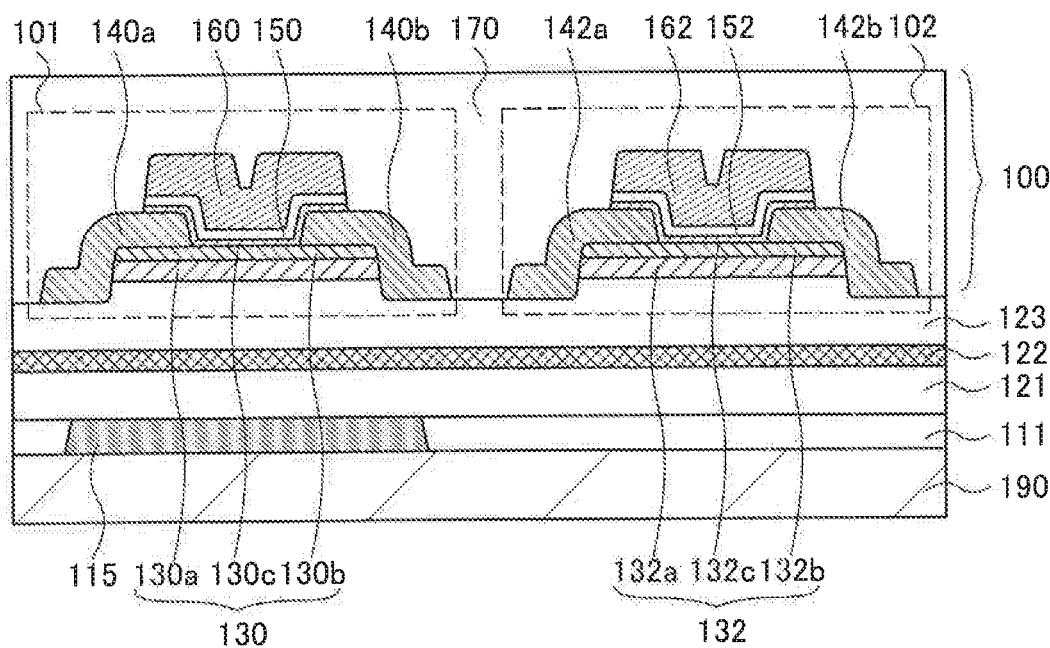

In this embodiment, a structure of a semiconductor device illustrated in FIG. 8A which includes a layer including a transistor, a first insulator, a fixed charge layer, a second insulator, and a layer including a conductor is described. FIGS. 8A and 8B illustrate a semiconductor device that includes, over the substrate 190, the insulator 111 including the conductor 115, the insulator 121, the fixed charge layer 122, the insulator 123, and the layer 100 including the transistor 101 and a transistor 102.

Since fixed charges exist at an interface between the fixed charge layer 122 and the insulator 123 and an interface between the fixed charge layer 122 and the insulator 121 and inside the fixed charge layer 122, the fixed charge layer 122 is negatively charged. Thus, the conductor 115, a region of the insulator 121 which overlaps with the conductor 115, and a region of the fixed charge layer 122 which overlaps with the conductor 115 function as a capacitor when a voltage is applied to the conductor 115, so that the threshold voltage of the transistor 101 over the conductor 115 can be shifted. The shift of the threshold voltage $V_{th}$ in the positive direction can allow the transistor 101 to be a normally-off transistor, which is in a non-conduction state even when the gate voltage $V_g$ is 0 V.

However, the conductor 115 is not located under the transistor 102; thus, the threshold voltage does not fluctuate even when a voltage is applied to the conductor 115. Therefore, the transistor 102 functions as a normally-on transistor.

Thus, under the transistor 101, a stacked-layer structure including the conductor 115, the insulator 121, the fixed charge layer 122, and the insulator 123 is formed. Under the transistor 102, a stacked-layer structure including the insulator 121, the fixed charge layer 122, and the insulator 123 without the conductor 115 is formed. In this manner, a normally-off transistor and a normally-on transistor having the same structure can be easily fabricated over the same substrate. Note that the threshold voltage of the transistor 101 can be controlled by appropriate adjustment of the thicknesses of the insulator 121, the fixed charge layer 122, and the insulator 123.

<Structure 1 of Semiconductor Device>

With reference to FIG. 8B, a specific structure of one embodiment of the present invention is described. FIG. 8B is a cross-sectional view of the transistors of one embodiment of the present invention. Note that in the semiconductor device illustrated in FIG. 8B, components having the same functions as the components in the semiconductor device illustrated in FIGS. 2A to 2C are denoted by the same reference numerals.

The semiconductor device includes the insulator 111 formed over the substrate 190, the conductor 115 embedded in the insulator 111, the insulator 121 formed over the conductor 115, the fixed charge layer 122 formed over the insulator 121, the insulator 123 formed over the fixed charge layer 122, the transistor 101 which is formed over the insulator 123 so as to overlap with the conductor 115, the transistor 102 formed over the insulator 123, and the insulator 170 formed over the insulator 123, the transistor 101, and the transistor 102.

The transistor 101 includes the conductor 160 which functions as a gate electrode, the insulator 150 which functions as a gate insulating layer, the oxide semiconductor 130 which includes a region where a channel is formed, the conductor 140a which functions as one of a source and a drain, and the conductor 140b which functions as the other of the source and the drain. The oxide semiconductor 130 includes the oxide semiconductor 130a, the oxide semiconductor 130b over the oxide semiconductor 130a, and the oxide semiconductor 130c over the oxide semiconductor 130b.

The transistor 102 includes a conductor 162 that functions as a gate electrode, the insulator 152 that functions as a gate insulating layer, the oxide semiconductor 132 including a region where a channel is formed, a conductor 142a which functions as one of a source and a drain, and a conductor 142b which functions as the other of the source and the drain. The oxide semiconductor 132 includes an oxide semiconductor 132a, an oxide semiconductor 132b over the oxide semiconductor 132a, and an oxide semiconductor 132c over the oxide semiconductor 132b.

In this structure, the transistor 101 overlaps with the stacked-layer structure including the conductor 115, the insulator 121, the fixed charge layer 122, and the insulator 123. The transistor 102 overlaps with the stacked-layer structure including the insulator 121, the fixed charge layer 122, and the insulator 123.

In such a structure, the insulator 121 can be formed after the conductor 115 is formed in the insulator 111 so as to overlap with the transistor 101. Note that the insulators 111 and 121 are not necessarily different layers. For example, after the conductor 115 is formed over the substrate, an insulator serving as both the insulators 111 and 121 may be formed in such a manner that an insulating film is formed on the entire surface of the substrate and the top surface of the insulating film is planarized by chemical mechanical polishing (CMP) treatment or the like.

Thus, the fixed charge layer 122, the transistor 101, and the transistor 102, which are formed above the insulator 121, can be formed at the same time.

With the above structure, a normally-off transistor and a normally-on transistor can be easily fabricated over the same substrate. Note that the threshold voltage $V_{th}$ can be controlled by appropriate adjustment of the thicknesses of the insulator 121, the fixed charge layer 122, and the insulator 123.

A transistor with stable electrical characteristics can be provided. A transistor having a high on-state current can be provided. A transistor having a small subthreshold swing value can be provided. A highly reliable transistor can be provided.

<Structural Example 3 of Semiconductor Device>

Figure 9A:
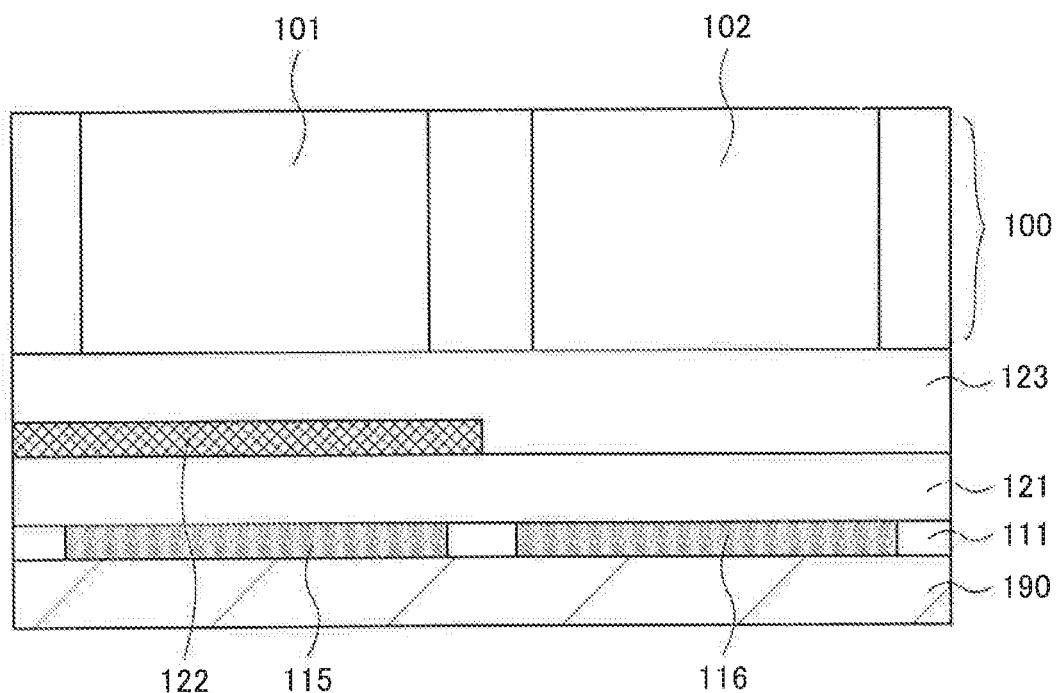
FIGS. 9A and 9B are cross-sectional views illustrating one embodiment of a semiconductor device.
Figure 9B:
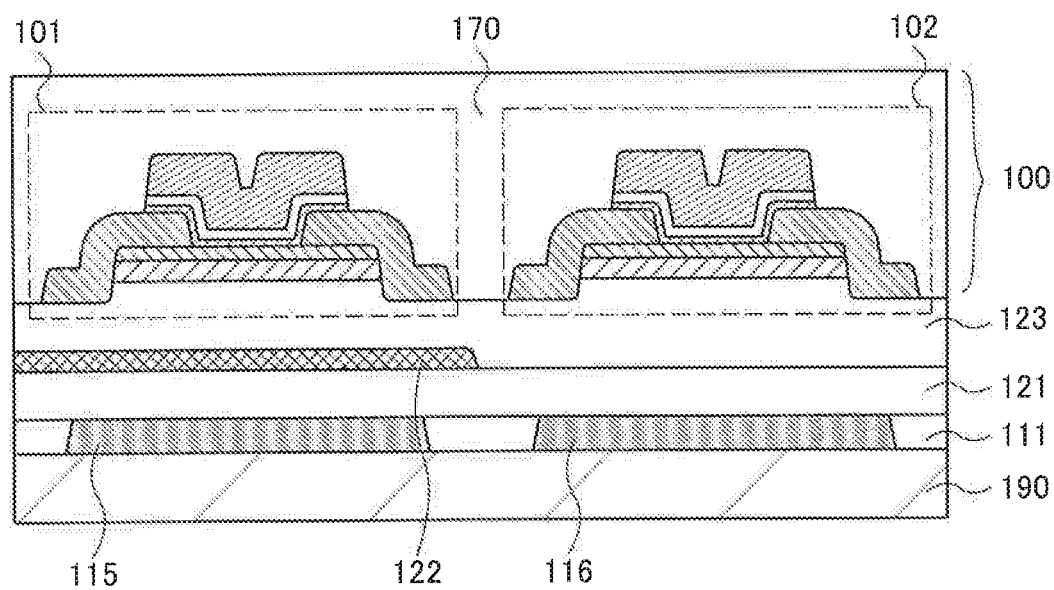

In this embodiment, a structure of a semiconductor device illustrated in FIG. 9A which includes a layer including a transistor, a first insulator, a fixed charge layer, a second insulator, and a layer including a conductor is described. FIGS. 9A and 9B illustrate a semiconductor device that includes, over the substrate 190, the insulator 111 including the conductor 115 and a conductor 116, the insulator 121, the fixed charge layer 122, the insulator 123, and the layer 100 including the transistors 101 and 102.

Since fixed charges exist at an interface between the fixed charge layer 122 and the insulator 123 and an interface between the fixed charge layer 122 and the insulator 121 and inside the fixed charge layer 122, the fixed charge layer 122 is negatively charged. Thus, when a voltage is applied to the conductor 115, the conductor 115, a region of the insulator 121 which overlaps with the conductor 115, and a region of the fixed charge layer 122 which overlaps with the conductor 115 function as a capacitor, so that the threshold voltage of the transistor 101 over the conductor 115 can be shifted in the positive direction. The shift of the threshold voltage in the positive direction can allow the transistor 101 to be a normally-off transistor, which is in a non-conduction state even when the gate voltage is 0 V.

However, the fixed charge layer 122 is not located under the transistor 102; thus, the threshold voltage does not fluctuate even when a voltage is applied to the conductor 116.

Thus, under the transistor 101, a stacked-layer structure including the conductor 115, the insulator 121, the fixed charge layer 122, and the insulator 123 is formed. Under the transistor 102, a stacked-layer structure including the conductor 116, the insulator 121, and the insulator 123 is formed. Thus, transistors having the same structure can function as transistors having different threshold voltages over the same substrate. Note that the threshold voltages can be controlled by appropriate adjustment of the thicknesses of the insulator 121, the fixed charge layer 122, and the insulator 123.

<Structure 2 of Semiconductor Device>

With reference to FIG. 9B, a specific structure of one embodiment of the present invention is described. FIG. 9B is a cross-sectional view of the transistors of one embodiment of the present invention. Note that in the semiconductor device illustrated in FIG. 9B, components having the same functions as the components in the semiconductor device illustrated in FIG. 8B are denoted by the same reference numerals.

The semiconductor device includes the insulator 111 formed over the substrate 190, the conductors 115 and 116 embedded in the insulator 111, the insulator 121 formed over the insulator 111 and the conductors 115 and 116, the fixed charge layer 122 which is formed over the insulator 121 so as to overlap with the conductor 115, the insulator 123 formed over the insulator 121 and the fixed charge layer 122, the transistor 101 which is formed over the insulator 123 so as to overlap with the conductor 115, the transistor 102 formed over the insulator 123, and the insulator 170 formed over the insulator 123, the transistor 101, and the transistor 102.

In this structure, the transistor 101 overlaps with a stacked-layer structure including the conductor 115, the insulator 121, the fixed charge layer 122, and the insulator 123. The transistor 102 overlaps with a stacked-layer structure including the conductor 116, the insulator 121, and the insulator 123.

In the structure, the conductor 116 can be formed using a material and a step similar to the material and the step of the insulator 115.

The above-described structure enables transistors having different threshold voltages can be easily fabricated over the same substrate. The threshold voltages can be controlled by appropriate adjustment of the thicknesses of the insulator 121, the fixed charge layer 122, and the insulator 123.

A transistor with stable electrical characteristics can be provided. A transistor having a high on-state current can be provided. A transistor having a small subthreshold swing value can be provided. A highly reliable transistor can be provided.

The structures, the methods, and the like described in this embodiment can be combined as appropriate with any of the structures, the methods, and the like described in the other embodiments and examples.

Embodiment 3

In this embodiment, one embodiment of a semiconductor device is described with reference to FIG. 10 and FIGS. 11A to 11C.

<Structural Example 4 of Semiconductor Device>

Figure 10:
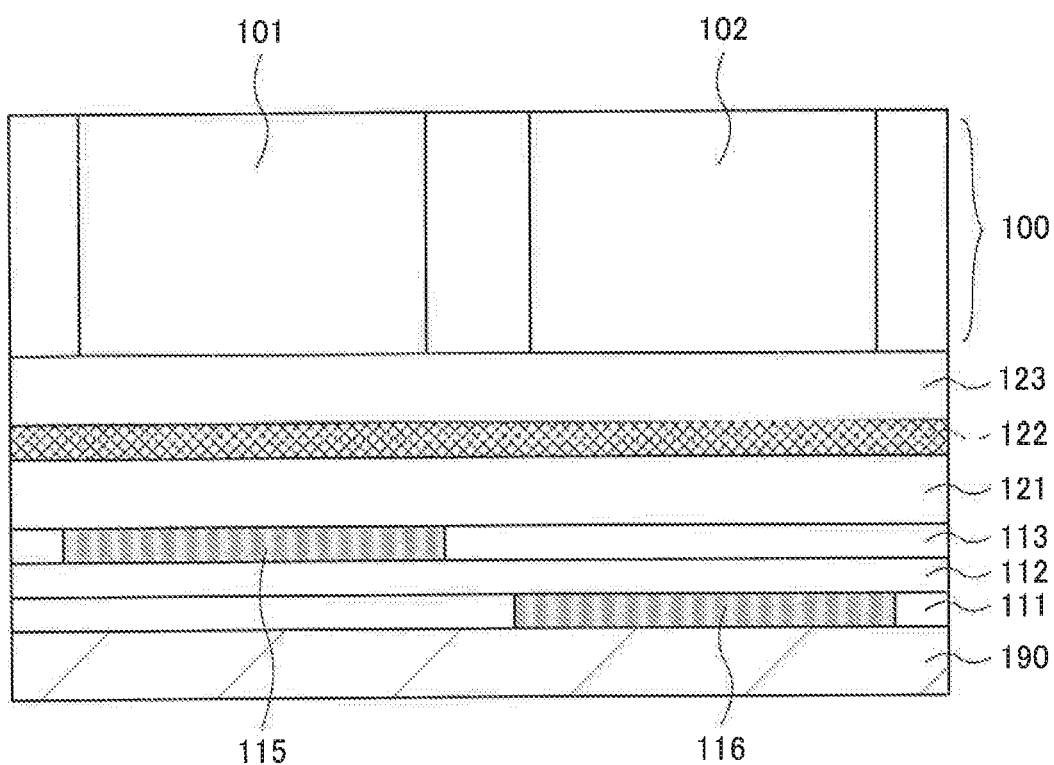
FIG. 10 is a cross-sectional view illustrating one embodiment of a semiconductor device.

In this embodiment, a structure of a semiconductor device illustrated in FIG. 10 which includes a layer including a transistor, a first insulator, a fixed charge layer, a second insulator, and a layer including a conductor is described. Note that in the semiconductor device illustrated in FIG. 10, components having the same functions as the components in the semiconductor device illustrated in FIG. 8A are denoted by the same reference numerals.

FIG. 10 illustrates a semiconductor device that includes, over the substrate 190, the insulator 111 including the conductor 116, an insulator 112, an insulator 113 including the conductor 115, the insulator 121, the fixed charge layer 122, the insulator 123, and the layer 100 including the transistors 101 and 102.

Note that in the structure, the total thickness of the insulators between the transistor 101 and the conductor 115 is different from the total thickness of the insulators between the transistor 102 and the conductor 116. Hence, the insulator 112 is not necessarily provided.

Since fixed charges exist at an interface between the fixed charge layer 122 and the insulator 123 and an interface between the fixed charge layer 122 and the insulator 121 and inside the fixed charge layer 122, the fixed charge layer 122 is negatively charged.

Thus, when a voltage is applied to the conductor 115, the conductor 115, a region of the fixed charge layer 122 which overlaps with the conductor 115, and the insulator between the fixed charge layer 122 and the conductor 115 function as a capacitor. Consequently, the threshold voltage of the transistor 101 over the conductor 115 can be shifted in the positive direction.

Further, when a voltage is applied to the conductor 116, the conductor 116, a region of the fixed charge layer 122 which overlaps with the conductor 116, and the insulator between the fixed charge layer 122 and the conductor 116 function as a capacitor. Thus, the threshold voltage of the transistor 102 over the conductor 116 can be shifted in the positive direction.

Formula (1) shown in Embodiment 1 reveals that a decrease in $C_{bg1}$ increases the variation $\Delta V_{th}$. In other words, an increase in the thickness of the insulator between the fixed charge layer 122 and the conductor 115 or the conductor 116 increases the variation of the threshold voltage in the positive direction.

In the semiconductor device illustrated in FIG. 10, the insulator is thicker between the fixed charge layer 122 and the conductor 116 under the transistor 102 than between the fixed charge layer 122 and the conductor 115 under the transistor 101 by the thickness of the insulators 113 and 112. Accordingly, the threshold voltage of the transistor 102 shifts more in the positive direction than that of the transistor 101.

Thus, transistors having different threshold voltages $V_{th}$ and the same structure can be easily fabricated over the same substrate by appropriate adjustment of the thickness of the fixed charge layer 122, the thickness of the insulator between the fixed charge layer 122 and the conductor 115, the thickness of the insulator between the fixed charge layer 122 and the conductor 116, and the thickness of the insulator between the fixed charge layer 122 and the layer 100 including the transistors.

The conductor 115 or the conductor 116 may have one or more functions other than the function of forming a capacitor with the fixed charge layer 122. Note that the conductors 115 and 116 do not necessarily have the same function and different voltages may be applied to the conductors 115 and 116 at different timings.

For example, the conductor 115 may function as the second gate electrode of the transistor 101 and the conductor 116 may function as a wiring.

The voltage applied to the conductor 115 or the conductor 116 may be variable or fixed. When the voltage applied to the conductor 115 or the conductor 116 is variable, a circuit controlling the voltage may be electrically connected to the conductor 115 or the conductor 116.

<Structure 3 of Semiconductor Device>

With reference to FIG. 11A, a specific structure of one embodiment of the present invention is described. FIG. 11A is a cross-sectional view of the transistors of one embodiment of the present invention. Note that in the semiconductor device illustrated in FIG. 11A, components having the same functions as the components in the semiconductor device illustrated in FIG. 8B are denoted by the same reference numerals.

The semiconductor device illustrated in FIG. 11A includes the insulator 111 formed over the substrate 190, the conductor 116 embedded in the insulator 111, the insulator 112 formed over the insulator 111 and the conductor 116, the insulator 113 formed over the insulator 112, the conductor 115 embedded in the insulator 113, the insulator 121 formed over the conductor 115 and the insulator 113, the fixed charge layer 122 formed over the insulator 121, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

In the structure, under the transistor 101, a stacked-layer structure including the conductor 115, the insulator 121, the fixed charge layer 122, and the insulator 123 is formed. Under the transistor 102, a stacked-layer structure including the conductor 116, the insulator 112, the insulator 113, the insulator 121, the fixed charge layer 122, and the insulator 123 is formed.

In such a structure, after the conductor 116 is formed in the insulator 111 so as to overlap with the transistor 102, the insulator 112 is formed. Next, the conductor 115 is formed so as to overlap with the transistor 101, and then the insulator 113 is formed. After the formation of the insulator 113, the top surface of the insulator 113 can be planarized by chemical mechanical polishing (CMP) treatment or the like until the conductor 115 is exposed. Performing CMP treatment can improve coverage with a film formed above the insulator 113 and the conductor 115.

In the structure, the insulators 112 and 113 can be formed using a material and a step similar to the material and the step of the insulator 111.

The insulator 121, the fixed charge layer 122, and the insulator 123 which are formed above the insulator 113 can be formed in a common process. The transistor 101 and the transistor 102 can be formed in a common process.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 4 of Semiconductor Device>

With reference to FIG. 11B, a specific structure of one embodiment of the present invention is described. FIG. 11B is a cross-sectional view of the transistors of one embodiment of the present invention. Note that in the semiconductor device illustrated in FIG. 11B, components having the same functions as the components in the semiconductor device illustrated in FIG. 11A are denoted by the same reference numerals.

The semiconductor device illustrated in FIG. 11B includes the insulator 111 formed over the substrate 190, the conductors 115 and 116 embedded in the insulator 111, the insulator 112 formed over the insulator 111 and the conductor 116, the insulator 121 formed over the insulator 111, the conductor 115, and the insulator 112, the fixed charge layer 122 formed over the insulator 121, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

Under the transistor 101, the stacked-layer structure including the conductor 115, the insulator 121, the fixed charge layer 122, and the insulator 123 is formed. Under the transistor 102, a stacked-layer structure including the conductor 116, the insulator 112, the insulator 121, the fixed charge layer 122, and the insulator 123 is formed.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 5 of Semiconductor Device>

With reference to FIG. 11C, a specific structure of one embodiment of the present invention is described. FIG. 11C is a cross-sectional view of the transistors of one embodiment of the present invention. Note that in the semiconductor device illustrated in FIG. 11C, components having the same functions as the components in the semiconductor device illustrated in FIG. 11A are denoted by the same reference numerals.

The semiconductor device illustrated in FIG. 11C includes the insulator 111 formed over the substrate 190, the conductors 115 and 116 embedded in the insulator 111, the insulator 121 formed over the insulator 111, the conductor 115, and the conductor 116, an insulator 124 formed over the insulator 121, the fixed charge layer 122 formed over the insulators 121 and 124, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

Under the transistor 101, a stacked-layer structure including the conductor 115, the insulator 121, the fixed charge layer 122, and the insulator 123 is formed. Under the transistor 102, a stacked-layer structure including the conductor 116, the insulator 121, the insulator 124, the fixed charge layer 122, and the insulator 123 is formed.

In the structure, the insulator 124 can be formed using a material and a step similar to the material and the step of the insulator 111.

The above-described structure enables transistors having different threshold voltages can be easily fabricated over the same substrate.

A transistor with stable electrical characteristics can be provided. A transistor having a high on-state current can be provided. A transistor having a small subthreshold swing value can be provided. A highly reliable transistor can be provided.

The structures, the methods, and the like described in this embodiment can be combined as appropriate with any of the structures, the methods, and the like described in the other embodiments and examples.

Embodiment 4

In this embodiment, one embodiment of a semiconductor device is described with reference to FIG. 12 and FIGS. 13A to 13C.

<Structural Example 5 of Semiconductor Device>

Figure 12:
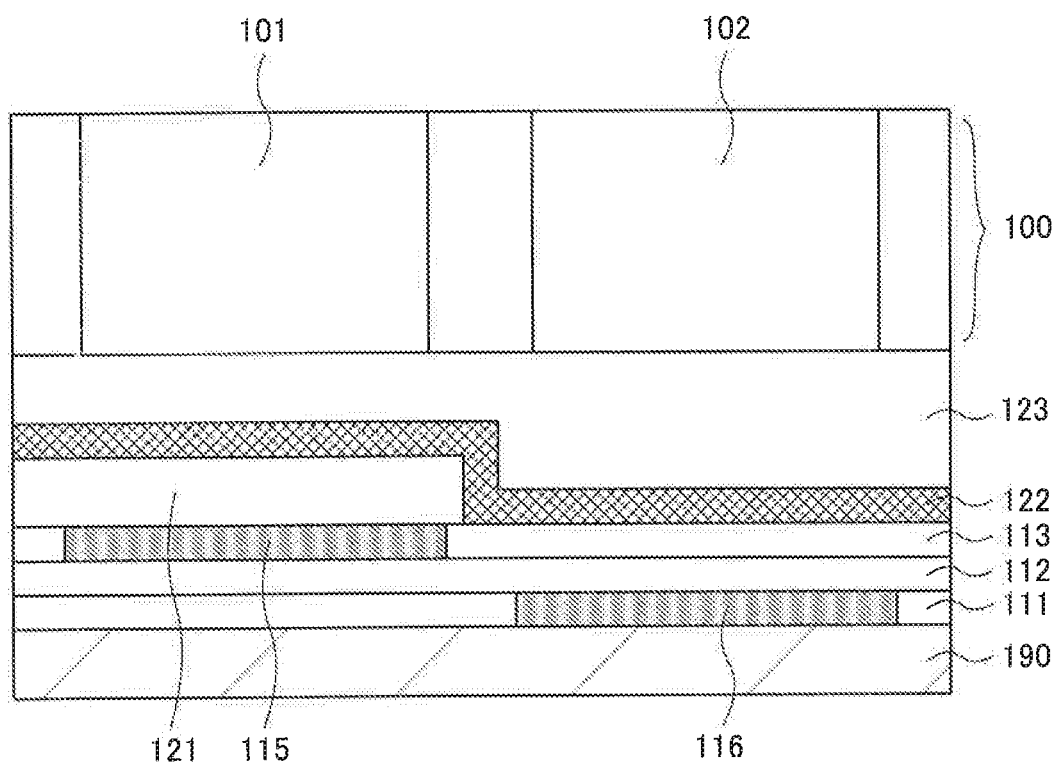
FIG. 12 is a cross-sectional view illustrating one embodiment of a semiconductor device.

In this embodiment, a structure of a semiconductor device illustrated in FIG. 12 which includes a layer including a transistor, a first insulator, a fixed charge layer, a second insulator, and a layer including a conductor is described. Note that in the semiconductor device illustrated in FIG. 12, components having the same functions as the components in the semiconductor device illustrated in FIGS. 11A to 11C are denoted by the same reference numerals.

FIG. 12 illustrates a semiconductor device that includes, over the substrate 190, the insulator 111 including the conductor 116, an insulator 112, an insulator 113 including the conductor 115, the insulator 121, the fixed charge layer 122, the insulator 123, and the layer 100 including the transistors 101 and 102.

Note that in the structure, the total thickness of the insulators between the transistor 101 and the fixed charge layer 122 is different from the total thickness of the insulators between the transistor 102 and the fixed charge layer 122. Hence, the fixed charge layer is not necessarily one layer. A fixed charge layer overlapping with the transistor 101 and a fixed charge layer overlapping with the transistor 102 may be formed in different steps and located in different layers.

Since fixed charges exist at an interface between the fixed charge layer 122 and the insulator 123, an interface between the fixed charge layer 122 and the insulator 121, and an interface between the fixed charge layer 122 and the insulator 113 and inside the fixed charge layer 122, the fixed charge layer 122 is negatively charged.

Thus, when a voltage is applied to the conductor 115, the conductor 115, a region of the fixed charge layer 122 which overlaps with the conductor 115, and the insulator between the fixed charge layer 122 and the conductor 115 function as a capacitor. Consequently, the threshold voltage of the transistor 101 over the conductor 115 can be shifted in the positive direction.

Further, when a voltage is applied to the conductor 116, the conductor 116, a region of the fixed charge layer 122 which overlaps with the conductor 116, and the insulator between the fixed charge layer 122 and the conductor 116 function as a capacitor. Thus, the threshold voltage of the transistor 102 over the conductor 116 can be shifted in the positive direction.

Formula (1) shown in Embodiment 1 reveals that an increase in $C_M$ increases the variation $\Delta V_{th}$. In other words, a decrease in the thickness of the insulator located above the fixed charge layer 122 increases the variation of the threshold voltage in the positive direction.

In the semiconductor device illustrated in FIG. 12, the insulator 123 is thicker under the transistor 102 than under the transistor 101. Accordingly, the threshold voltage of the transistor 101 shifts more in the positive direction than the threshold voltage of the transistor 102.

Thus, transistors having different threshold voltages $V_{th}$ and the same structure can be easily fabricated over the same substrate by appropriate adjustment of the thickness of the fixed charge layer 122, the thickness of the insulator between the fixed charge layer 122 and the conductor 115, and the thickness of the insulator between the fixed charge layer 122 and the layer 100 including the transistors.

In addition, the total thickness of the insulator 121, the fixed charge layer 122, and the insulator 123 is preferably set to a thickness with which the tunnel effect is not a problem. Hence, when transistors are fabricated over the same substrate, with a transistor having a larger threshold voltage variation $\Delta V_{th}$ assumed as a reference transistor, the insulator between the fixed charge layer 122 and a transistor having a smaller threshold voltage variation $\Delta V_{th}$ is preferably adjusted to be thinner than the insulator between the fixed charge layer 122 and the reference transistor.

The conductor 115 or the conductor 116 may have one or more functions other than the function of forming a capacitor with the fixed charge layer 122. Note that the conductors 115 and 116 do not necessarily have the same functions and different voltages may be applied to the conductors 115 and 116 at different timings.

For example, the conductor 115 may function as a second gate electrode of the transistor 101 and the conductor 116 may function as a wiring.

The voltage applied to the conductor 115 or the conductor 116 may be variable or fixed. When the voltage applied to the conductor 115 or the conductor 116 is variable, a circuit controlling the voltage may be electrically connected to the conductor 115 or the conductor 116.

<Structure 6 of Semiconductor Device>

Figure 13A:
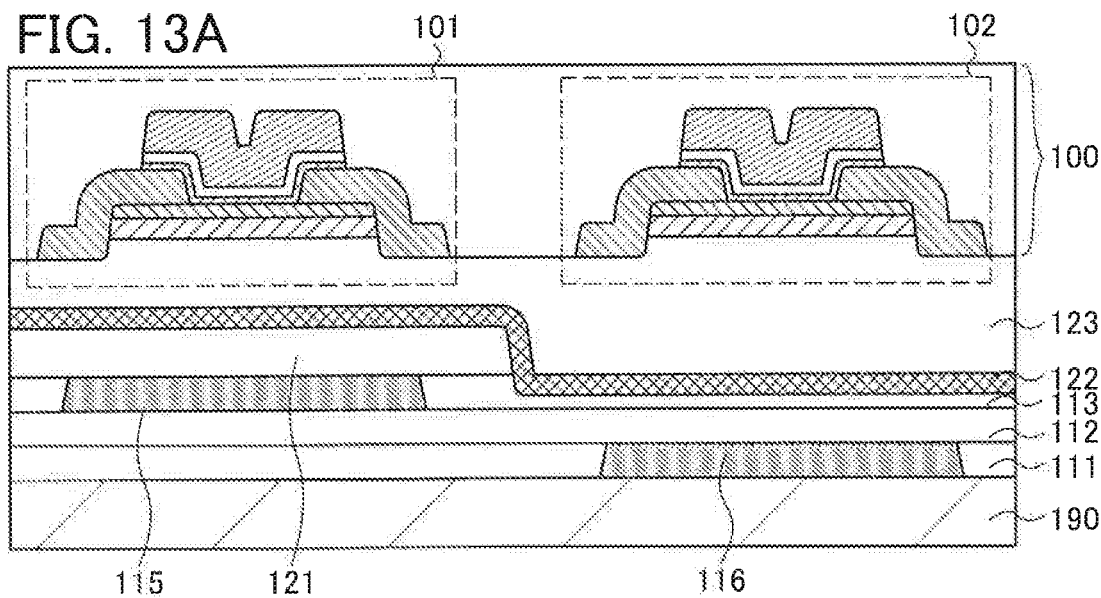
FIGS. 13A to 13C are cross-sectional views each illustrating one embodiment of a semiconductor device.

With reference to FIG. 13A, a specific structure of one embodiment of the present invention is described. FIG. 13A is a cross-sectional view of the transistors of one embodiment of the present invention. Note that in the semiconductor device illustrated in FIG. 13A, components having the same functions as the components in the semiconductor device illustrated in FIG. 11A are denoted by the same reference numerals.

The semiconductor device illustrated in FIG. 13A includes the insulator 111 formed over the substrate 190, the conductor 116 embedded in the insulator 111, the insulator 112 formed over the insulator 111 and the conductor 116, the insulator 113 formed over the insulator 112, the conductor 115 embedded in the insulator 113, the insulator 121 formed over the conductor 115 and the insulator 113, the fixed charge layer 122 formed over the insulators 121 and 113, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

Under the transistor 101, the stacked-layer structure including the conductor 115, the insulator 121, the fixed charge layer 122, and the insulator 123 is formed. Under the transistor 102, a stacked-layer structure including the conductor 116, the insulator 112, the insulator 113, the fixed charge layer 122, and the insulator 123 is formed.

In this structure, after the conductor 116 is formed in the insulator 111 so as to overlap with the transistor 102, the insulator 112 is formed. Next, the conductor 115 is formed so as to overlap with the transistor 101, and then the insulator 113 is formed. After the formation of the insulator 113, the insulator 121 is formed. Then, part of the insulators 113 and 121 which overlaps with the conductor 116 is removed so as to have a desired thickness. After that, the fixed charge layer 122 is formed. Next, an insulating film to be the insulator 123 is formed and then the top surface of the insulator 123 can be planarized by CMP treatment or the like. Performing CMP treatment can improve coverage with a film formed above the insulator 123.

Note that the transistor 101 and the transistor 102, which are formed above the insulator 123, can be formed at the same time.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 7 of Semiconductor Device>

Figure 13B:
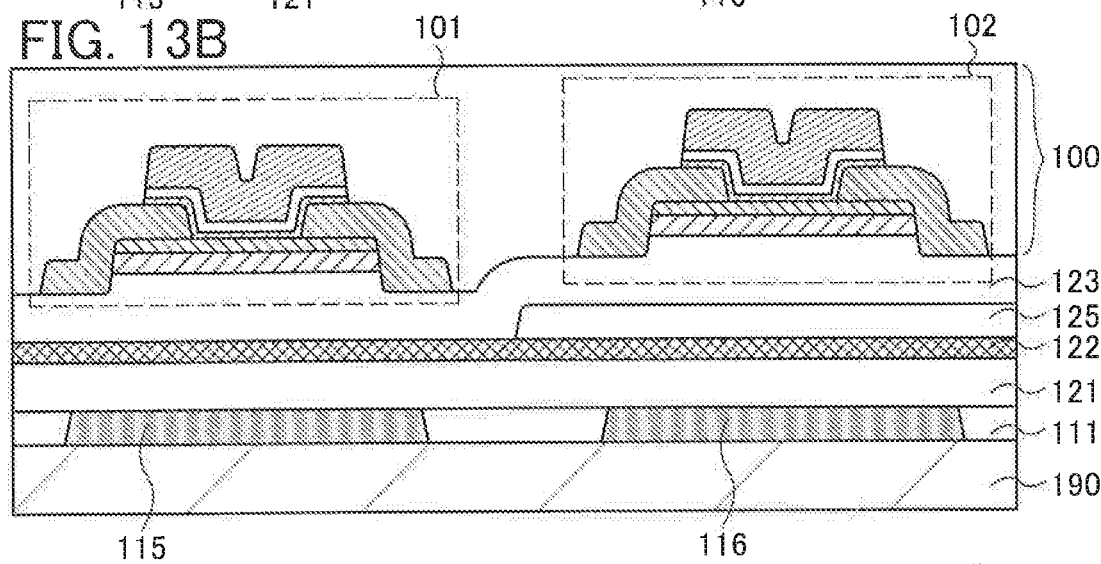

With reference to FIG. 13B, a specific structure of one embodiment of the present invention is described. FIG. 13B is a cross-sectional view of the transistors of one embodiment of the present invention. Note that in the semiconductor device illustrated in FIG. 13B, components having the same functions as the components in the semiconductor device illustrated in FIG. 13A are denoted by the same reference numerals.

The semiconductor device illustrated in FIG. 13B includes the insulator 111 formed over the substrate 190, the conductors 115 and 116 embedded in the insulator 111, the insulator 121 formed over the insulator 111 and the conductors 115 and 116, the fixed charge layer 122 formed over the insulator 121, an insulator 125 which is formed over the fixed charge layer 122 so as to overlap with the conductor 116, the insulator 123 formed over the fixed charge layer 122 and the insulator 125, the transistor 101 which is formed over the insulator 123 so as to overlap with the conductor 115, and the transistor 102 which is formed over the insulator 123 so as to overlap with the conductor 116.

Under the transistor 101, a stacked-layer structure including the conductor 115, the insulator 121, the fixed charge layer 122, and the insulator 123 is formed. Under the transistor 102, a stacked-layer structure including the conductor 116, the insulator 121, the fixed charge layer 122, the insulator 125, and the insulator 123 is formed.

In the structure, the insulator 125 can be formed using a material and a step similar to the material and the step of the insulator 111.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 8 of Semiconductor Device>

Figure 13C:
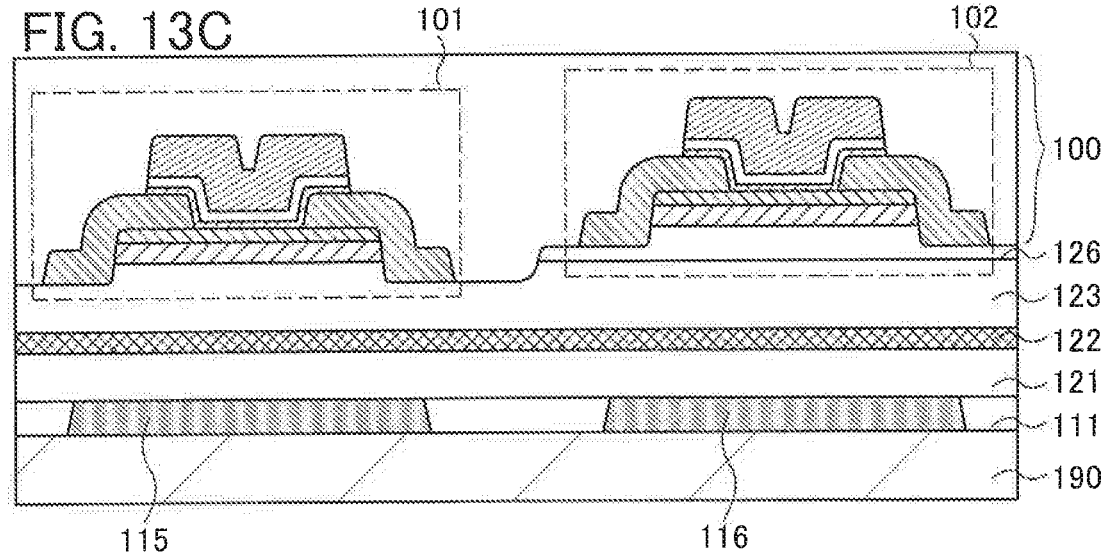

With reference to FIG. 13C, a specific structure of one embodiment of the present invention is described. FIG. 13C is a cross-sectional view of the transistors of one embodiment of the present invention. Note that in the semiconductor device illustrated in FIG. 13C, components having the same functions as the components in the semiconductor device illustrated in FIG. 13A are denoted by the same reference numerals.

The semiconductor device illustrated in FIG. 13C includes the insulator 111 formed over the substrate 190, the conductors 115 and 116 embedded in the insulator 111, the insulator 121 formed over the insulator 111, the conductor 115, and the conductor 116, the fixed charge layer 122 formed over the insulator 121, the insulator 123 which is formed over the fixed charge layer 122, an insulator 126 which is formed over the insulator 123 so as to overlap with the conductor 116, the transistor 101 which is formed over the insulator 123 so as to overlap with the conductor 115, and the transistor 102 which is formed over the insulator 126 so as to overlap with the conductor 116.

Under the transistor 101, a stacked-layer structure including the conductor 115, the insulator 121, the fixed charge layer 122, and the insulator 123 is formed. Under the transistor 102, a stacked-layer structure including the conductor 116, the insulator 121, the fixed charge layer 122, the insulator 123, and the insulator 126 is formed.

In the structure, the insulator 126 can be formed using a material and a step similar to the material and the step of the insulator 111.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

The structures, the methods, and the like described in this embodiment can be combined as appropriate with any of the structures, the methods, and the like described in the other embodiments and examples.

Embodiment 5

In this embodiment, one embodiment of a semiconductor device is described with reference to FIG. 14 and FIGS. 15A to 15C.

<Structural Example 6 of Semiconductor Device>

Figure 14:
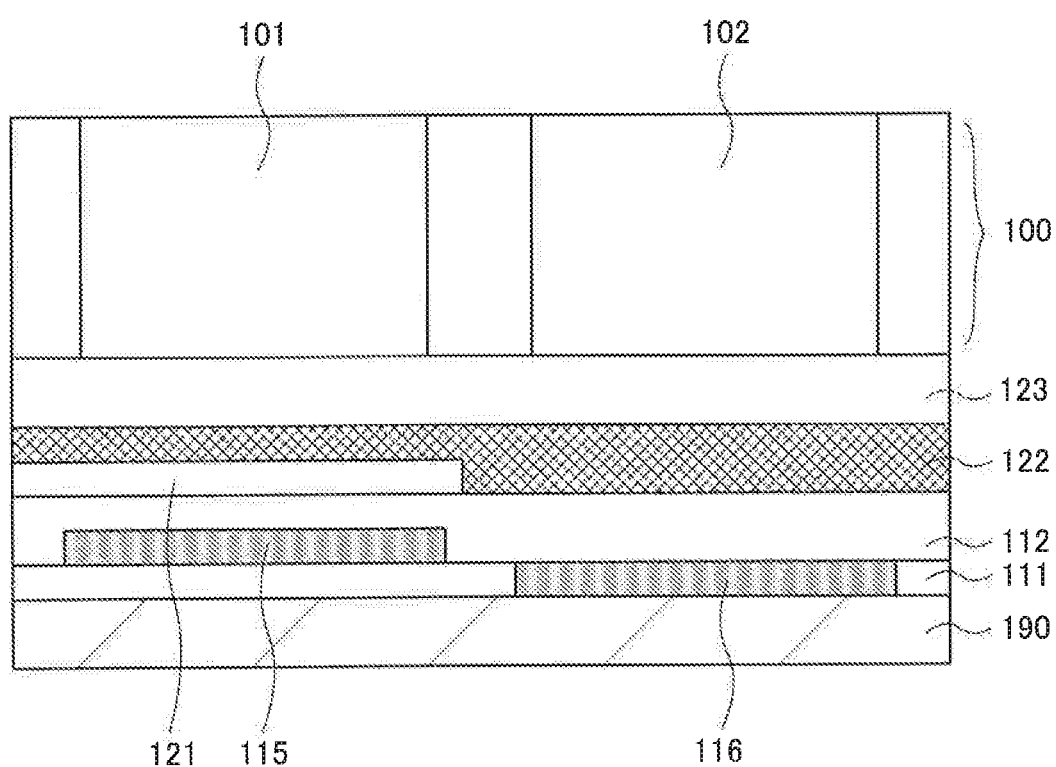
FIG. 14 is a cross-sectional view illustrating one embodiment of a semiconductor device.

In this embodiment, a structure of a semiconductor device illustrated in FIG. 14 which includes a layer including a transistor, a first insulator, a fixed charge layer, a second insulator, and a layer including a conductor is described. Note that in the semiconductor device illustrated in FIG. 14, components having the same functions as the components in the semiconductor device illustrated in FIG. 12 are denoted by the same reference numerals.

FIG. 14 illustrates a semiconductor device that includes, over the substrate 190, the insulator 111 including the conductor 116, an insulator 112 including the conductor 115, the insulator 121, the fixed charge layer 122, the insulator 123, and the layer 100 including the transistors 101 and 102.

Note that in the structure, the thickness of the fixed charge layer 122 differs between the region of the fixed charge layer 122 which overlaps with the transistor 101 and the region of the fixed charge layer 122 which overlaps with the transistor 102.

Since fixed charges exist at an interface between the fixed charge layer 122 and the insulator 123, an interface between the fixed charge layer 122 and the insulator 121, and an interface between the fixed charge layer 122 and the insulator 112 and inside the fixed charge layer 122, the fixed charge layer 122 is negatively charged.

Thus, when a voltage is applied to the conductor 115, the conductor 115, a region of the fixed charge layer 122 which overlaps with the conductor 115, and the insulator between the fixed charge layer 122 and the conductor 115 function as a capacitor. Consequently, the threshold voltage of the transistor 101 over the conductor 115 can be shifted in the positive direction.

Further, when a voltage is applied to the conductor 116, the conductor 116, a region of the fixed charge layer 122 which overlaps with the conductor 116, and the insulator between the fixed charge layer 122 and the conductor 116 function as a capacitor. Thus, the threshold voltage of the transistor 102 over the conductor 116 can be shifted in the positive direction.

Formula (1) shown in Embodiment 1 reveals that, as $Q_b$ becomes negatively large, the variation $\Delta V_{th}$ becomes large. In other words, an increase in the thickness of the fixed charge layer 122 increases the variation of the threshold voltage in the positive direction.

In the semiconductor device illustrated in FIG. 14, the fixed charge layer 122 is thicker under the transistor 102 than under the transistor 101. Accordingly, the threshold voltage of the transistor 102 shifts more in the positive direction than the threshold voltage of the transistor 101.

Thus, transistors having different threshold voltages $V_{th}$ and the same structure can be easily fabricated over the same substrate by appropriate adjustment of the thickness of the fixed charge layer 122, the thickness of the insulators between the fixed charge layer 122 and the conductor 115, and the thickness of the insulator between the fixed charge layer 122 and the layer 100 including the transistors.

The conductor 115 or the conductor 116 may have one or more functions other than the function of forming a capacitor with the fixed charge layer 122. Note that the conductors 115 and 116 do not necessarily have the same functions and different voltages may be applied to the conductors 115 and 116 at different timings.

For example, the conductor 115 may function as a second gate electrode of the transistor 101 and the conductor 116 may function as a wiring.

The voltage applied to the conductor 115 or the conductor 116 may be variable or fixed. When the voltage applied to the conductor 115 or the conductor 116 is variable, a circuit controlling the voltage may be electrically connected to the conductor 115 or the conductor 116.

<Structure 9 of Semiconductor Device>

Figure 15A:
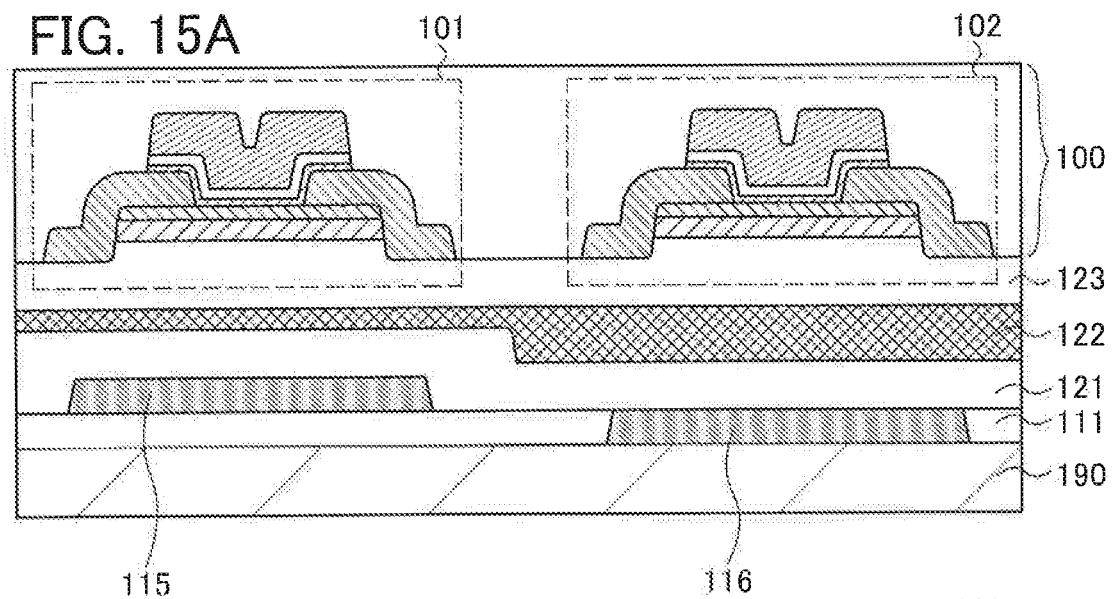
FIGS. 15A to 15C are cross-sectional views each illustrating one embodiment of a semiconductor device.

With reference to FIG. 15A, a specific structure of one embodiment of the present invention is described. FIG. 15A is a cross-sectional view of the transistors of one embodiment of the present invention. Note that in the semiconductor device illustrated in FIG. 15A, components having the same functions as the components in the semiconductor device illustrated in FIG. 13A are denoted by the same reference numerals.

The semiconductor device illustrated in FIG. 15A includes the insulator 111 formed over the substrate 190, the conductor 116 embedded in the insulator 111, the conductor 115 formed over the insulator 111, the insulator 121 formed over the insulator 111 and the conductors 115 and 116, the fixed charge layer 122 formed over the insulator 121, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

Under the transistor 101, the stacked-layer structure including the conductor 115, the insulator 121, the fixed charge layer 122, and the insulator 123 is formed. Under the transistor 102, a stacked-layer structure including the conductor 116, the insulator 121, the fixed charge layer 122, and the insulator 123 is formed. In the fixed charge layer 122, a region overlapping with the transistor 101 and a region overlapping with the transistor 102 are different in thickness.

Note that in such a structure, after the fixed charge layer 122 is formed, the top surface of the fixed charge layer 122 can be planarized by CMP treatment or the like. Performing CMP treatment can improve coverage with a film formed above the insulator 123.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 10 of Semiconductor Device>

Figure 15B:
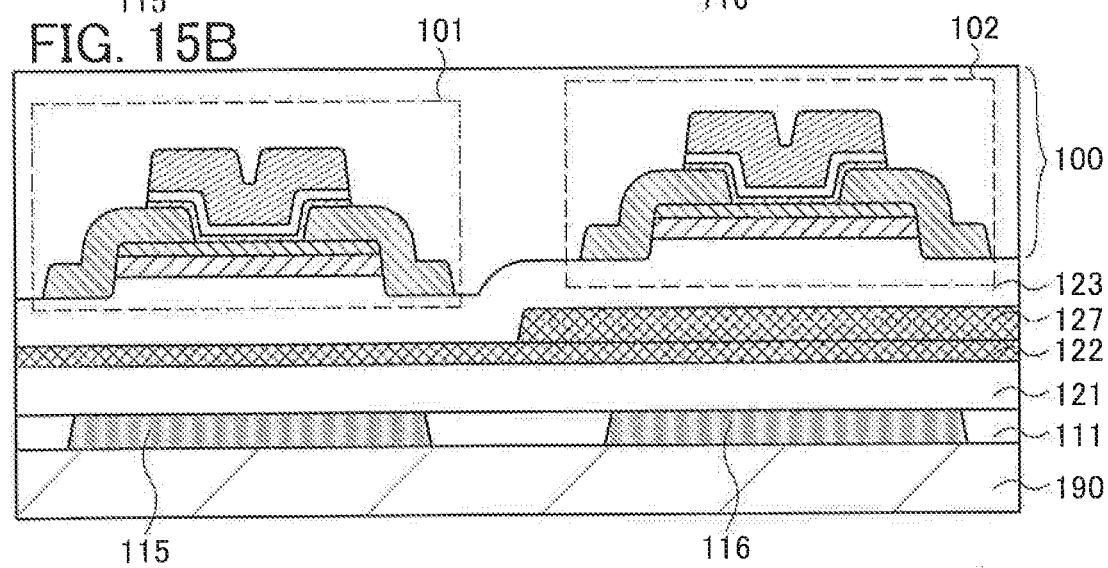

With reference to FIG. 15B, a specific structure of one embodiment of the present invention is described. FIG. 15B is a cross-sectional view of the transistors of one embodiment of the present invention. Note that in the semiconductor device illustrated in FIG. 15B, components having the same functions as the components in the semiconductor device illustrated in FIG. 15A are denoted by the same reference numerals.

The semiconductor device illustrated in FIG. 15B includes the insulator 111 formed over the substrate 190, the conductors 115 and 116 embedded in the insulator 111, the insulator 121 formed over the insulator 111, the conductor 115, and the conductor 116, the fixed charge layer 122 formed over the insulator 121, a fixed charge layer 127 which is formed over the fixed charge layer 122 so as to overlap with the conductor 116, the insulator 123 formed over the fixed charge layer 122 and the fixed charge layer 127, the transistor 101 which is formed over the insulator 123 so as to overlap with the conductor 115, and the transistor 102 which is formed over the insulator 123 so as to overlap with the conductor 116.

Under the transistor 101, the stacked-layer structure including the conductor 115, the insulator 121, the fixed charge layer 122, and the insulator 123 is formed. Under the transistor 102, a stacked-layer structure including the conductor 116, the insulator 121, the fixed charge layer 122, the fixed charge layer 127, and the insulator 123 is formed.

In the structure, the fixed charge layer 127 can be formed using a material and a step similar to the material and the step of the fixed charge layer 122.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 11 of Semiconductor Device>

Figure 15C:
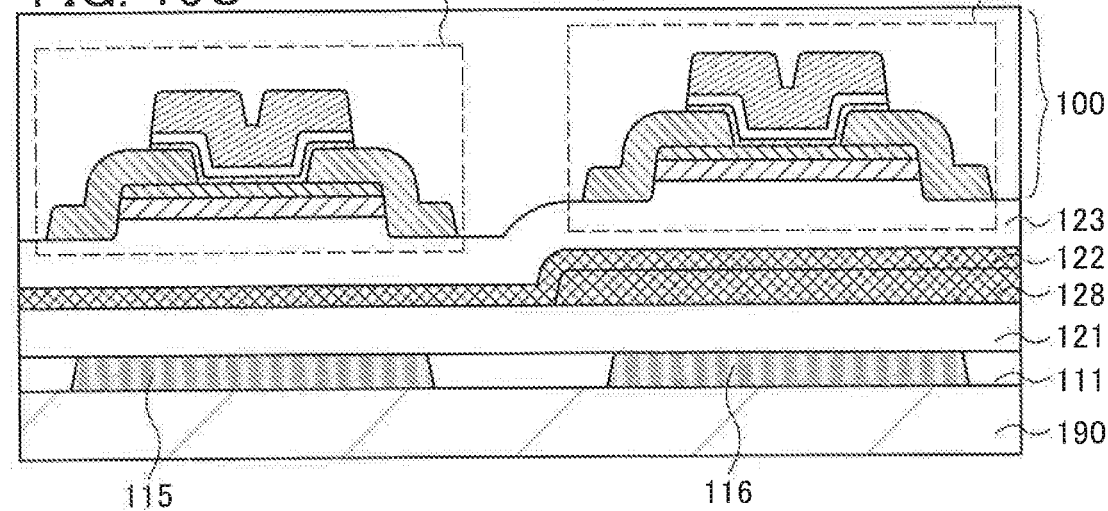

With reference to FIG. 15C, a specific structure of one embodiment of the present invention is described. FIG. 15C is a cross-sectional view of the transistors of one embodiment of the present invention. Note that in the semiconductor device illustrated in FIG. 15C, components having the same functions as the components in the semiconductor device illustrated in FIG. 15A are denoted by the same reference numerals.

The semiconductor device illustrated in FIG. 15C includes the insulator 111 formed over the substrate 190, the conductors 115 and 116 embedded in the insulator 111, the insulator 121 formed over the insulator 111, the conductor 115, and the conductor 116, a fixed charge layer 128 which is formed over the insulator 121 so as to overlap with the conductor 116, the fixed charge layer 122 formed over the insulator 121 and the fixed charge layer 128, the insulator 123 formed over the fixed charge layer 122, the transistor 101 which is formed over the insulator 123 so as to overlap with the conductor 115, and the transistor 102 which is formed over the insulator 123 so as to overlap with the conductor 116.

Under the transistor 101, a stacked-layer structure including the conductor 115, the insulator 121, the fixed charge layer 122, and the insulator 123 is formed. Under the transistor 102, a stacked-layer structure including the conductor 116, the insulator 121, the fixed charge layer 128, the fixed charge layer 122, and the insulator 123 is formed.

In the structure, the fixed charge layer 128 can be formed using a material and a step similar to the material and the step of the fixed charge layer 122.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

The structures, the methods, and the like described in this embodiment can be combined as appropriate with any of the structures, the methods, and the like described in the other embodiments and examples.

Embodiment 6

In this embodiment, one embodiment of a semiconductor device is described with reference to FIGS. 16A and 16B and FIGS. 17A and 17B.

<Structural Example 7 of Semiconductor Device>

Figure 16A:
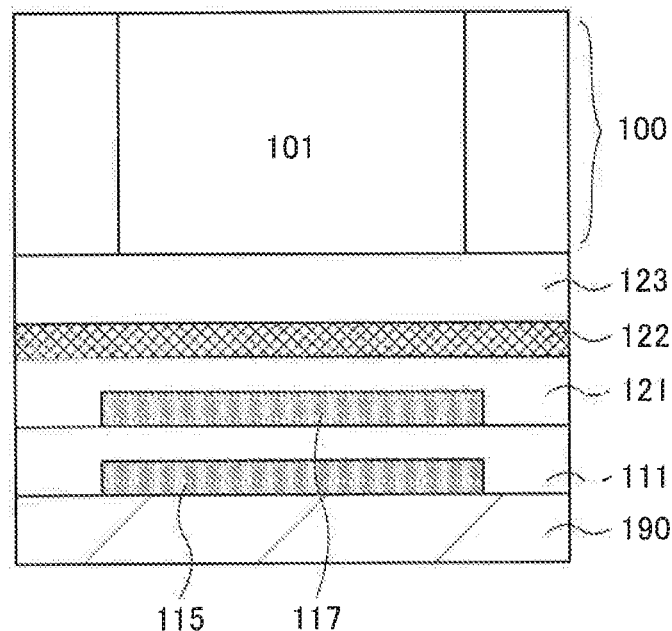
FIGS. 16A and 16B are cross-sectional views each illustrating one embodiment of a semiconductor device.
Figure 16B:
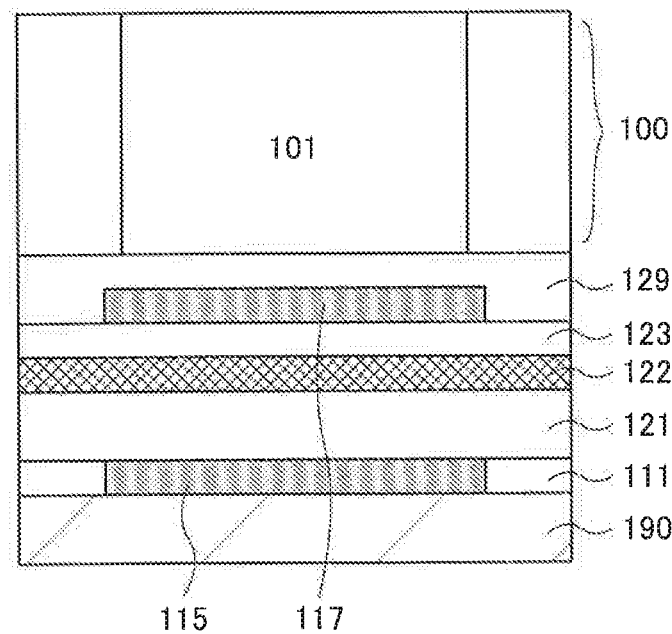

In this embodiment, a structure of a semiconductor device illustrated in FIGS. 16A and 16B which includes a layer including a transistor, a first insulator, a fixed charge layer, a second insulator, and a layer including a conductor is described. Note that in the semiconductor device illustrated in FIGS. 16A and 16B, components having the same functions as the components in the semiconductor device illustrated in FIG. 1 are denoted by the same reference numerals.

FIG. 16A illustrates a semiconductor device that includes, over the substrate 190, the insulator 111 including the conductor 115, the insulator 121 including a conductor 117, the fixed charge layer 122, the insulator 123, and the layer 100 including the transistor 101. Thus, the structure includes the conductor 117 between the conductor 115 and the fixed charge layer 122.

Since fixed charges exist at an interface between the fixed charge layer 122 and the insulator 123, an interface between the fixed charge layer 122 and the insulator 121, and inside the fixed charge layer 122, the fixed charge layer 122 is negatively charged.

As revealed from Formula (1) in Embodiment 1, the combined capacitance $C_{bg1}$ of the insulator 121 and the fixed charge layer 122 is determined by the potential $V_{bg}$ of the conductor 115, charge $Q_b$ in the fixed charge layer 122 (the middle of the fixed charge layer is assumed as the centroid of charge), and the thickness of the insulator or a dielectric between the conductor 115 and the fixed charge layer 122. The physical thickness of the conductor introduced in the capacitor increases the distance between the electrodes, and the conductor does not contribute to the capacitance.

Therefore, when the conductor 117 is in a floating state (an electrically isolated state), the conductor 117 can adjust the distance between the fixed charge layer 122 and the conductor 115 without contributing to the combined capacitance $C_{bg1}$.

When a voltage is applied to the conductor 115, the conductor 115, a region of the fixed charge layer 122 which overlaps with the conductor 115, and the insulator between the fixed charge layer 122 and the conductor 115 function as a capacitor. Thus, the threshold voltage of the transistor 101 over the conductor 115 can be shifted.

Thus, transistors having different threshold voltages $V_{th}$ and the same structure can be easily fabricated over the same substrate by appropriate adjustment of the thickness of the fixed charge layer 122, the conductor 117, the thickness of the insulators between the fixed charge layer 122 and the conductor 115, and the thickness of the insulator between the fixed charge layer 122 and the layer 100 including the transistors.

As illustrated in FIG. 16B, the conductor 117 may be provided between the transistor 101 and the fixed charge layer 122. FIG. 16B illustrates a semiconductor device that includes, over the substrate 190, the insulator 111 including the conductor 115, the insulator 121, the fixed charge layer 122, the insulator 123, an insulator 129 including the conductor 117, and the layer 100 including the transistor 101.

In the above structure, when the conductor 117 is in a floating state (an electrically isolated state), the conductor 117 can adjust the distance between the fixed charge layer 122 and the transistor 101 without contributing to the combined capacitance $C_{bg2}$.

Although not illustrated, a conductor between the conductor 115 and the fixed charge layer 122 and a conductor between the transistor 101 and the fixed charge layer 122 may be provided.

<Structure 12 of Semiconductor Device>

Figure 17A:
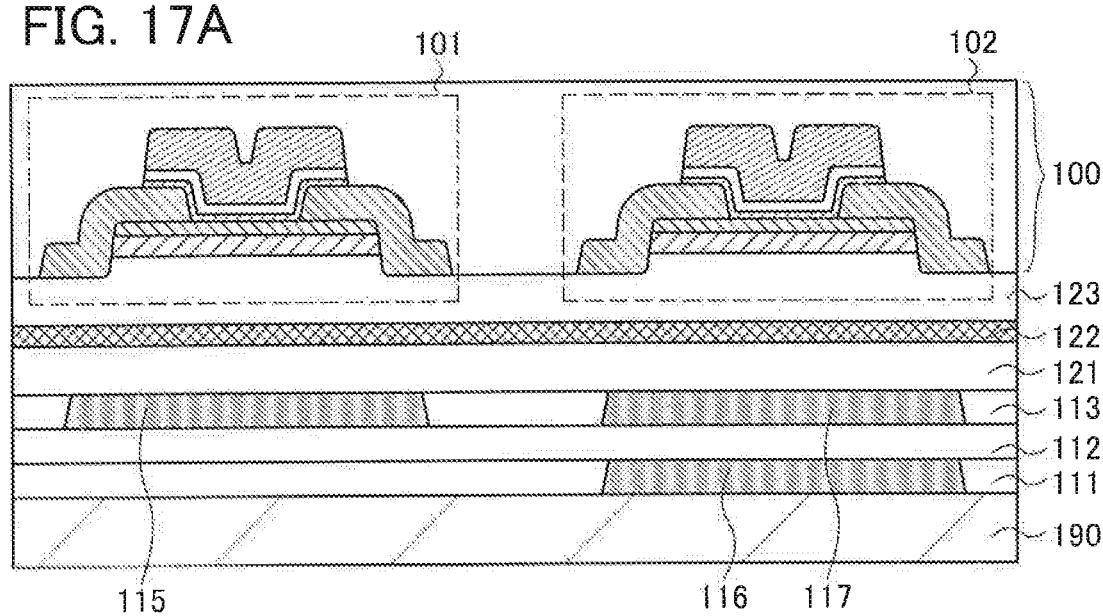
FIGS. 17A and 17B are cross-sectional views each illustrating one embodiment of a semiconductor device.

With reference to FIG. 17A, a specific structure of one embodiment of the present invention is described. FIG. 17A is a cross-sectional view of the transistors of one embodiment of the present invention. Note that in the semiconductor device illustrated in FIG. 17A, components having the same functions as the components in the semiconductor device illustrated in FIG. 15A are denoted by the same reference numerals.

The semiconductor device illustrated in FIG. 17A includes the insulator 111 formed over the substrate 190, the conductor 116 embedded in the insulator 111, the insulator 112 over the insulator 111 and the conductor 116, the insulator 113 over the insulator 112, the conductors 115 and 117 embedded in the insulator 113, the insulator 121 formed over the insulator 113 and the conductors 115 and 117, the fixed charge layer 122 formed over the insulator 121, the insulator 123 formed over the fixed charge layer 122, the transistor 101 which is formed over the insulator 123 so as to overlap with the conductor 115, and the transistor 102 which is formed over the insulator 123 so as to overlap with the conductors 116 and 117.

Under the transistor 101, the stacked-layer structure including the conductor 115, the insulator 121, the fixed charge layer 122, and the insulator 123 is formed. Under the transistor 102, a stacked-layer structure including the conductor 116, the insulator 112, the conductor 117, the insulator 121, the fixed charge layer 122, and the insulator 123 is formed.

Note that in the structure, the conductor 117 is in a floating state (an electrically isolated state). In addition, the same or different voltages may be applied to the conductors 115 and 116.

In the structure, the conductor 117 can be formed using a material and a step similar to the material and the step of the insulator 115.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

<Structure 13 of Semiconductor Device>

Figure 17B:
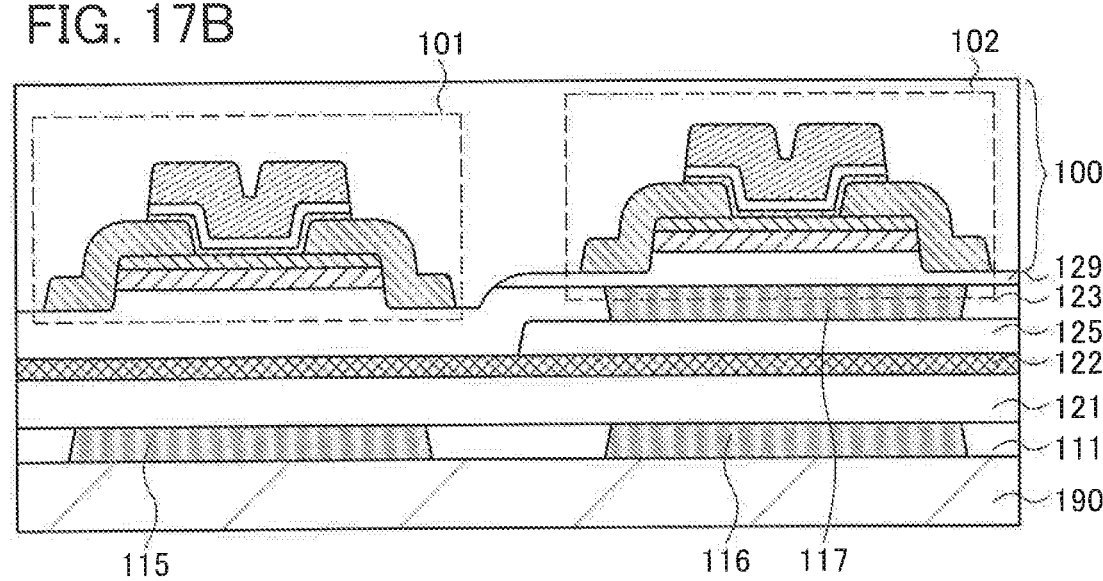

With reference to FIG. 17B, a specific structure of one embodiment of the present invention is described. FIG. 17B is a cross-sectional view of the transistors of one embodiment of the present invention. Note that in the semiconductor device illustrated in FIG. 17B, components having the same functions as the components in the semiconductor device illustrated in FIG. 17A are denoted by the same reference numerals.

The semiconductor device illustrated in FIG. 17B includes the insulator 111 formed over the substrate 190, the conductors 115 and 116 embedded in the insulator 111, the insulator 121 formed over the insulator 111, the conductor 115, and the conductor 116, the fixed charge layer 122 formed over the insulator 121, the insulator 125 which is formed over the fixed charge layer 122 so as to overlap with the conductor 116, the insulator 123 formed over the fixed charge layer 122 and the insulator 125, the conductor 117 which is embedded in the insulator 123 so as to overlap with the conductor 116, the insulator 129 formed over the insulator 123 and the conductor 117, the transistor 101 which is formed over the insulator 123 so as to overlap with the conductor 115, and the transistor 102 which is formed over the insulator 129 so as to overlap with the conductors 116 and 117.

Under the transistor 101, a stacked-layer structure including the conductor 115, the insulator 121, the fixed charge layer 122, and the insulator 123 is formed. Under the transistor 102, a stacked-layer structure including the conductor 116, the insulator 121, the fixed charge layer 122, the insulator 125, the conductor 117, and the insulator 129 is formed.

Note that in the structure, the conductor 117 is in a floating state (an electrically isolated state). In addition, the same or different voltages may be applied to the conductors 115 and 116.

The above-described structure enables transistors having different threshold voltages $V_{th}$ can be easily fabricated over the same substrate.

A transistor with stable electrical characteristics can be provided. A transistor having a high on-state current can be provided. A transistor having a small subthreshold swing value can be provided. A highly reliable transistor can be provided.

The structures, the methods, and the like described in this embodiment can be combined as appropriate with any of the structures, the methods, and the like described in the other embodiments and examples.

Embodiment 7

In this embodiment, one embodiment of a semiconductor device is described with reference to FIG. 18 and FIGS. 19A to 19C.

<Structural Example 8 of Semiconductor Device>

Figure 18:
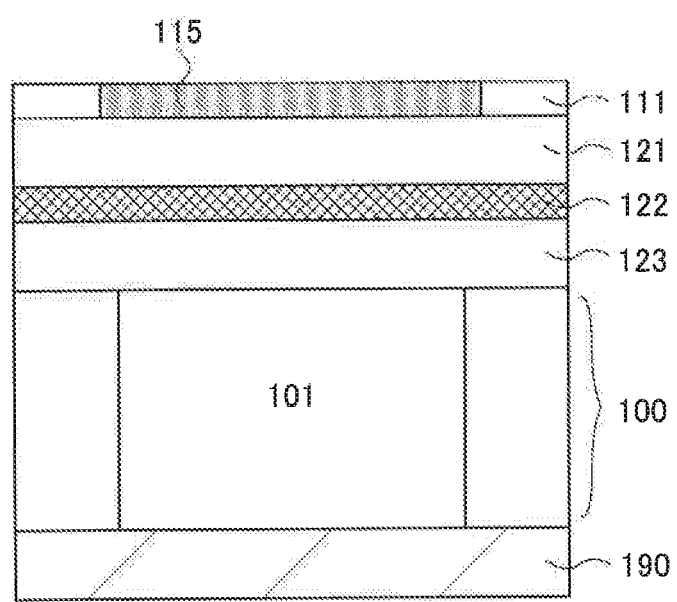
FIG. 18 is a cross-sectional view illustrating one embodiment of a semiconductor device.

In this embodiment, a structure of a semiconductor device which includes a layer including a transistor, a first insulator, a fixed charge layer, a second insulator, and a layer including a conductor is described. FIG. 18 illustrates a semiconductor device that includes, over the substrate 190, the layer 100 including the transistor 101, the insulator 123, the fixed charge layer 122, the insulator 121, the conductor 115, and the insulator 111.

Since electrons exist at an interface between the fixed charge layer 122 and the insulator 123 and an interface between the fixed charge layer 122 and the insulator 121 and inside the fixed charge layer 122, the fixed charge layer 122 is negatively charged. The conductor 115, the insulator 121, and the fixed charge layer 122 function as a capacitor as in the case of application of a negative voltage to the conductor 115, and consequently the threshold voltage of the transistor 101 can be shifted in the positive direction. The shift of the threshold voltage in the positive direction can allow the transistor 101 to be a normally-off transistor, which is in a non-conduction state (also referred to as an off state) even when the gate voltage $V_g$ is 0 V.

Note that the conductor 115 may have other functions as long as it functions at least as one electrode of the capacitor by forming a stacked-layer structure with the fixed charge layer 122 and the insulator 121.

For example, the conductor 115 may function as a second gate electrode of the transistor 101. For example, when a voltage equal to that of the gate electrode of the transistor 101 is applied to the conductor 115, electric fields can be applied from upper and lower sides of the oxide semiconductor 130, so that the on-state current of the transistor can be increased. In addition, the off-state current of the transistor can be reduced.

The conductor 115 may function as a wiring. For example, in the case where a plurality of transistors is stacked, the conductor 115 may also function as a wiring through which a voltage is applied to a transistor other than the transistor 101 or the structure bodies.

The voltage applied to the conductor 115 may be variable or fixed. When the voltage applied to the conductor 115 is variable, a circuit controlling the voltage may be electrically connected to the conductor 115.

Note that in the structure, fixed charges are required not to be transferred out of the fixed charge layer 122. Thus, electrons can be effectively held inside the fixed charge layer 122 or at the interface with another insulating layer when the electron affinity of each of the insulators 121 and 123 is smaller than that of the fixed charge layer 122 and the bandgap of each of the insulators 121 and 123 is larger than that of the fixed charge layer 122.

The fixed charge layer 122 allows control of the threshold voltage of the transistor 101. A transistor having a low leakage current in a non-conduction state can be provided. A transistor with stable electrical characteristics can be provided. A transistor having a high on-state current can be provided. A transistor having a small subthreshold swing value can be provided. A highly reliable transistor can be provided.

<Transistor structure 14>

Figure 19A:
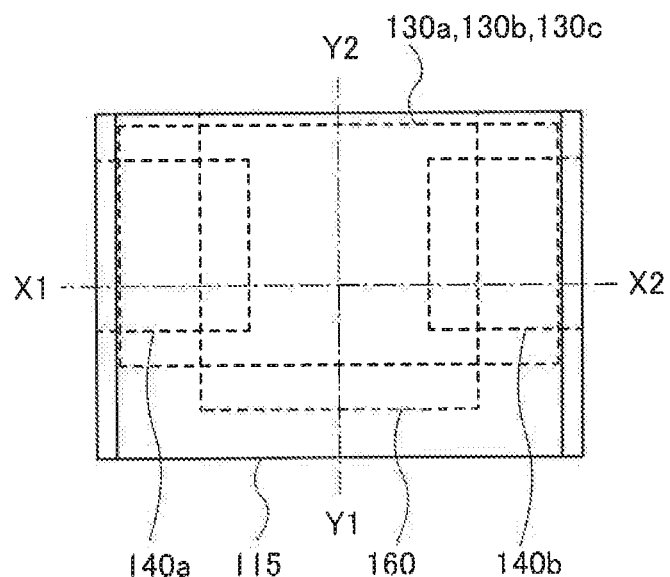
FIGS. 19A to 19C are a top view and cross-sectional views illustrating one embodiment of a semiconductor device.
Figure 19B:
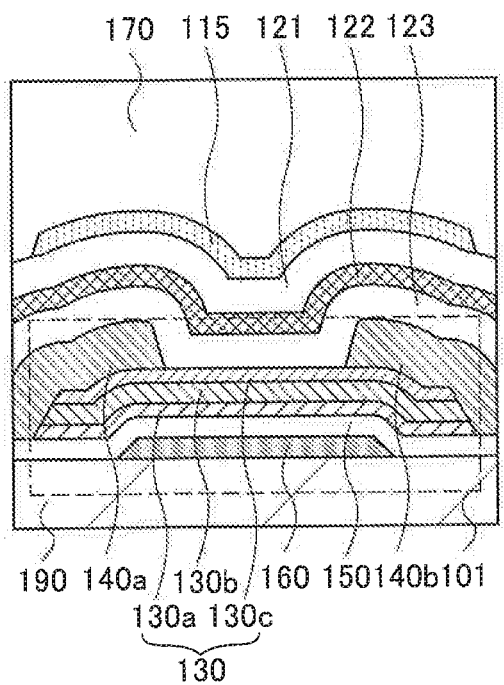
Figure 19C:
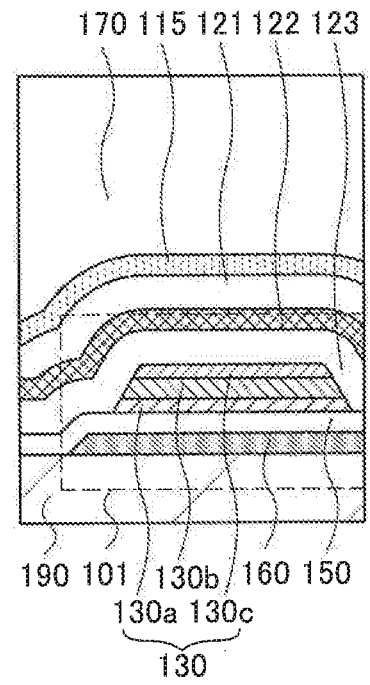

FIGS. 19A to 19C illustrate an example of a structure that can be applied to the transistor 101. FIG. 19A illustrates a top surface of the transistor 101. For simplification of the figure, some films are omitted in FIG. 19A. FIG. 19B is a cross-sectional view taken along the dashed-dotted line X1-X2 in FIG. 19A, and FIG. 19C is a cross-sectional view taken along the dashed-dotted line Y1-Y2 in FIG. 19A.

The transistor 101 in each of FIGS. 19A to 19C is an inverted staggered transistor having a bottom-gate structure. In the transistor 101, components having the same functions as the components in the transistor 101 in FIGS. 2A to 2C are denoted by the same reference numerals. The transistor 101 formed over the substrate 190 includes the conductor 160 which functions as a gate electrode, the insulator 150 which functions as a gate insulating layer, the oxide semiconductor 130 which includes the oxide semiconductors 130a, 130b, and 130c, the conductor 140a which functions as one of a source electrode and a drain electrode, and the conductor 140b which functions as the other of the source electrode and the drain electrode.

In the structure illustrated in FIGS. 19A to 19C, since the transistor 101 is an inverted staggered transistor having a bottom-gate structure, the fixed charge layer 122 is formed above the transistor 101.

Formula (1) shown in Embodiment 1 is satisfied also in this structure. Hence, an increase in the thickness of the insulator 121 between the fixed charge layer 122 and the conductor 115 increases the variation of the threshold voltage $V_{th}$ in the positive direction. In addition, a decrease in the thickness of the insulator 123 between the fixed charge layer 122 and the transistor 101 increases the variation of the threshold voltage $V_{th}$ in the positive direction.

Furthermore, as $Q_b$ becomes large, the variation $\Delta V_{th}$ becomes large. In other words, an increase in the thickness of the fixed charge layer 122 increases the variation of the threshold voltage $V_{th}$ in the positive direction. Thus, the threshold voltage $V_{th}$ can be controlled by appropriate adjustment of the thicknesses of the insulator 121, the fixed charge layer 122, and the insulator 123.

The structures, the methods, and the like described in this embodiment can be combined as appropriate with any of the structures, the methods, and the like described in the other embodiments and examples.

Embodiment 8

In this embodiment, an example of a circuit of a semiconductor device including transistors of one embodiment of the present invention and the like is described.

<CMOS Inverter>

Figure 21A:
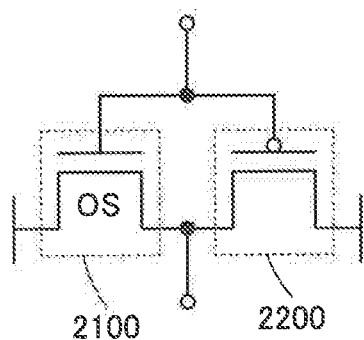
FIGS. 21A and 21B are circuit diagrams each illustrating a semiconductor device of one embodiment of the present invention.

A circuit diagram in FIG. 21A shows a configuration of what is called a CMOS inverter in which a p-channel transistor 2200 and an n-channel transistor 2100 are connected to each other in series and in which gates of them are connected to each other.

<Structure of Semiconductor Device>

Figure 22:
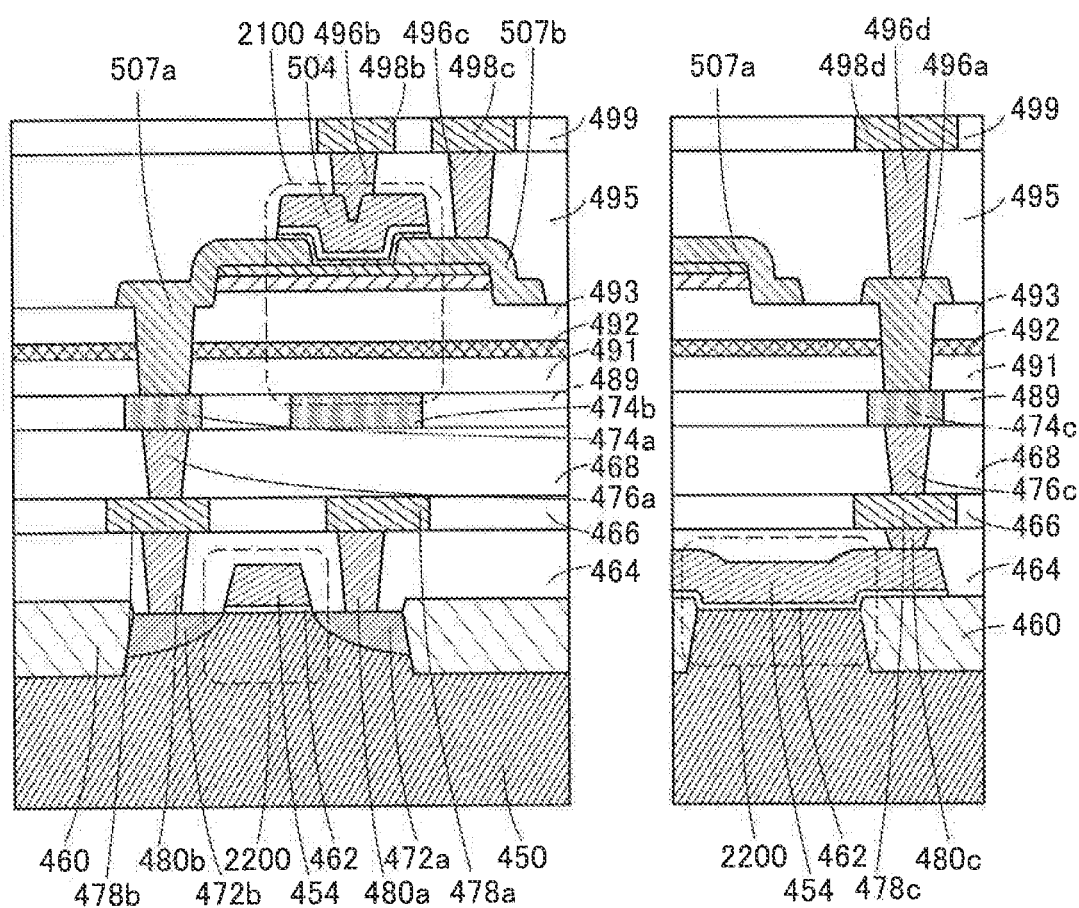
FIG. 22 is a cross-sectional view illustrating a semiconductor device of one embodiment of the present invention.

FIG. 22 is a cross-sectional view of the semiconductor device of FIG. 21A. The semiconductor device shown in FIG. 22 includes the transistor 2200 and the transistor 2100. The transistor 2100 is placed above the transistor 2200. Note that as the transistor 2100, any of the transistors described in the above embodiments can be used. Therefore, the description regarding the above-mentioned transistors can be referred to for the transistor 2100 as appropriate.

The transistor 2200 shown in FIG. 22 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 serves as a gate insulator. The conductor 454 serves as a gate electrode. Thus, the resistance of a channel formation region can be controlled by a potential applied to the conductor 454. In other words, conduction or non-conduction between the region 472a and the region 472b can be controlled by the potential applied to the conductor 454.

As the semiconductor substrate 450, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting n-type conductivity may be provided in a region where the transistor 2200 is formed. Alternatively, the semiconductor substrate 450 may be an i-type semiconductor substrate.

The top surface of the semiconductor substrate 450 preferably has a (110) plane. Thus, on-state characteristics of the transistor 2200 can be improved.

The regions 472a and 472b are regions including impurities imparting p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device illustrated in FIG. 22 includes an insulator 464, an insulator 466, an insulator 468, an insulator 489, an insulator 491, a fixed charge layer 492, an insulator 493, an insulator 495, an insulator 499, a conductor 480a, a conductor 480b, a conductor 480c, a conductor 478a, a conductor 478b, a conductor 478c, a conductor 476a, a conductor 476c, a conductor 474a, a conductor 474b, a conductor 474c, a conductor 496a, a conductor 496b, a conductor 496c, a conductor 496d, a conductor 498b, a conductor 498c, and a conductor 498d.

The insulator 464 is placed over the transistor 2200. The insulator 466 is placed over the insulator 464. The insulator 468 is placed over the insulator 466. The insulator 489 is placed over the insulator 468. The transistor 2100 is placed over the insulator 489. The insulator 495 is placed over the transistor 2100. The insulator 499 is placed over the insulator 495.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476c are embedded.

The insulator 489 includes an opening overlapping with a channel formation region of the transistor 2100, an opening reaching the conductor 476b, and an opening reaching the conductor 476c. In the openings, the conductor 474a, the conductor 474b, and the conductor 474c are embedded. Note that the insulator 489 corresponds to the insulator 111 in the above embodiments and thus, the description of the insulator 111 can be referred to for details of the insulator 489.

The conductor 474b may serve as a gate electrode of the transistor 2100. The electrical characteristics of the transistor 2100, such as the threshold voltage, may be controlled by application of a predetermined potential to the conductor 474b, for example. The conductor 474b may be electrically connected to the conductor 504 having a function of the gate electrode of the transistor 2100, for example. In that case, the on-state current of the transistor 2100 can be increased. Furthermore, a punch-through phenomenon can be suppressed; thus, the electrical characteristics of the transistor 2100 in a saturation region can be stable. Note that the conductor 474b corresponds to the conductor 115 in the above embodiments and thus, the description of the conductor 115 can be referred to for details of the conductor 474b.

The insulator 491, the fixed charge layer 492, and the insulator 493 have an opening reaching the conductor 474b and an opening reaching the conductor 496a. Note that the insulator 491 corresponds to the insulator 121 in the above embodiments and thus, the description of the insulator 121 can be referred to for details of the insulator 491. Note that the fixed charge layer 492 corresponds to the fixed charge layer 122 in the above embodiments and thus, the description of the fixed charge layer 492 can be referred to for details of the fixed charge layer 122. Note that the insulator 493 corresponds to the insulator 123 in the above embodiments and thus, the description of the insulator 123 can be referred to for details of the insulator 493. In the openings, a conductor 507a and the conductor 496a are embedded.

The insulator 495 has an opening reaching the conductor 507a serving as one of a source and a drain of the transistor 2100, an opening reaching the conductor 504 serving as a gate electrode of the transistor 2100, and an opening reaching the conductor 496a. Note that the insulator 495 corresponds to the insulator 170 in the above embodiments and thus, the description of the insulator 170 can be referred to for details of the insulator 495. In the openings, the conductor 496b, the conductor 496c, and the conductor 496d are embedded.

The insulator 499 includes an opening reaching the conductor 496b, an opening reaching the conductor 496c, and an opening reaching the conductor 496d. In the openings, the conductor 498b, the conductor 498c, and the conductor 498d are embedded.

The insulators 464, 466, 468, and 499 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator that has a function of blocking oxygen and impurities such as hydrogen is preferably included in at least one of the insulators 464, 466, 468, and 499. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The conductors 480a, 480b, 480c, 478a, 478b, 478c, 476a, 476c, 474a, 474b, 474c, 496a, 496b, 496c, 496d, 498b, 498c, and 498d may each be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

In the semiconductor device described in this embodiment, the transistor 2100 is formed above the fixed charge layer 492. Hence, the semiconductor device can be fabricated without subjecting the transistor 2100 to high-temperature treatment. Thus, an adverse effect of thermal impurity diffusion or the like by heat treatment can be reduced, for example, when the transistor 2100 is formed using an oxide semiconductor. In particular, when a high-k material is used for the fixed charge layer 492, heat treatment at high temperature can be performed before the transistor 2100 is formed.

For example, when a high-k material is used for the semiconductor device in this embodiment, heat treatment at high temperature of approximately 700° C. is necessary. Thus, as a material of a wiring, a plug, or the like below the fixed charge layer 492, a high-melting-point metal such as W, titanium nitride, or tantalum nitride is preferably used. In the case where a low-melting-point metal such as Cu is used in order to reduce wiring resistance, such a material is preferably used for a layer above the fixed charge layer 492.

In the case where a wiring or the like in the semiconductor device in this embodiment is formed using a low-resistance material such as copper, the heat treatment temperature in each step is preferably kept at approximately 400° C. to 450° C. because the low-melting-point metal such as copper might be melted by heat treatment at high temperature. Reducing wiring resistance in this manner can increase the speed of signal transmission.

Figure 23:
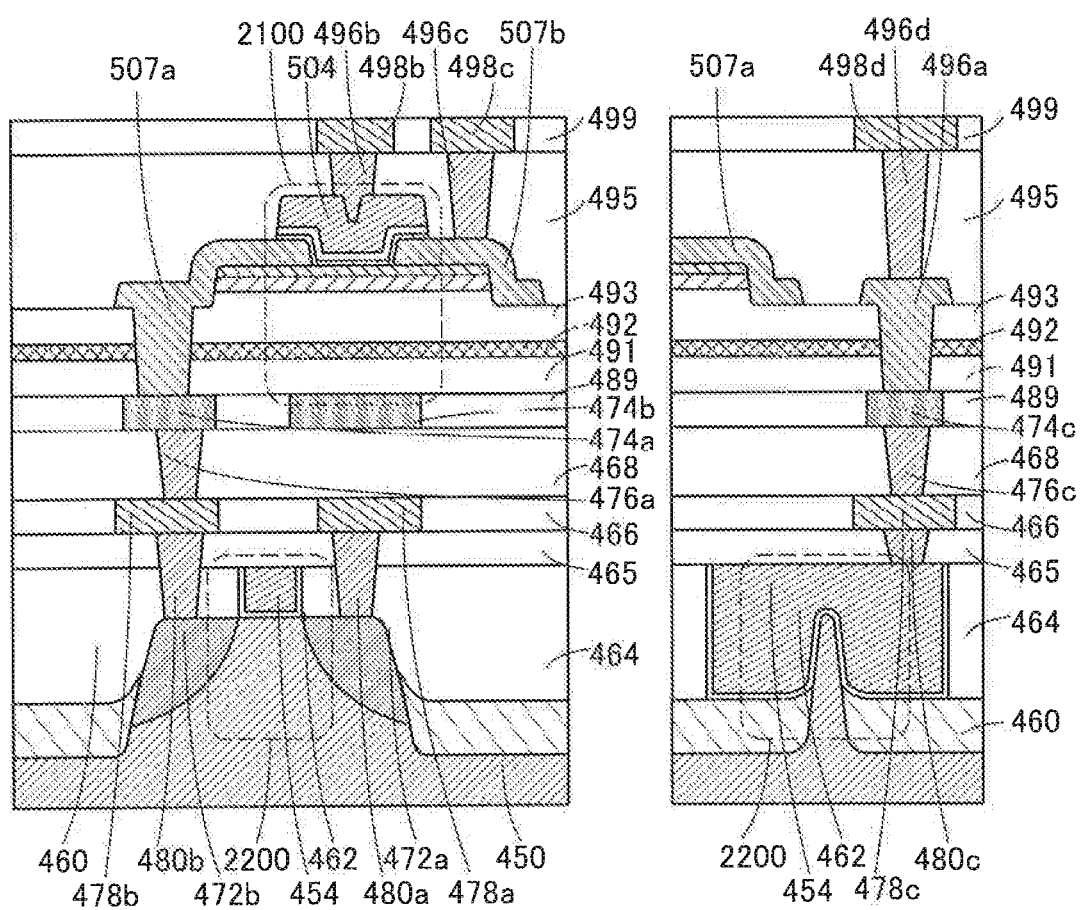
FIG. 23 is a cross-sectional view illustrating a semiconductor device of one embodiment of the present invention.

Note that a semiconductor device in FIG. 23 is the same as the semiconductor device in FIG. 22 except for the structure of the transistor 2200. Therefore, the description of the semiconductor device in FIG. 22 is referred to for the semiconductor device in FIG. 23. In the semiconductor device in FIG. 23, the transistor 2200 is a Fin-type transistor. The effective channel width is increased in the Fin-type transistor 2200, whereby the on-state characteristics of the transistor 2200 can be improved. In addition, since contribution of the electric field of the gate electrode can be increased, the off-state characteristics of the transistor 2200 can be improved.

Figure 24:
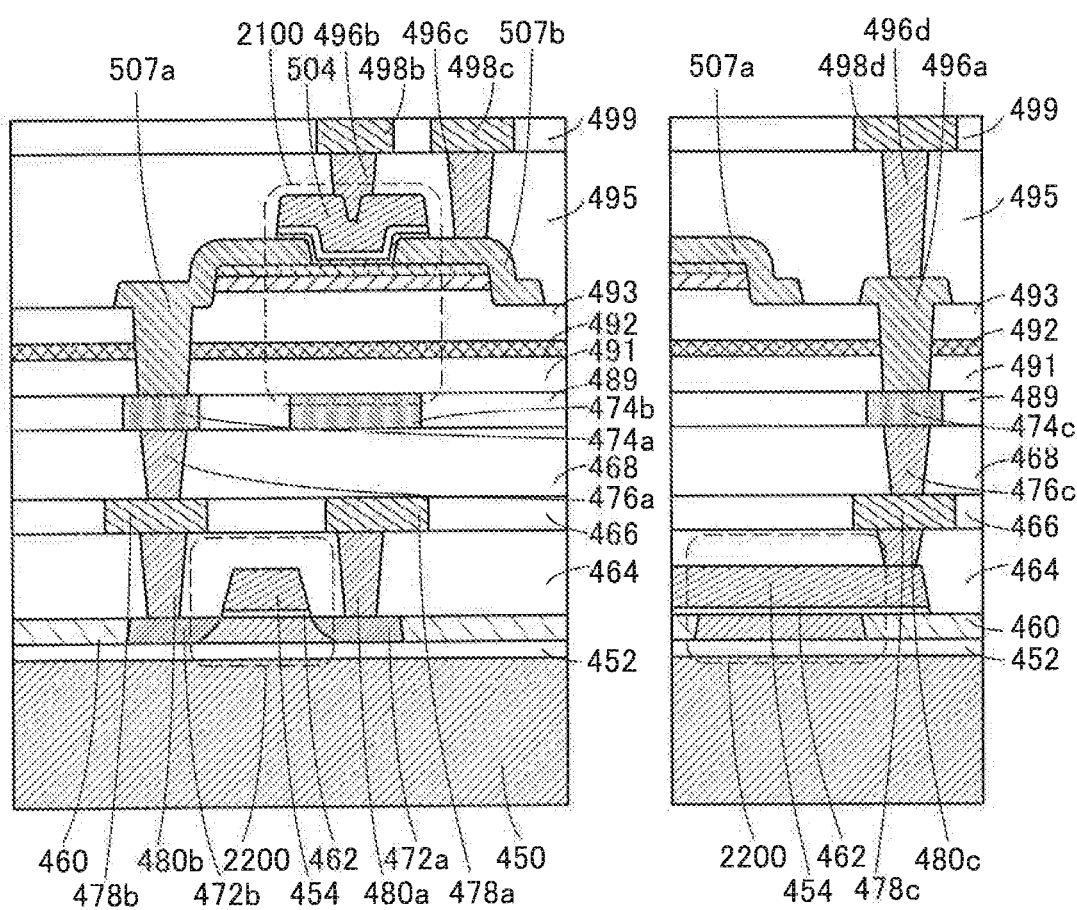
FIG. 24 is a cross-sectional view illustrating a semiconductor device of one embodiment of the present invention.

Note that a semiconductor device in FIG. 24 is the same as the semiconductor device in FIG. 22 except for the structure of the transistor 2200. Therefore, the description of the semiconductor device in FIG. 22 is referred to for the semiconductor device in FIG. 24. Specifically, in the semiconductor device in FIG. 24, the transistor 2200 is formed in the semiconductor substrate 450 which is an SOI substrate. In the structure in FIG. 24, the region 460 is apart from the semiconductor substrate 450 with an insulator 452 provided therebetween. Since the SOI substrate is used as the semiconductor substrate 450, a punch-through phenomenon and the like can be suppressed; thus, the off-state characteristics of the transistor 2200 can be improved. Note that the insulator 452 can be formed by turning the semiconductor substrate 450 into an insulator. For example, silicon oxide can be used as the insulator 452.

In each of the semiconductor devices shown in FIG. 22 to FIG. 24, a p-channel transistor is formed utilizing a semiconductor substrate, and an n-channel transistor is formed above that; accordingly, an occupation area of the element can be reduced. That is, the integration degree of the semiconductor device can be improved. In addition, the process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 21B:
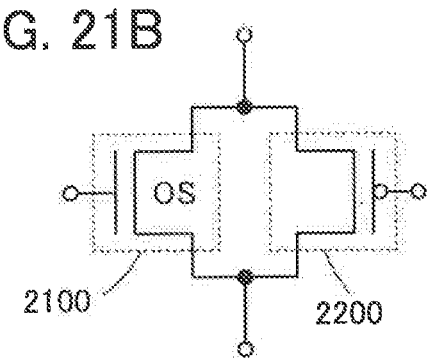

A circuit diagram in FIG. 21B shows a configuration in which sources of the transistors 2100 and 2200 are connected to each other and drains of the transistors 2100 and 2200 are connected to each other. With such a configuration, the transistors can function as what is called a CMOS analog switch.

<Memory Device 1>

Figure 25A:
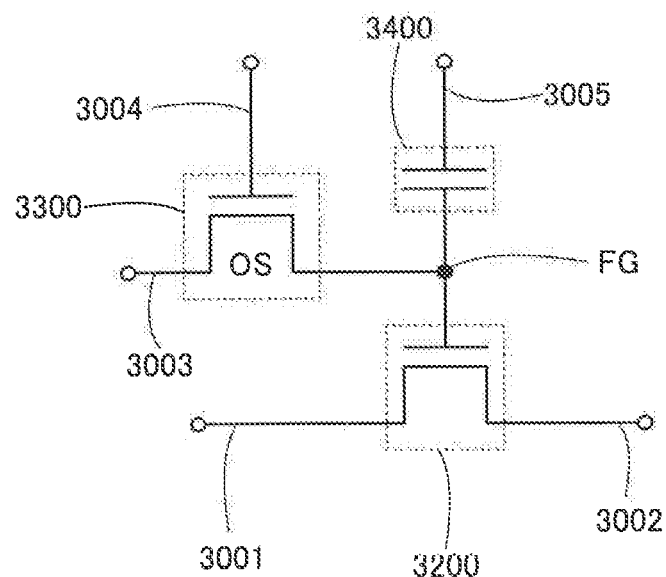
FIGS. 25A and 25B are circuit diagrams each illustrating a semiconductor device of one embodiment of the present invention.
Figure 25B:
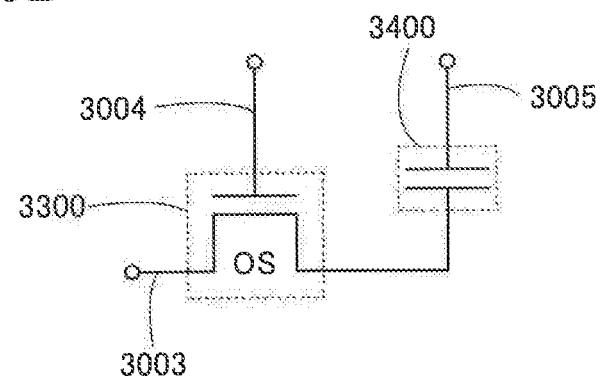

FIGS. 25A and 25B show an example of a semiconductor device (memory device) which includes the transistor of one embodiment of the present invention, which can retain stored data even when not powered, and which has an unlimited number of write cycles.

The semiconductor device illustrated in FIG. 25A includes a transistor 3200 using a first semiconductor, a transistor 3300 using a second semiconductor, and a capacitor 3400. Note that a transistor similar to the transistor 2100 can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained at a predetermined node of the semiconductor device for a long period. In other words, power consumption of the semiconductor device can be reduced because refresh operation becomes unnecessary or the frequency of refresh operation can be extremely low.

In FIG. 25A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to one electrode of the capacitor 3400. A fifth wiring 3005 is electrically connected to the other electrode of the capacitor 3400.

The semiconductor device in FIG. 25A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in a "conduction state". Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0(>V_{th\_H})$, the transistor 3200 is brought into a "conduction state". In the case where the low-level charge is supplied to the node FG in writing, even when the potential of the fifth wiring 3005 is $V_0(<V_{th\_L})$, the transistor 3200 still remains in a "non-conduction state". Thus, the data retained in the node FG can be read by determining the potential of the second wiring 3002.

Note that in the case where memory cells are arrayed, it is necessary that data of a desired memory cell be read in read operation. For example, a configuration in which only data of a desired memory cell can be read by supplying a potential at which the transistor 3200 is brought into a "non-conduction state" regardless of the potential supplied to the node FG, that is, a potential lower than $V_{th\_H}$ to the fifth wiring 3005 of memory cells from which data is not read may be employed. Alternatively, a configuration in which only data of a desired memory cell can be read by supplying a potential at which the transistor 3200 is brought into a "conduction state" regardless of the potential supplied to the node FG, that is, a potential higher than $V_{th\_L}$ to the fifth wiring 3005 of memory cells from which data is not read may be employed.

Although an example in which two kinds of charges are retained in the node FG, the semiconductor device of the present invention is not limited to this example. For example, a structure in which three or more kinds of charges can be retained in the node FG of the semiconductor device may be employed. With such a structure, the semiconductor device can be multi-valued and the storage capacity can be increased.

<Structure of Memory Device>

Figure 26:
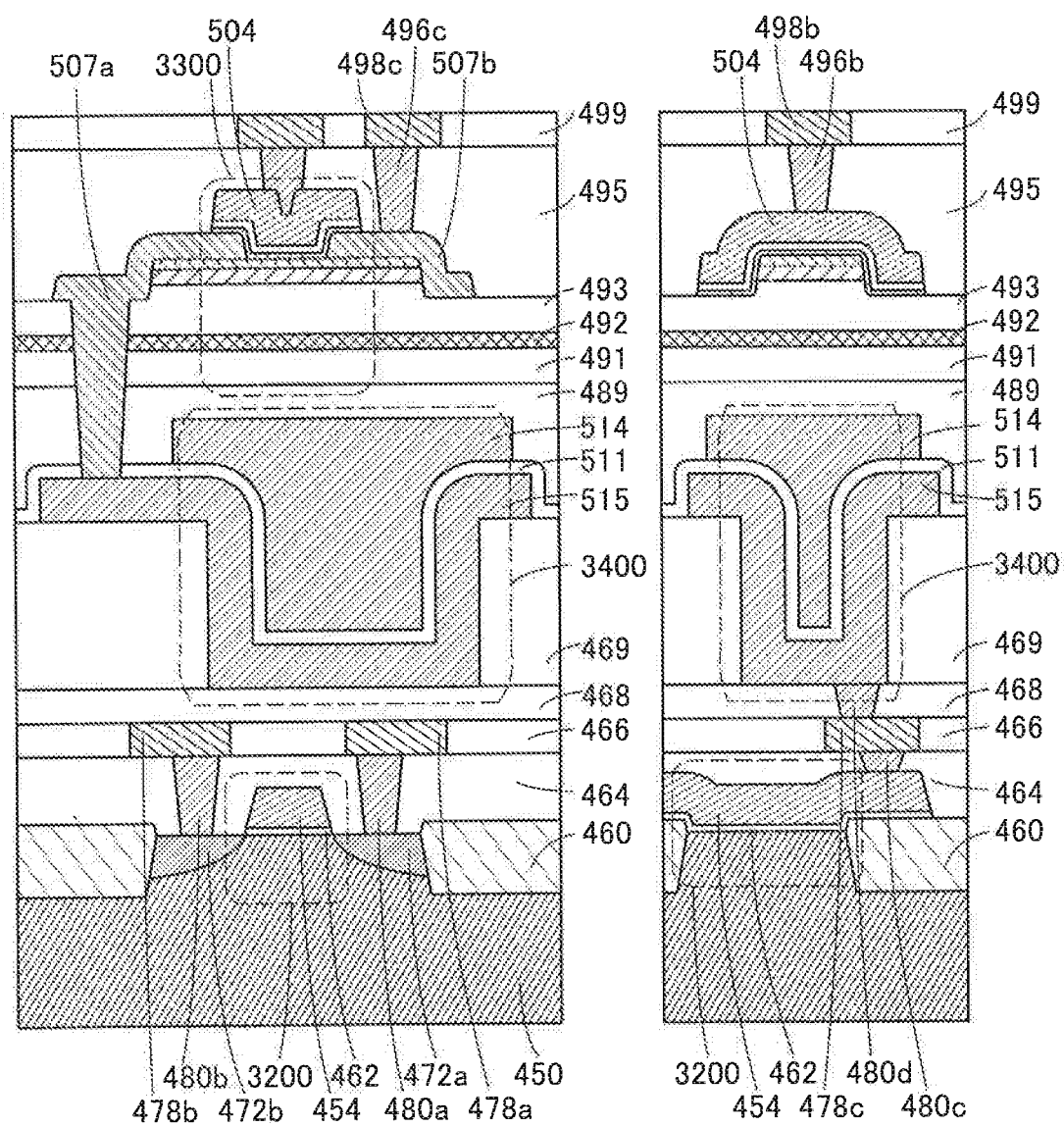
FIG. 26 is a cross-sectional view illustrating a semiconductor device of one embodiment of the present invention.

FIG. 26 is a cross-sectional view of the semiconductor device of FIG. 25A. The semiconductor device shown in FIG. 26 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 3300 in FIG. 22 is referred to. Note that although the transistor 3300 is illustrated as a p-channel transistor in FIG. 22, the transistor 3200 may be an n-channel transistor.

The transistor 3200 illustrated in FIG. 26 is a transistor using the semiconductor substrate 450. The transistor 3200 includes the region 472a in the semiconductor substrate 450, the region 472b in the semiconductor substrate 450, the insulator 462, and the conductor 454.

The semiconductor device illustrated in FIG. 26 includes the insulator 464, the insulator 466, the insulator 468, an insulator 469, an insulator 489, the insulator 491, the fixed charge layer 492, the insulator 493, the insulator 495, the insulator 499, the conductor 480a, the conductor 480b, the conductor 480c, a conductor 480d, the conductor 478a, the conductor 478b, the conductor 478c, a conductor 496b, a conductor 496c, the conductor 498b, and the conductor 498c.

The insulator 464 is placed over the transistor 3200. The insulator 466 is placed over the insulator 464. The insulator 468 is placed over the insulator 466. The insulator 469 is placed over the insulator 468. The insulator 489 is provided over the insulator 469. The transistor 2100 is placed over the insulator 489. The insulator 495 is placed over the transistor 2100. The insulator 499 is placed over the insulator 495.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478c. In addition, the conductor 480d is embedded in the opening.

The capacitor 3400 illustrated in FIG. 26 includes a conductor 515, the conductor 514, and the insulator 511. Note that the capacitor 3400 is embedded in the insulator 469. The conductor 514 or the conductor 515 may overlap with a channel formation region of the transistor 3300.

The thicknesses of the conductor 515, the insulator 489, the insulator 491, the fixed charge layer 492, and the insulator 493 may be adjusted as appropriate to control electrical characteristics, such as the threshold voltage, of the transistor 3300.

The insulator 489 includes an opening reaching the conductor 515. In addition, the conductor 507a is embedded in the opening.

The insulator 491, the fixed charge layer 492, and the insulator 493 have an opening reaching the conductor 515. Note that the insulator 491 corresponds to the insulator 121 in the above embodiments and thus, the description of the insulator 121 can be referred to for details of the insulator 491. Note that the fixed charge layer 492 corresponds to the fixed charge layer 122 in the above embodiments and thus, the description of the fixed charge layer 492 can be referred to for details of the fixed charge layer 122. Note that the insulator 493 corresponds to the insulator 123 in the above embodiments and thus, the description of the insulator 123 can be referred to for details of the insulator 493. In the opening, the conductor 507a is embedded.

The insulator 495 has an opening reaching the conductor 507b serving as one of the source and the drain of the transistor 3300 and an opening reaching the conductor 504 serving as the gate electrode of the transistor 3300. Note that the insulator 495 corresponds to the insulator 170 in the above embodiments and thus, the description of the insulator 170 can be referred to for details of the insulator 495. In the openings, the conductor 496b and the conductor 496c are embedded.

The insulator 499 includes an opening reaching the conductor 496b and an opening reaching the conductor 496c. In the openings, the conductor 498b and the conductor 498c are embedded.

The insulator that has a function of blocking oxygen and impurities such as hydrogen is preferably included in at least one of the insulators 464, 466, 468, 469, 489, 495, and 499. When an insulator that has a function of blocking oxygen and impurities such as hydrogen is placed near the transistor 3300, the electrical characteristics of the transistor 3300 can be stable.

The source or drain of the transistor 3200 is electrically connected to the conductor 507b serving as one of the source and the drain of the transistor 3300 through the conductor 480b, the conductor 478b, the conductor 476a, the conductor 474b, and the conductor 496c. The conductor 454 serving as the gate electrode of the transistor 3200 is electrically connected to the conductor 507a serving as the other of the source and the drain of the transistor 3300 through the conductor 480c, the conductor 478c, the conductor 476b, the conductor 474c, and the conductor 496d.

In the semiconductor device described in this embodiment, the transistor 3300 is formed above the capacitor 3400. Hence, the semiconductor device can be fabricated without subjecting the transistor 3300 to high-temperature treatment. Thus, an adverse effect of thermal impurity diffusion or the like by heat treatment can be reduced, for example, when the transistor 3300 is formed using an oxide semiconductor. In particular, when a high-k material is used for the fixed charge layer 492 or the capacitor 3400, heat treatment at high temperature can be performed before the transistor 3300 is formed.

For example, when a high-k material is used for the semiconductor device in this embodiment, heat treatment at high temperature of approximately 700° C. is necessary. Thus, as a material of a wiring, a plug, or the like below the fixed charge layer 492, a high-melting-point metal such as W, titanium nitride, or tantalum nitride is preferably used. In the case where a low-melting-point metal such as Cu is used in order to reduce wiring resistance, such a material is preferably used for a layer above the fixed charge layer 492. In addition, when a high-k material is used to form the capacitor 3400, the occupied area can be reduced and the storage capacity can be increased.

In the case where a wiring or the like in the semiconductor device in this embodiment is formed using a low-resistance material such as copper, the heat treatment temperature in each step is preferably kept at approximately 400° C. to 450° C. because the low-melting-point metal such as copper might be melted by heat treatment at high temperature. Reducing wiring resistance in this manner can increase the speed of signal transmission.

For the structures of other components, the description of FIG. 22 and the like can be referred to as appropriate.

Figure 27:
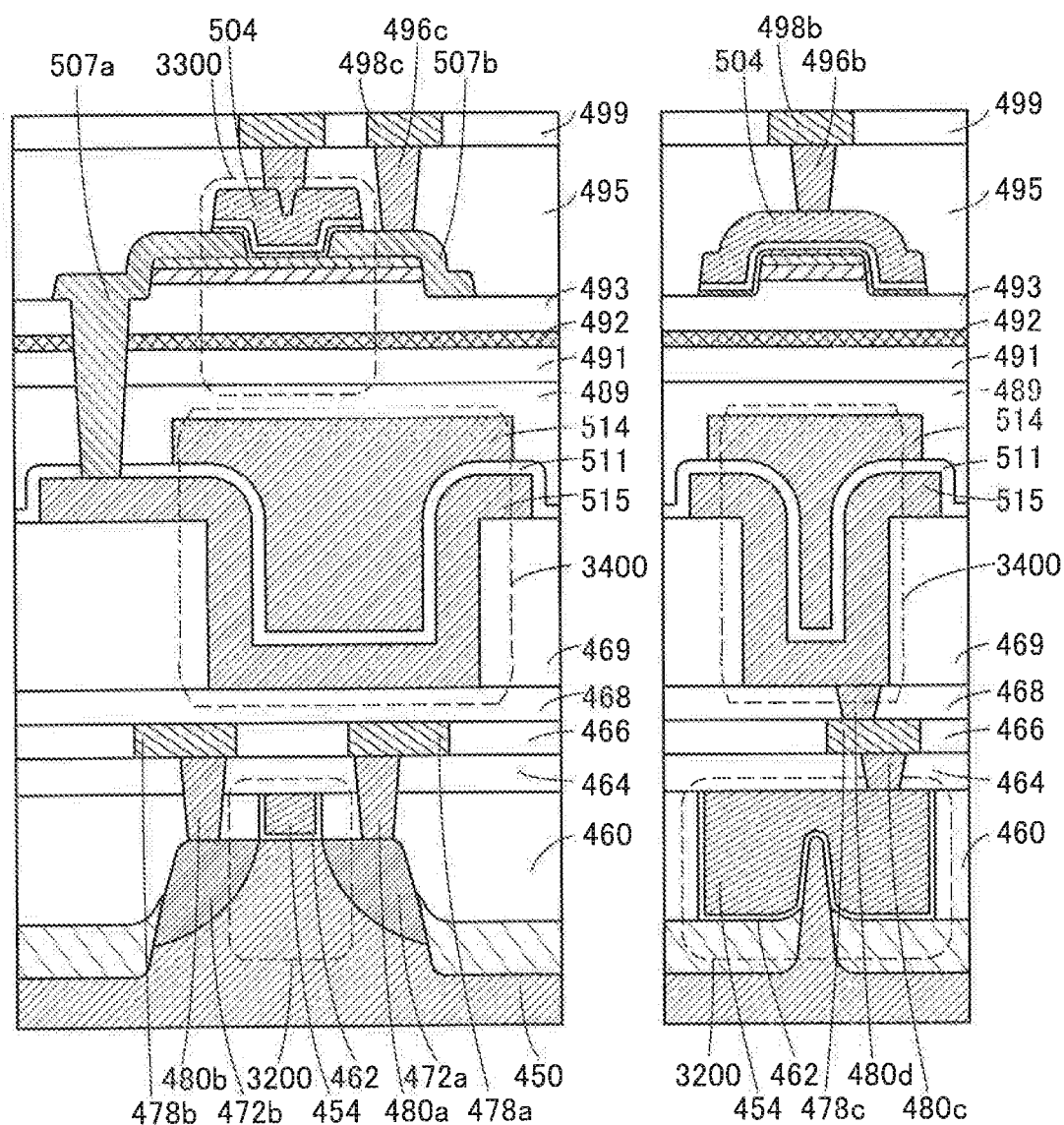
FIG. 27 is a cross-sectional view illustrating a semiconductor device of one embodiment of the present invention.

A semiconductor device in FIG. 27 is the same as the semiconductor device in FIG. 26 except for the structure of the transistor 3200. Therefore, the description of the semiconductor device in FIG. 26 is referred to for the semiconductor device in FIG. 27. Specifically, in the semiconductor device in FIG. 27, the transistor 3200 is a Fin-type transistor. For the Fin-type transistor 3200, the description of the transistor 2200 in FIG. 23 is referred to. Note that although the transistor 2200 is illustrated as a p-channel transistor in FIG. 23, the transistor 3200 may be an n-channel transistor.

Figure 28:
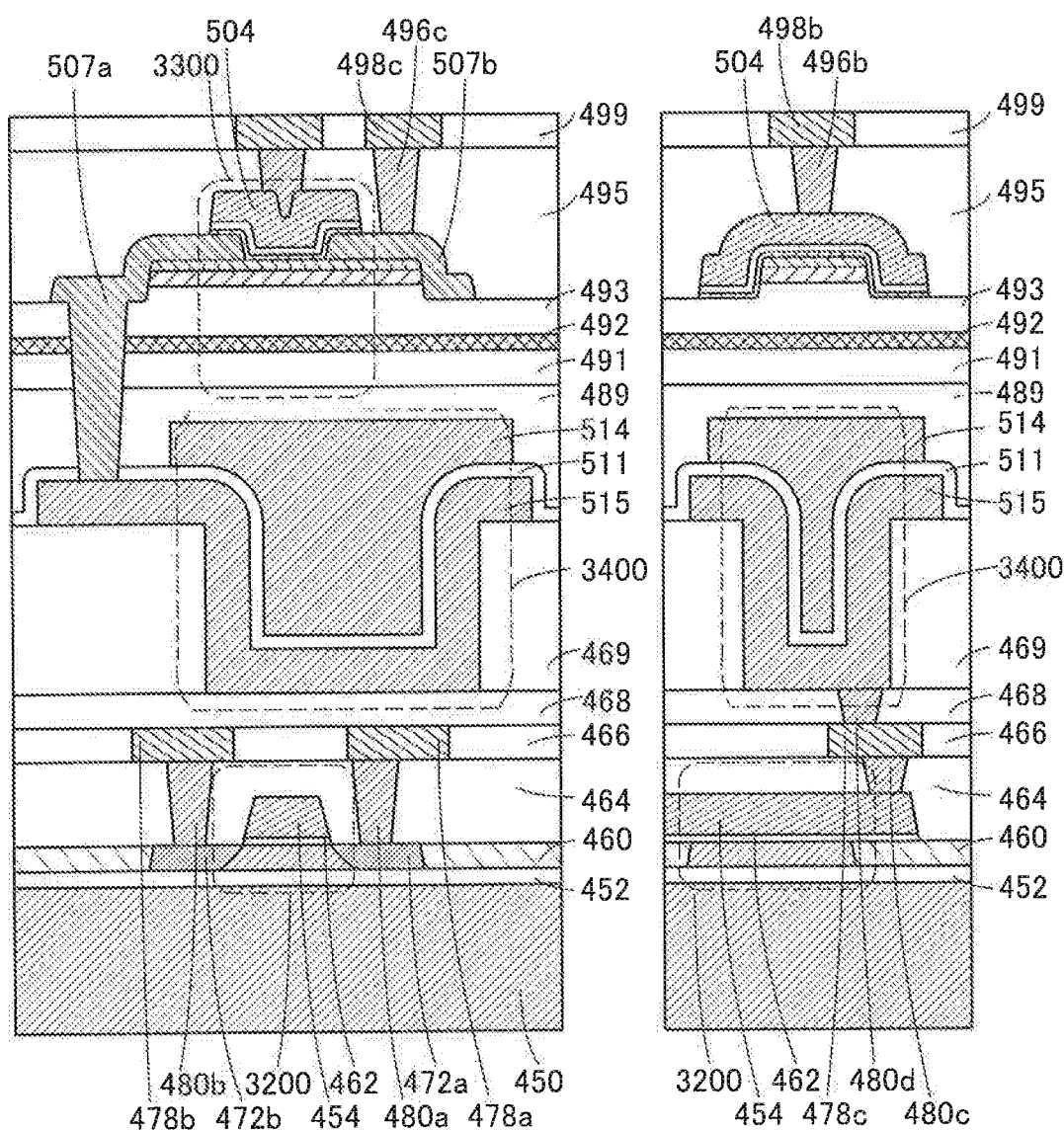
FIG. 28 is a cross-sectional view illustrating a semiconductor device of one embodiment of the present invention.

A semiconductor device in FIG. 28 is the same as the semiconductor device in FIG. 26 except for the structure of the transistor 3200. Therefore, the description of the semiconductor device in FIG. 26 is referred to for the semiconductor device in FIG. 28. Specifically, in the semiconductor device in FIG. 28, the transistor 3200 is provided in the semiconductor substrate 450 which is an SOI substrate. For the transistor 3200, which is provided in the semiconductor substrate 450 (SOI substrate), the description of the transistor 2200 in FIG. 24 is referred to. Note that although the transistor 2200 is illustrated as a p-channel transistor in FIG. 24, the transistor 3200 may be an n-channel transistor.

<Memory Device 2>

The semiconductor device in FIG. 25B is different from the semiconductor device in FIG. 25A in that the transistor 3200 is not provided. Also in this case, data can be written and retained in a manner similar to that of the semiconductor device in FIG. 25A.

Reading of data in the semiconductor device in FIG. 25B is described. When the transistor 3300 is brought into an on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(CB \times VB0+CV)/(CB+C)$, where V is the potential of the one electrode of the capacitor 3400, C is the capacitance of the capacitor 3400, CB is the capacitance component of the third wiring 3003, and VB0 is the potential of the third wiring 3003 before the charge redistribution. Thus, it can be found that, assuming that the memory cell is in either of two states in which the potential of the one electrode of the capacitor 3400 is V1 and V0 (V1>V0), the potential of the third wiring 3003 in the case of retaining the potential V1 $(=(CB \times VB0+CV1)/(CB+C))$ is higher than the potential of the third wiring 3003 in the case of retaining the potential V0 $(=(CB \times VB0+CV0)/(CB+C))$.

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, a high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 25A is described with reference to a circuit diagram in FIG. 29.

Figure 29:
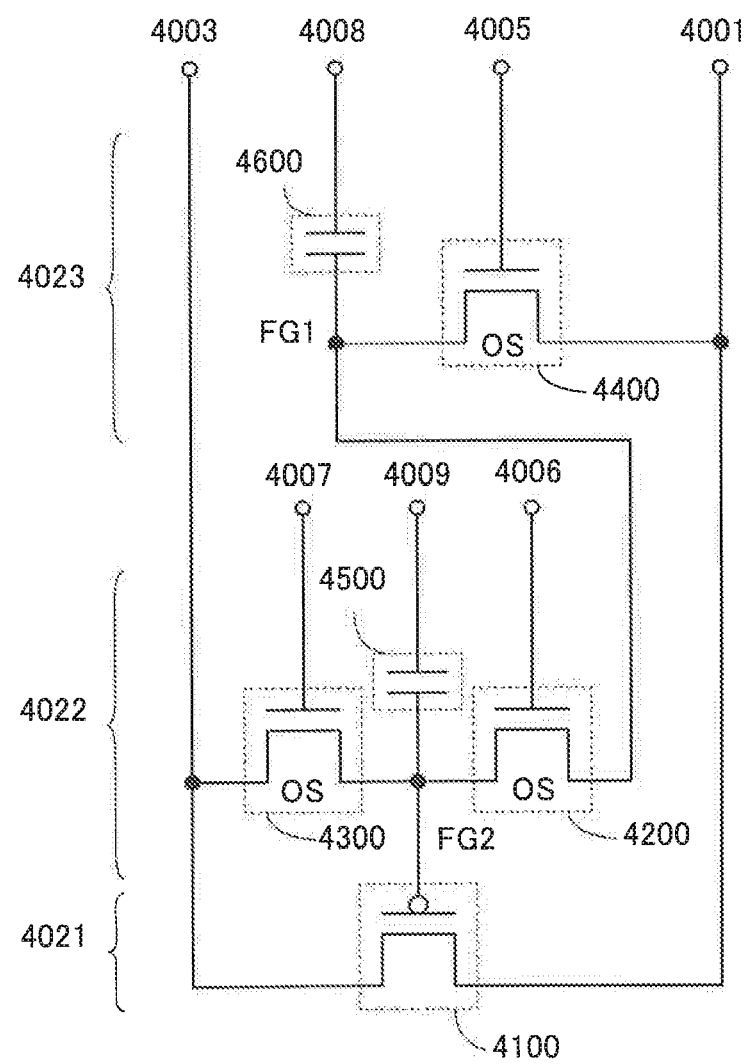
FIG. 29 is a circuit diagram illustrating one embodiment of a semiconductor device.

The semiconductor device illustrated in FIG. 29 includes a transistor 4100, a transistor 4200, a transistor 4300, a transistor 4400, a capacitor 4500, and a capacitor 4600. Here, a transistor similar to the transistor 3200 can be used as the transistor 4100, and transistors similar to the transistor 3300 can be used as the transistors 4200, 4300, and 4400. Although not illustrated in FIG. 29, a plurality of semiconductor devices in FIG. 29 is provided in a matrix. The semiconductor device in FIG. 29 can control writing and reading of a data voltage in accordance with a signal or a potential supplied to a wiring 4001, a wiring 4003, a wiring 4005, a wiring 4006, a wiring 4007, a wiring 4008, and a wiring 4009.

One of a source and a drain of the transistor 4100 is connected to the wiring 4003. The other of the source and the drain of the transistor 4100 is connected to the wiring 4001. Although the transistor 4100 is a p-channel transistor in FIG. 29, the transistor 4100 may be an n-channel transistor.

The semiconductor device in FIG. 29 includes two data retention portions. For example, a first data retention portion retains charge between one of a source and a drain of the transistor 4400, one electrode of the capacitor 4600, and one of a source and a drain of the transistor 4200 which are connected to a node FG1. A second data retention portion retains charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining charge. Note that, as each of the transistors 4200, 4300, and 4400, it is preferable to use a transistor having a low current that flows between a source and a drain in an off state (a low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 29, the transistors 4200, 4300, and 4400 may be p-channel transistors.

The transistors 4200 and 4300 are preferably provided in a layer different from the layer where the transistor 4400 is provided even when the transistors 4200, 4300, and 4400 are transistors including oxide semiconductors. In other words, the semiconductor device in FIG. 29 preferably includes, as illustrated in FIG. 29, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 29 is described.

First, operation of writing a data voltage to the data retention portion connected to the node FG1 (hereinafter referred to as writing operation 1) is described. In the following description, the data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 becomes the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, $V_{D1}$ supplied to the wiring 4003 is supplied to the wiring 4001, so that the potentials of the nodes FG1 and FG2 are increased. When the potential of the node FG2 becomes "$V_{D1}-V_{th}$" with the increase in potentials, $V_{gs}$ of the transistor 4100 becomes $V_{th}$, so that the current flow is stopped.

Next, operation of writing the data voltage to the data retention portion connected to the node FG2 (hereinafter referred to as writing operation 2) is described. In the following description, the data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at a low level. The transistor 4300 is turned on, so that the wiring 4003 is set at a low level. Consequently, the potential of the node FG2 is decreased to a low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and V, of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes V, so that the current flow is stopped. At this time, the transistors 4200 and 4400 are off and the potential of the node FG1 remains at "$V_{D1}-V_{th}$" written in the writing operation 1.

In the semiconductor device in FIG. 29, after data voltages are written to the plurality of data retention portions, the wiring 4009 is set at a high level, so that the potentials of the nodes FG1 and FG2 are increased. Then, the transistors are turned off to stop movement of charge; thus, the written data voltages are retained.

By the above-described writing operation of the data voltage to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multilevel data. Therefore, in the case where the data retention portions each retain 4-bit data, 16-value "$V_{D1}-V_{th}$" and 16-value "$V_{D2}-V_{th}$" can be obtained.

Next, operation of reading data from the semiconductor device illustrated in FIG. 29 is described.

First, operation of reading the data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set at a low level. When the wiring 4009 is set at a low level, the potential of the node FG2 which is in an electrically floating state is set at "$V_{D2}-V_{th}$". The potential of the node FG2 is decreased, so that a current flows through the transistor 4100. By the current flow, the potential of the wiring 4003 which is in an electrically floating state is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is higher than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from a high level to a low level, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the charge retained in the node FG1 is distributed between the node FG1 and the node FG2, the data voltage in the data retention portion connected to the node FG1 is transferred to the data retention portion connected to the node FG2. The wirings 4001 and 4003 are set at a low level. The wiring 4006 is set at a high level. The wiring 4005 and 4007 to 4009 are set at a low level. When the transistor 4200 is turned on, the charge in the node FG1 is distributed between the node FG1 and the node FG2.

Here, the potential after the charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the charge distribution can be suppressed. The change in potential due to the charge distribution is described later.

Next, operation of reading the data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set at a low level. The wiring 4009 is set at a high level at the time of precharge and then, set at a low level. When the wiring 4009 is set at a low level, the potential of the node FG2 which is in an electrically floating state is set at "$V_{D1}-V_{th}$". The potential of the node FG2 is decreased, so that a current flows through the transistor 4100. The current flows, so that the potential of the wiring 4003 which is in an electrically floating state is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from a high level to a low level, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 29, the storage capacity can be increased by adding layers without increasing the area of the semiconductor device.

The read potential can be read as a voltage higher than the written data voltage by $V_{th}$. Therefore, $V_{th}$ of "$V_{D1}-V_{th}$" and $V_{th}$ of "$V_{D2}-V_{th}$" written in the writing operation can be canceled to be read. As a result, the memory capacity per memory cell can be improved and read data can be close to accurate data; thus, the data reliability becomes excellent.

Figure 30:
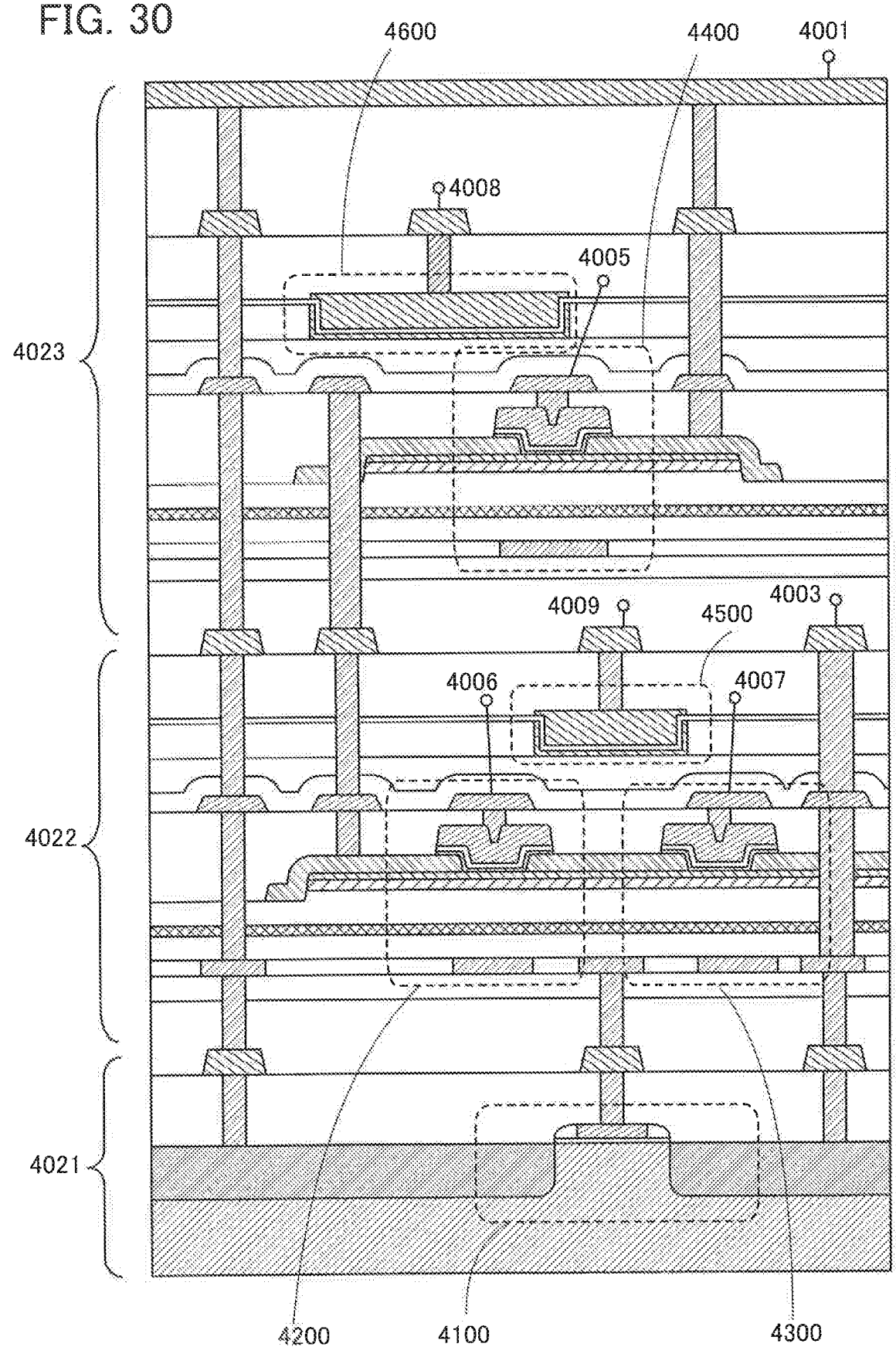
FIG. 30 is a cross-sectional view illustrating a semiconductor device of one embodiment of the present invention.

FIG. 30 is a cross-sectional view of a semiconductor device that corresponds to FIG. 29. The semiconductor device illustrated in FIG. 30 includes the transistors 4100, 4200, 4300, and 4400 and the capacitors 4500 and 4600. Here, the transistor 4100 is formed in the first layer 4021, the transistors 4200 and 4300 and the capacitor 4500 are formed in the second layer 4022, and the transistor 4400 and the capacitor 4600 are formed in the third layer 4023.

Here, the description of the transistor 3300 can be referred to for the transistors 4200, 4300, and 4400, and the description of the transistor 3200 can be referred to for the transistor 4100. The description made with reference to FIG. 26 can be appropriately referred to for other wirings, other insulators, and the like.

Note that the capacitors 4500 and 4600 are formed by including the conductive layers each having a trench-like shape, while the conductive layer of the capacitor 3400 in the semiconductor device in FIG. 26 is parallel to the substrate. With this structure, a larger capacity can be obtained without increasing the occupation area.

<FPGA>

One embodiment of the present invention can also be applied to an LSI such as a field programmable gate array (FPGA).

Figure 31A:
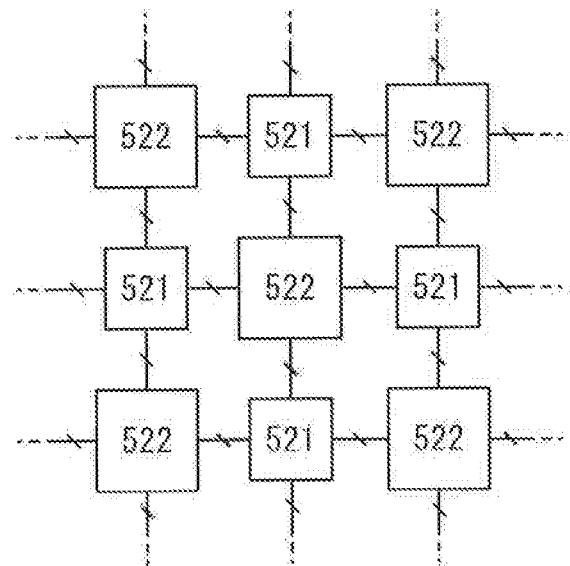
FIGS. 31A to 31E are circuit diagrams illustrating a semiconductor device of one embodiment of the present invention.

FIG. 31A illustrates an example of a block diagram of an FPGA. The FPGA includes a routing switch element 521 and a logic element 522. The logic element 522 can switch functions of a logic circuit, such as a combination circuit or a sequential circuit, in accordance with configuration data stored in a configuration memory.

Figure 31B:
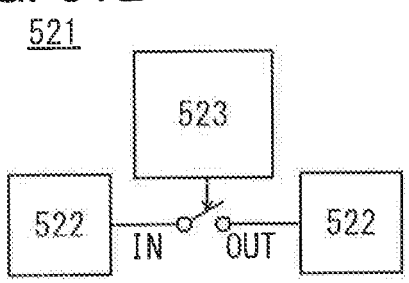

FIG. 31B is a schematic view illustrating a function of the routing switch element 521. The routing switch element 521 can switch a connection between the logic elements 522 in accordance with configuration data stored in a configuration memory 523. Note that although FIG. 31B illustrates one switch which switches a connection between a terminal IN and a terminal OUT, in an actual FPGA, a plurality of switches is provided between a plurality of the logic elements 522.

Figure 31C:
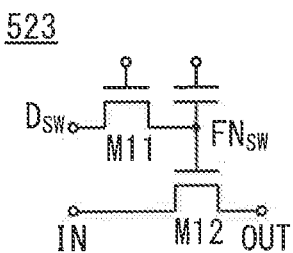

FIG. 31C illustrates a configuration example of a circuit serving as the configuration memory 523. The configuration memory 523 includes a transistor M11 which is an OS transistor and a transistor M12 which is a Si transistor. Configuration data $D_{SW}$ is supplied to a node $FN_{SW}$ through the transistor M11. A potential of the configuration data $D_{SW}$ can be retained by turning off the transistor M11. The on and off states of the transistor M12 can be switched depending on the potential of the retained configuration data $D_{SW}$, so that the connection between the terminal IN and the terminal OUT can be switched.

Figure 31D:
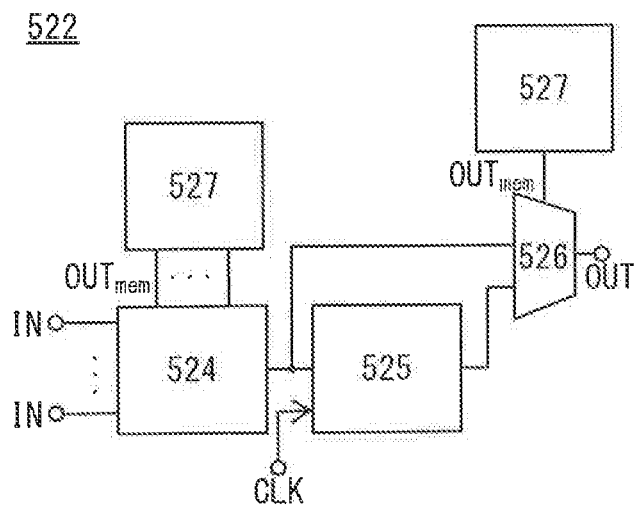

FIG. 31D is a schematic view illustrating a function of the logic element 522. The logic element 522 can switch a potential of a terminal $OUT_{mem}$ in accordance with configuration data stored in a configuration memory 527. A lookup table 524 can switch functions of a combination circuit that processes a signal of the terminal IN in accordance with the potential of the terminal $OUT_{mem}$. The logic element 522 includes a register 525 which is a sequential circuit and a selector 526 which switches signals of the terminal OUT. The selector 526 can select to output a signal of the lookup table 524 or to output a signal of the register 525 in accordance with the potential of the terminal $OUT_{mem}$, which is output from the configuration memory 527.

Figure 31E:
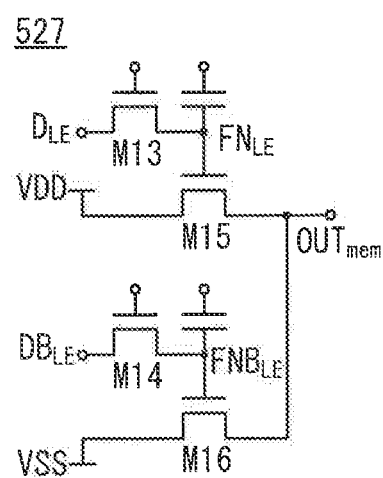

FIG. 31E illustrates a configuration example of a circuit serving as the configuration memory 527. The configuration memory 527 includes a transistor M13 and a transistor M14 which are OS transistors, and a transistor M15 and a transistor M16 which are Si transistors. Configuration data $D_{LE}$ is supplied to a node $FN_{LE}$ through the transistor M13. Configuration data $DB_{LE}$ is supplied to a node $FNB_{LE}$ through the transistor M14. The configuration data $DB_{LE}$ corresponds to a potential of the configuration data $D_{LE}$ whose logic is inverted. The potential of the configuration data $D_{LE}$ and the potential of the configuration data $DB_{LE}$ can be retained by turning off the transistor M13 and the transistor M14, respectively. The on and off states of one of the transistors M15 and M16 are switched in accordance with the retained potential of the configuration data $D_{LE}$ or the configuration data $DB_{LE}$, so that a potential VDD or a potential VSS can be supplied to the terminal $OUT_{mem}$.

For the configuration illustrated in FIGS. 31A to 31E, any of the structures described in the above embodiments can be used. For example, Si transistors are used as the transistors M12, M15, and M16, and OS transistors are used as the transistors M11, M13, and M14. In this case, a wiring for connecting the Si transistors provided in a lower layer can be formed with a low-resistance conductive material. Therefore, a circuit with high access speed and low power consumption can be obtained.

The structures described in this embodiment can be used in appropriate combination with any of the structures described in the other embodiments and examples as appropriate.

Embodiment 9

In this embodiment, an example of an imaging device including transistors of one embodiment of the present invention and the like is described.

<Configuration of Imaging Device>

Figure 32A:
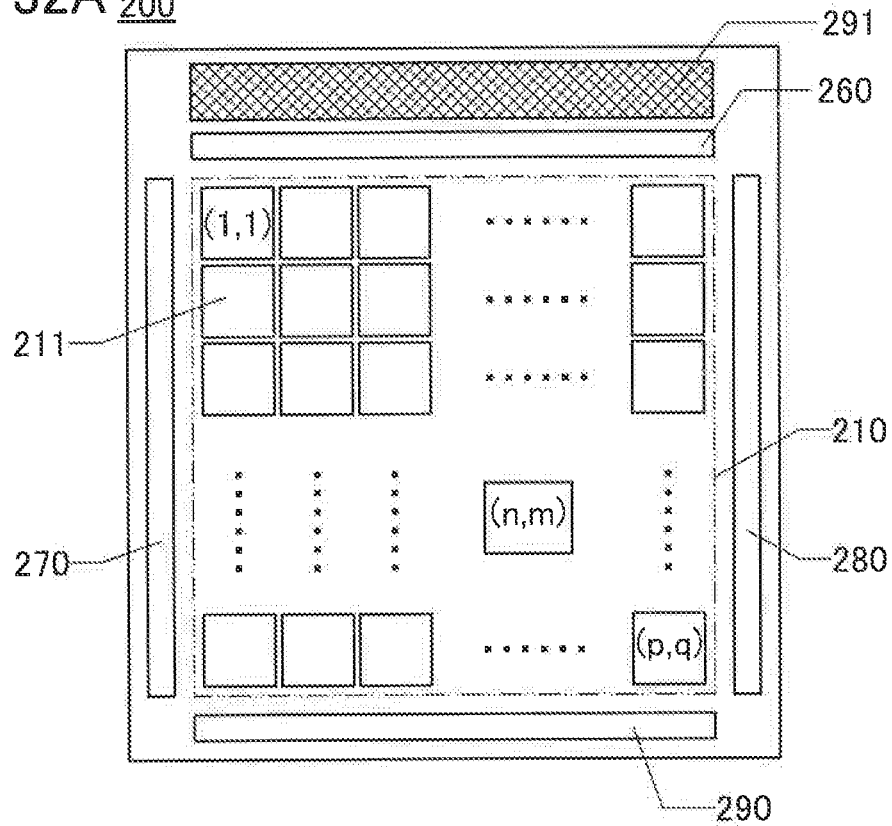
FIGS. 32A and 32B are top views each illustrating a semiconductor device of one embodiment of the present invention.

FIG. 32A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211 and each have a function of supplying a signal for driving the plurality of pixels 211. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit Note that as the peripheral circuit, one or more of the peripheral circuits 260, 270, 280, and 290 may be omitted.

Figure 32B:
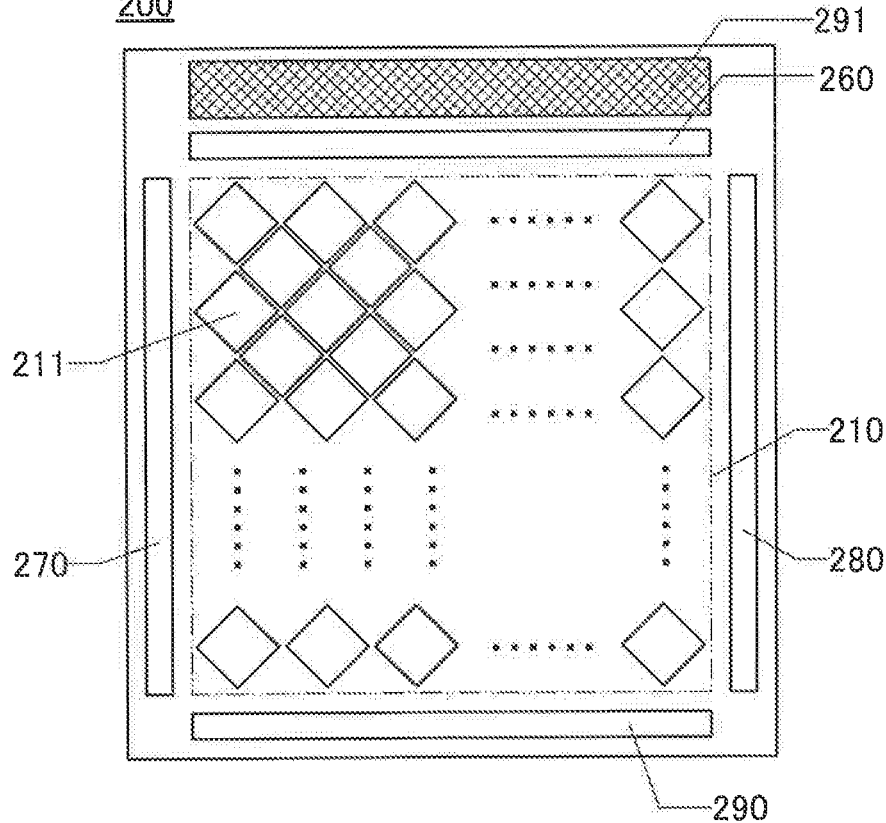

As illustrated in FIG. 32B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter (color filter) which transmits light in a specific wavelength range, whereby data for achieving color image display can be obtained.

Figure 33A:
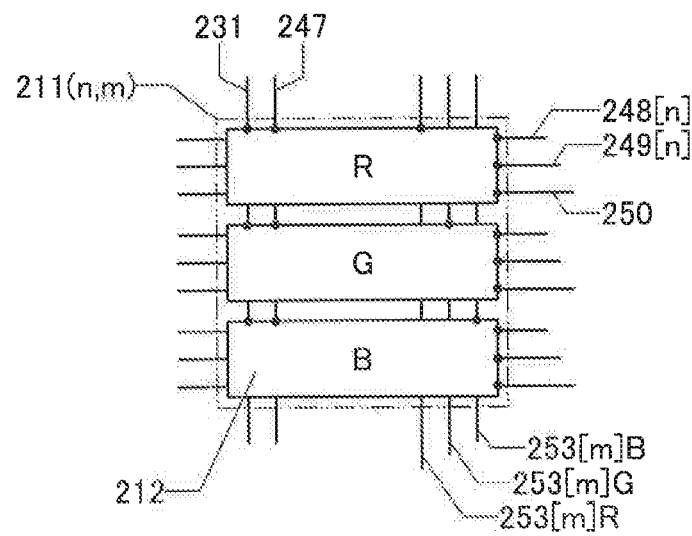
FIGS. 33A and 33B are block diagrams illustrating a semiconductor device of one embodiment of the present invention.

FIG. 33A is a plan view showing an example of the pixel 211 with which a color image is obtained. The pixel 211 illustrated in FIG. 33A includes a subpixel 212 provided with a color filter that transmits light in the red (R) wavelength range (also referred to as a subpixel 212R), a subpixel 212 provided with a color filter that transmits light in the green (G) wavelength range (also referred to as a subpixel 212G), and a subpixel 212 provided with a color filter that transmits light in the blue (B) wavelength range (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 33A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B, respectively. The subpixels 212 are electrically connected to the peripheral circuits through the above wirings.

Figure 33B:
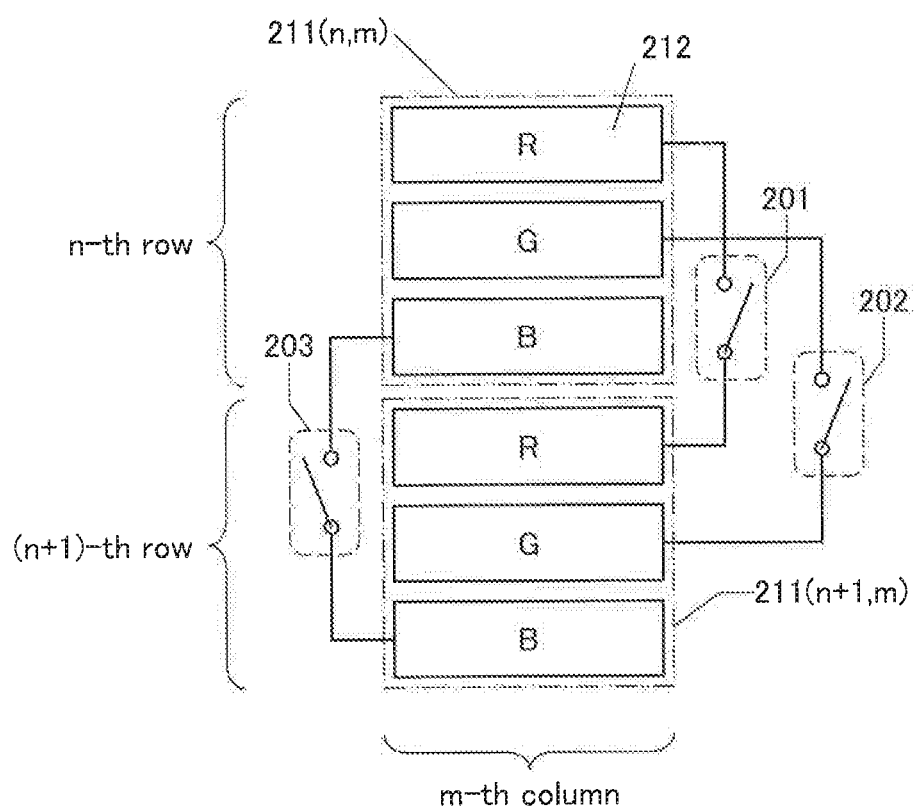

In the imaging device 200, the subpixel 212 is electrically connected to the subpixel 212 in an adjacent pixel 211 which is provided with a color filter transmitting light in the same wavelength range as the subpixel 212, via a switch. FIG. 33B shows a connection example of the subpixels 212: the subpixel 212 in the pixel 211 arranged in the n-th row (n is an integer greater than or equal to 1 and less than or equal top) and the m-th column (m is an integer greater than or equal to 1 and less than or equal to q) and the subpixel 212 in the adjacent pixel 211 arranged in an (n+1)-th row and the m-th column. In FIG. 33B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filters used in the subpixels 212 are not limited to red (R), green (G), and blue (B) color filters, and color filters that transmit light of cyan (C), yellow (Y), and magenta (M) may be used. By provision of the subpixels 212 which sense light in three different wavelength ranges in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength ranges are provided in one pixel 211, the reproducibility of colors of an obtained image can be increased.

For example, in FIG. 33A, in regard to the subpixel 212 sensing light in the red wavelength range, the subpixel 212 sensing light in the green wavelength range, and the subpixel 212 sensing light in the blue wavelength range, the pixel number ratio (or light receiving area ratio) thereof is not necessarily 1:1:1. For example, the Bayer arrangement in which the pixel number ratio (light receiving area ratio) of red and green to blue is 1:2:1 may be employed. Alternatively, the pixel number ratio (light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength range are provided, the redundancy is increased, and the reliability of the imaging device 200 can be increased.

When an infrared (IR) filter that transmits infrared light and absorbs or reflects visible light is used, the imaging device 200 which senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filters, the pixel 211 may be provided with a lens. Arrangement examples of the pixel 211, a filter 254, and a lens 255 are described with cross-sectional views in FIGS. 34A and 34B. With the lens 255, the photoelectric conversion element can receive incident light efficiently. Specifically, as illustrated in FIG. 34A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with the dashed-dotted line, however, part of the light 256 indicated by the arrows might be blocked by some wirings 257. Thus, a preferable structure is such that the lens 255 and the filter 254 are provided on the photoelectric conversion element 220 side as illustrated in FIG. 34B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 34A:
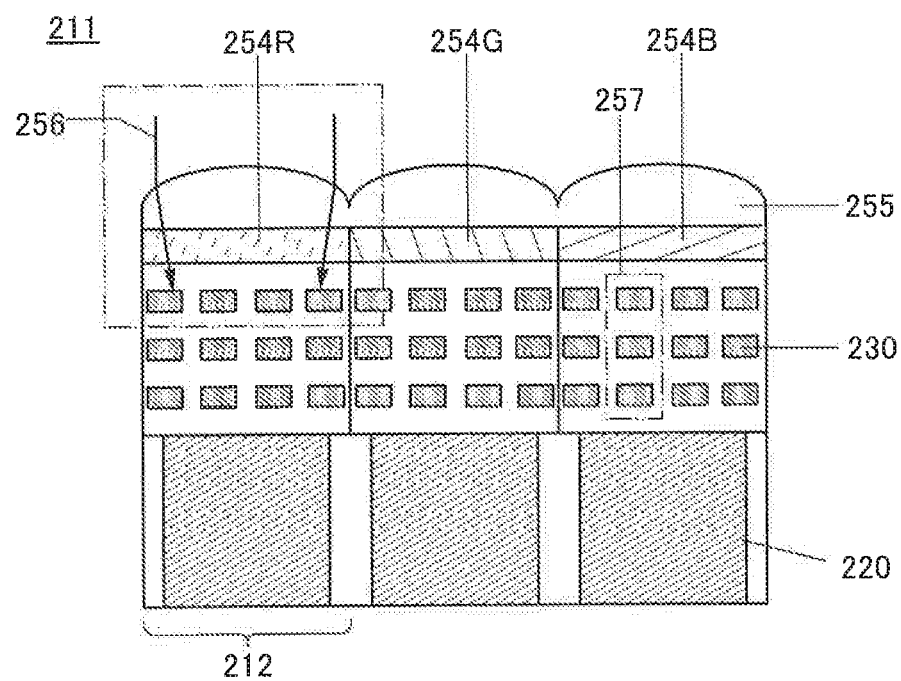
FIGS. 34A and 34B are cross-sectional views each illustrating a semiconductor device of one embodiment of the present invention.
Figure 34B:
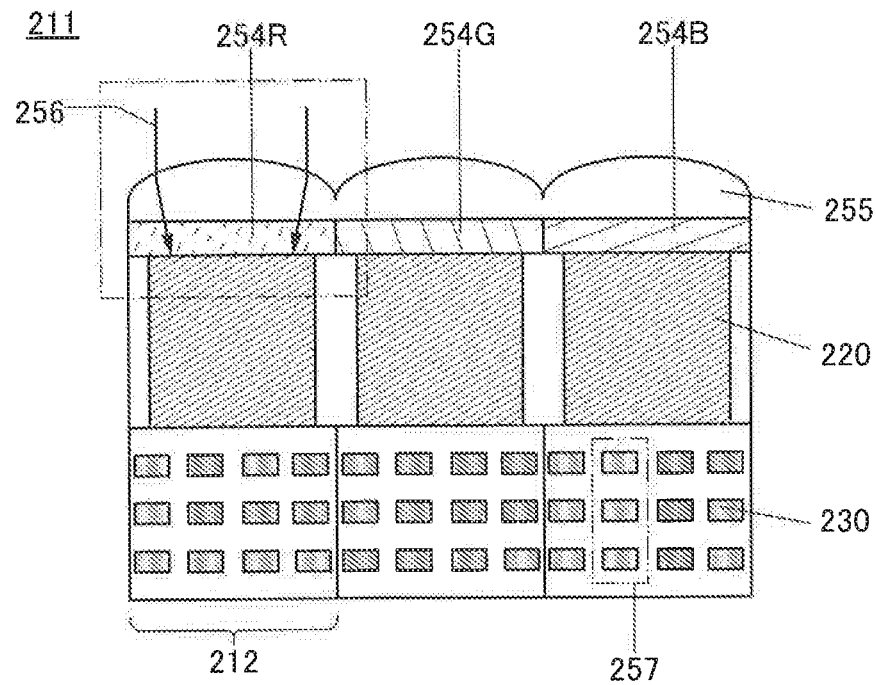

As the photoelectric conversion element 220 illustrated in FIGS. 34A and 34B, a photoelectric conversion element in which a p-n junction or a p-i-n junction is formed may be used.

The photoelectric conversion element 220 may be formed using a substance that has a function of absorbing a radiation and generating charges. Examples of the substance that has a function of absorbing a radiation and generating charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient over a wide wavelength range including X-rays and gamma rays in addition to visible light, ultraviolet light, and infrared rays, for example.

One pixel 211 included in the imaging device 200 may include the subpixel 212 with a first filter in addition to the subpixel 212 illustrated in FIGS. 33A and 33B.

<Configuration Example 2 of Pixel>

An example of a pixel including a transistor using silicon and a transistor using an oxide semiconductor is described below.

Figure 35A:
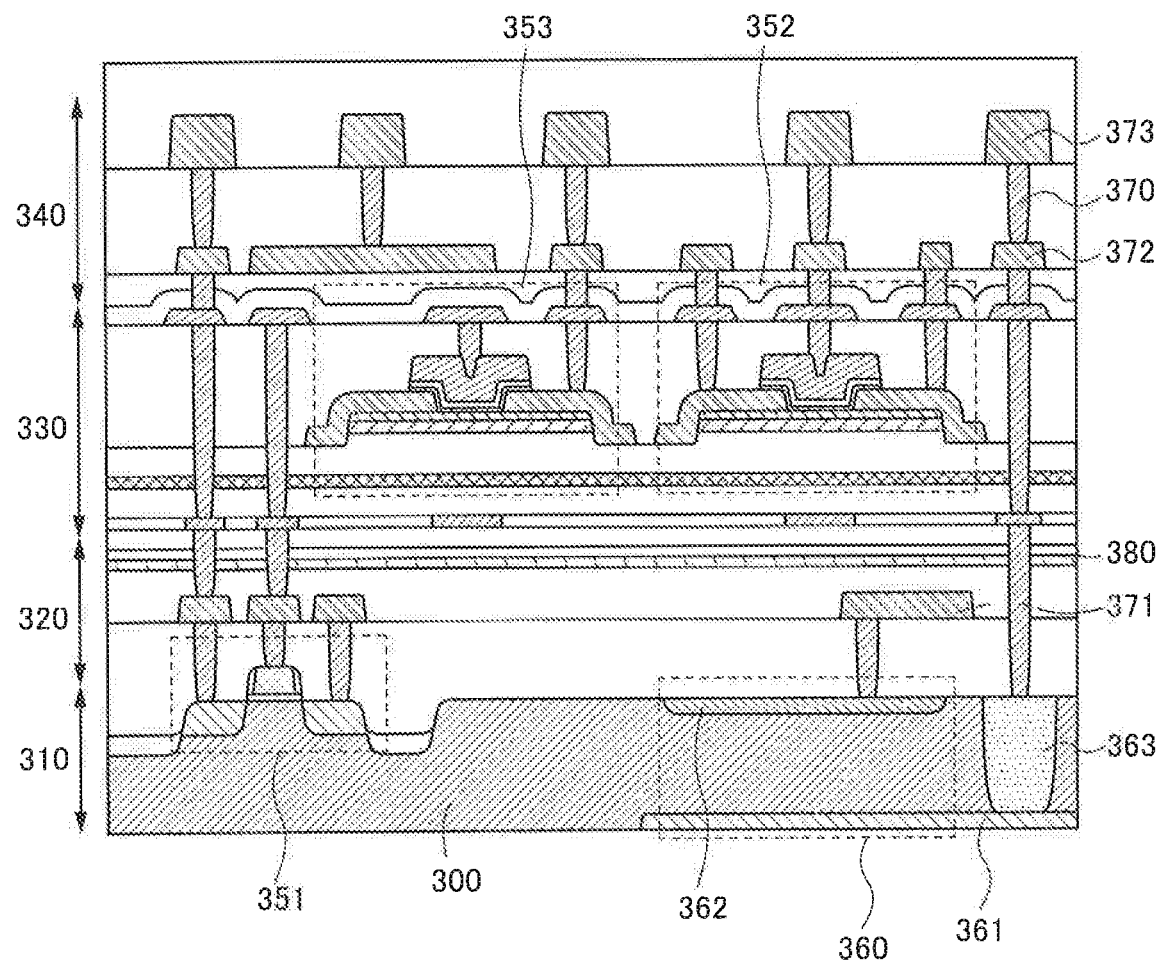
FIGS. 35A and 35B are cross-sectional views each illustrating a semiconductor device of one embodiment of the present invention.
Figure 35B:
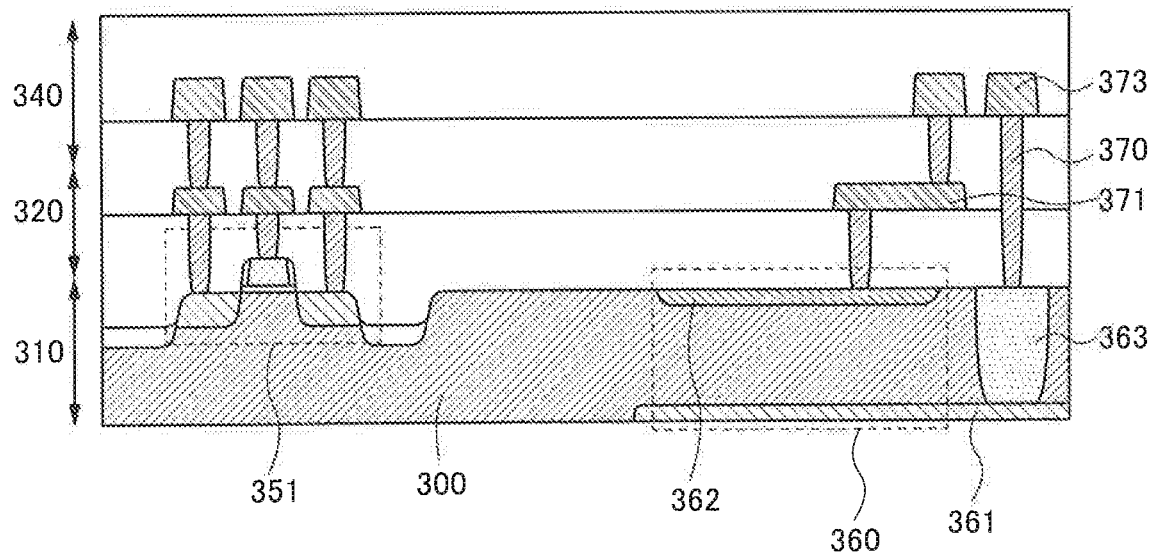

FIGS. 35A and 35B are each a cross-sectional view of an element included in an imaging device. The imaging device illustrated in FIG. 35A includes a transistor 351 including silicon on a silicon substrate 300, transistors 352 and 353 which include an oxide semiconductor and are stacked over the transistor 351, and a photodiode 360 provided in the silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of the cross-sectional view in FIG. 35A, a light-receiving surface of the photodiode 360 is provided on the side opposite to a surface of the silicon substrate 300 where the transistor 351 is formed. This structure can ensure a light path without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of only transistors using silicon, the layer 330 can be omitted. An example of a cross-sectional view in which the layer 330 is not provided is shown in FIG. 35B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor and thus may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When hydrogen is confined below the insulator 380, the reliability of the transistor 351 can be improved. In addition, hydrogen diffusion from under to over the insulator 380 can be prevented; thus, the reliability of the transistor 352, the transistor 353, and the like can be increased.

As the insulator 380, an insulator having a function of blocking oxygen or hydrogen is used, for example.

In the cross-sectional view in FIG. 35A, the photodiode 360 in the layer 310 and the transistor in the layer 330 can be formed so as to overlap with each other. Thus, the degree of integration of pixels can be increased. In other words, the resolution of the imaging device can be increased.

As illustrated in FIGS. 36A1 and 36B1, part or the whole of the imaging device can be bent. FIG. 36A1 illustrates a state in which the imaging device is bent in the direction of the dashed-dotted line X1-X2. FIG. 36A2 is a cross-sectional view illustrating a portion indicated by the dashed-dotted line X1-X2 in FIG. 36A1. FIG. 36A3 is a cross-sectional view illustrating a portion indicated by the dashed-dotted line Y1-Y2 in FIG. 36A1.

FIG. 36B1 illustrates a state where the imaging device is bent in the direction of the dashed-dotted line X3-X4 and the direction of the dashed-dotted line Y3-Y4. FIG. 36B2 is a cross-sectional view illustrating a portion indicated by the dashed-dotted line X3-X4 in FIG. 36B1. FIG. 36B3 is a cross-sectional view illustrating a portion indicated by the dashed-dotted line Y3-Y4 in FIG. 36B1.

The bent imaging device enables the curvature of field and astigmatism to be reduced. Thus, the optical design of a lens and the like, which is used in combination of the imaging device, can be facilitated. For example, the number of lenses used for aberration correction can be reduced; accordingly, a reduction in the size or weight of electronic devices using the imaging device, and the like, can be achieved. In addition, the quality of a captured image can be improved.

The structures described in this embodiment can be used in appropriate combination with any of the structures described in the other embodiments and examples as appropriate.

Embodiment 10

In this embodiment, examples of CPUs including a semiconductor device such as the transistors of one embodiment of the present invention or the above-described memory device are described.

<Configuration of CPU>

Figure 37:
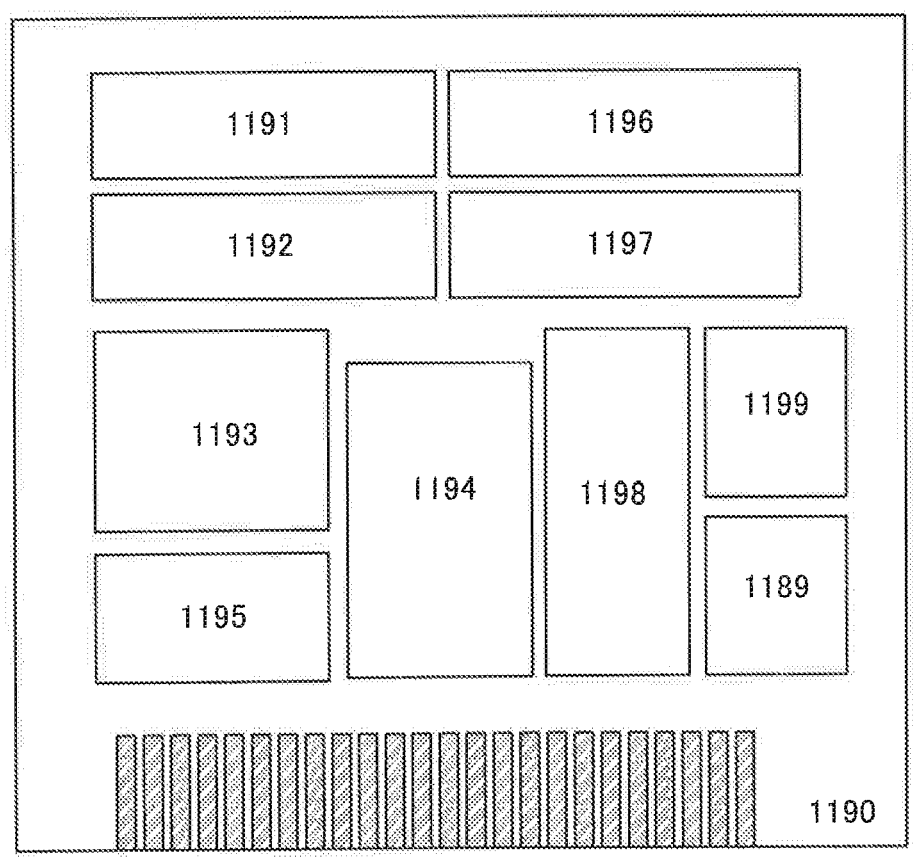
FIG. 37 is a block diagram illustrating a semiconductor device of one embodiment of the present invention.

FIG. 37 is a block diagram illustrating a configuration example of a CPU including any of the above-described transistors as a component.

The CPU illustrated in FIG. 37 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189.

A semiconductor substrate, an SOI substrate, a glass substrate, or the like is used as the substrate 1190. In the semiconductor device that is described in this embodiment and includes a CPU core area and a memory area where a memory device is provided, the memory area can be embedded. In this case, the use of any of the structures described in the above embodiments allows the CPU core area and the embedded memory area to include transistors having different characteristics. Since transistors having different threshold voltages can be easily fabricated over the same substrate without a complicated process, a highly reliable and inexpensive semiconductor device can be provided.

The ROM 1199 and the ROM interface 1189 may be provided over a separate chip. Needless to say, the CPU in FIG. 37 is just an example in which the configuration has been simplified, and an actual CPU may have a variety of configurations depending on the application. For example, the CPU may have the following configuration: a structure including the CPU illustrated in FIG. 37 or an arithmetic circuit is considered as one core; a plurality of such cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 37, a memory cell is provided in the register 1196. For the memory cell of the register 1196, any of the above-described transistors, the above-described memory device, or the like can be used.

In the CPU illustrated in FIG. 37, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 38:
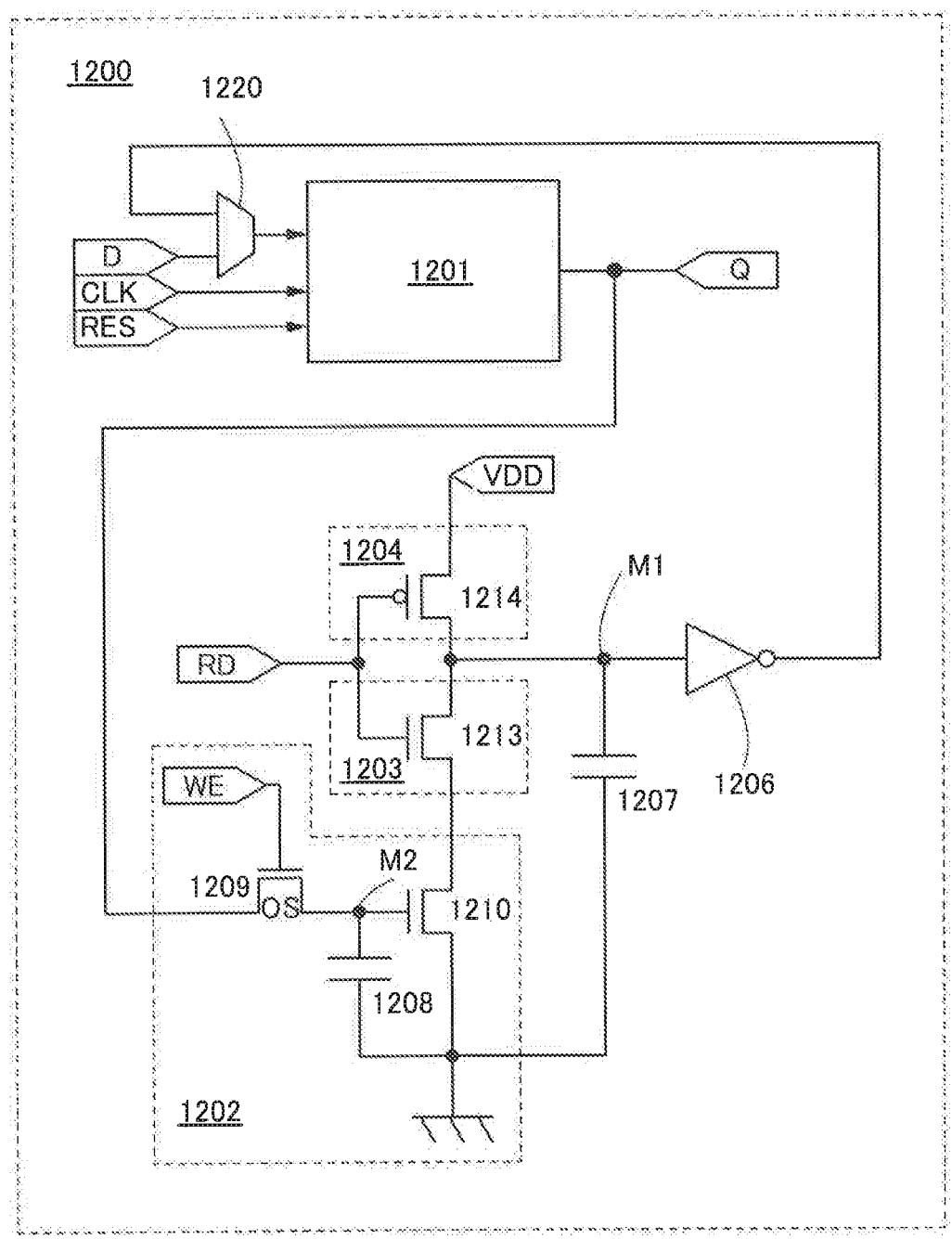
FIG. 38 is a circuit diagram illustrating a semiconductor device of one embodiment of the present invention.

FIG. 38 is an example of a circuit diagram of a memory element 1200 which can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 38 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 38, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 38, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the rest of the transistors.

As the circuit 1201 in FIG. 38, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state (the on state or the off state) of the transistor 1210 is determined in accordance with the signal retained by the capacitor 1208, and the signal can be read from the circuit 1202. Consequently, an original signal can be accurately read even when a potential corresponding to the signal retained by the capacitor 1208 varies to some degree.

By using the above-described memory element 1200 for a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic device including a field programmable gate array (FPGA) and a complex programmable logic device (CPLD) and an RF device.

The structures described in this embodiment can be used in appropriate combination with any of the structures described in the other embodiments and examples as appropriate.

Embodiment 11

In this embodiment, display devices each including transistors of one embodiment of the present invention and the like are described with reference to FIGS. 39A to 39C and FIGS. 40A and 40B.

<Configuration of Display Device>

As a display element provided in a display device, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically includes, in its category, an inorganic electroluminescent (EL) element, an organic EL element, and the like. A display device including an EL element (EL display device) and a display device including a liquid crystal element (liquid crystal display device) are described below as examples of display devices.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the edge of TCP; and a module in which an integrated circuit (IC) is mounted directly on a display element by a COG method.

Figure 39A:
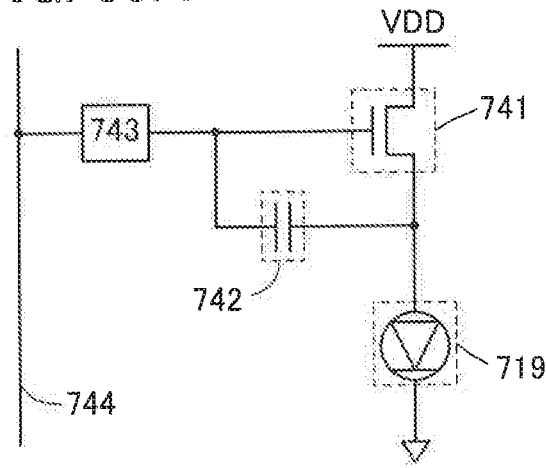
FIGS. 39A to 39C are a circuit diagram, a top view, and a cross-sectional view illustrating a semiconductor device of one embodiment of the present invention.
Figure 39B:
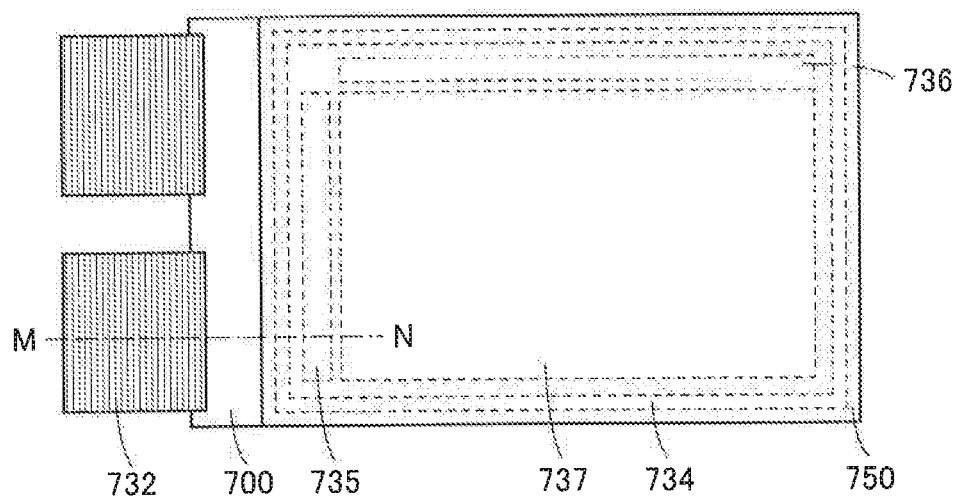
Figure 39C:
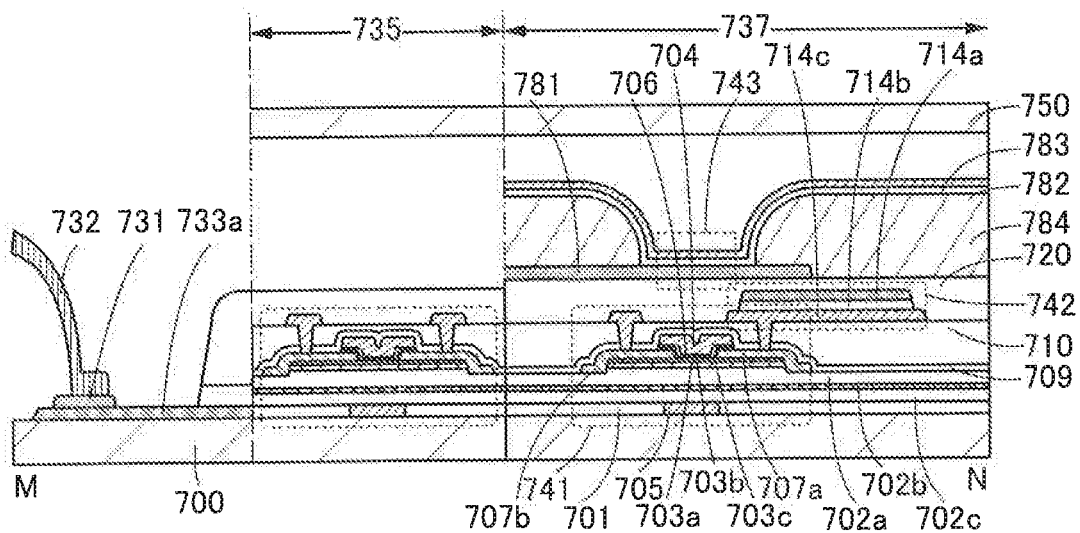

FIGS. 39A to 39C illustrate an example of an EL display device of one embodiment of the present invention. FIG. 39A is a circuit diagram of a pixel in the EL display device. FIG. 39B is a top view showing the whole of the EL display device. FIG. 39C is a cross-sectional view taken along part of the dashed-dotted line M-N in FIG. 39B.

FIG. 39A illustrates an example of a circuit diagram of a pixel used in the EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 39A includes a switching element 743, a transistor 741, a capacitor 742, and a light-emitting element 719.

Note that FIG. 39A and the like each illustrate an example of a circuit structure; therefore, a transistor can be provided additionally. In contrast, for each node in FIG. 39A, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A source of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that the EL display device can be manufactured with high productivity. Note that as the transistor 741 and/or the switching element 743, any of the above-described transistors can be used, for example.

FIG. 39B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 39C is a cross-sectional view of the EL display device taken along part of the dashed-dotted line M-N in FIG. 39B.

FIG. 39C illustrates the transistor 741 which includes a conductor 705 over the substrate 700, an insulator 701 in which the conductor 705 is embedded, an insulator 702c, a fixed charge layer 702b, and an insulator 702a over the insulator 701, semiconductors 703a, 703b, and 703c over the insulator 702a, a conductor 707a and a conductor 707b over the semiconductor 703b, an insulator 706 over the semiconductor 703c, and a conductor 704 over the insulator 706. Note that the structure of the transistor 741 is just an example; the transistor 741 may have a structure different from that illustrated in FIG. 39C.

Thus, in the transistor 741 illustrated in FIG. 39C, the conductors 704 and 705 each function as a gate electrode, the insulators 702c and 706 each function as a gate insulator, and the conductors 707a and 707b function as a source electrode and a drain electrode. Note that in some cases, electrical characteristics of the semiconductor 703 change if light enters the semiconductors 703a, 703b, and 703c. To prevent this, it is preferable that one or more of the conductor 705 and the conductor 704 have a light-blocking property.

FIG. 39C illustrates the capacitor 742 which includes a conductor 714a over an insulator 710, an insulator 714b over the conductor 714a, and a conductor 714c over the insulator 714b.

In the capacitor 742, the conductor 714a functions as one electrode, and the conductor 714c functions as the other electrode.

The capacitor 742 illustrated in FIG. 39C has a large capacitance per area occupied by the capacitor. Therefore, the EL display device illustrated in FIG. 39C has high display quality.

An insulator 720 is provided over the transistor 741 and the capacitor 742. Here, the insulator 716 and the insulator 720 may have an opening reaching the region which functions as the source of the transistor 741. A conductor 781 is provided over the insulator 720. The conductor 781 is electrically connected to the transistor 741 through the opening in the insulator 720.

A partition wall 784 having an opening reaching the conductor 781 is provided over the conductor 781. A light-emitting layer 782 in contact with the conductor 781 through the opening provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 743.

So far, examples of the EL display device are described. Next, an example of a liquid crystal display device is described.

Figure 40A:
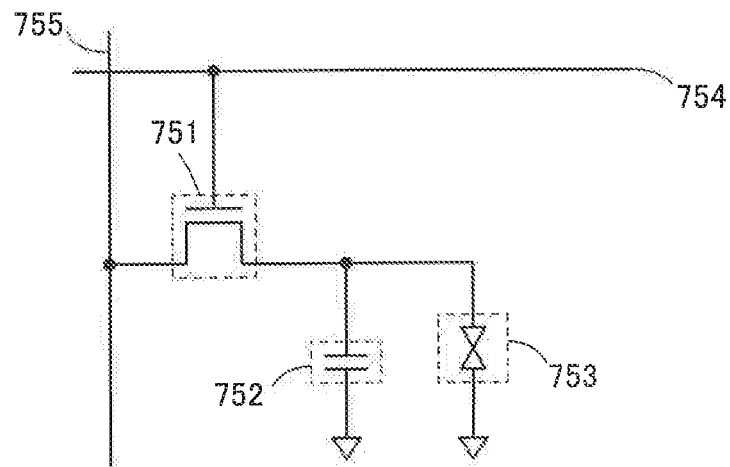
FIGS. 40A and 40B are a circuit diagram and a cross-sectional view illustrating a semiconductor device of one embodiment of the present invention.

FIG. 40A is a circuit diagram illustrating a configuration example of a pixel of a liquid crystal display device. A pixel shown in FIGS. 40A and 40B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 40B:
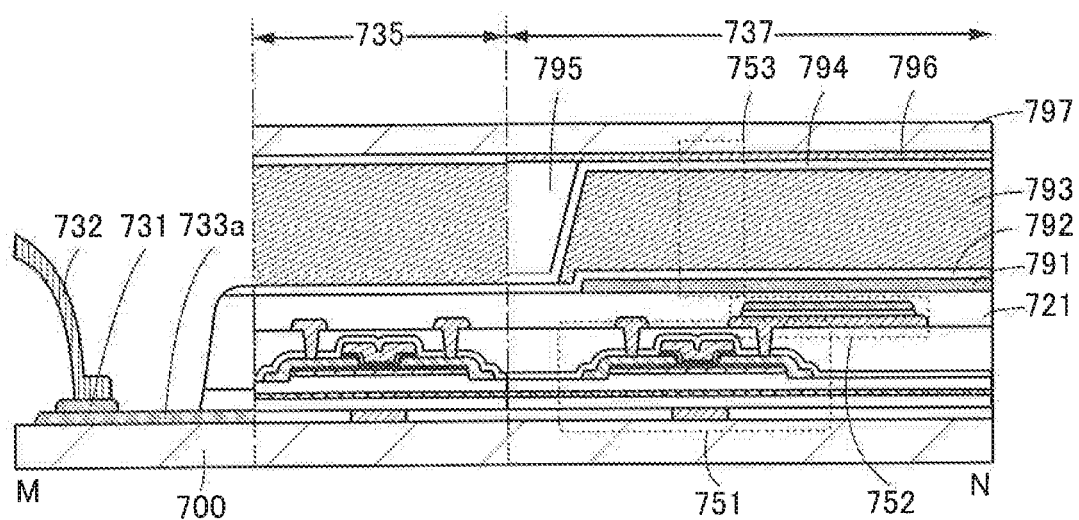

Note that the description of the liquid crystal display device is made on the assumption that the top view of the liquid crystal display device is similar to that of the EL display device. FIG. 40B is a cross-sectional view of the liquid crystal display device taken along the dashed-dotted line M-N in FIG. 39B. In FIG. 40B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 40B corresponds to, but is not limited to, the structure of the capacitor 742 in FIG. 39C.

Note that in the case where an oxide semiconductor is used as the semiconductor of the transistor 751, the off-state current of the transistor 751 can be extremely low. Therefore, charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 functioning as an alignment film is provided over the conductor 791. A liquid crystal layer 793 is provided over the insulator 792. An insulator 794 functioning as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferroelectric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers is stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structures described in this embodiment can be used in appropriate combination with any of the structures described in the other embodiments and examples as appropriate.

Embodiment 12

In this embodiment, electronic devices each including transistors of one embodiment of the present invention and the like are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 41A to 41F illustrate specific examples of these electronic devices.

Figure 41A:
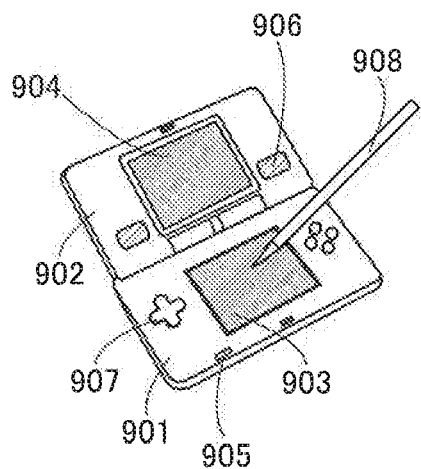
FIGS. 41A to 41F are perspective views each illustrating an electronic device of one embodiment of the present invention.

FIG. 41A illustrates a portable game console including a housing 901, a housing 902, a display portion 903, a display portion 904, a microphone 905, a speaker 906, an operation key 907, a stylus 908, and the like. Although the portable game console in FIG. 41A has the two display portions 903 and 904, the number of display portions included in a portable game console is not limited to this.

Figure 41B:
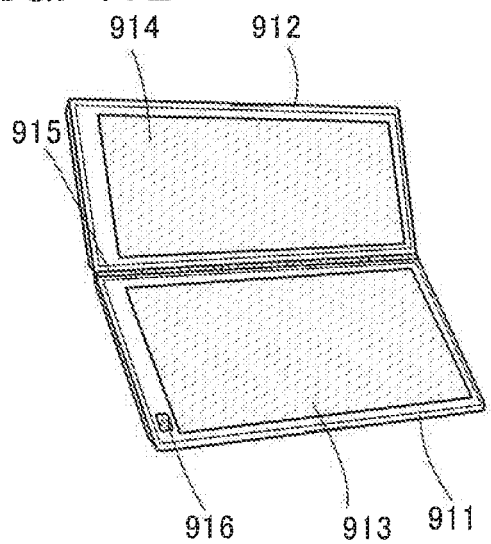

FIG. 41B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 41C:
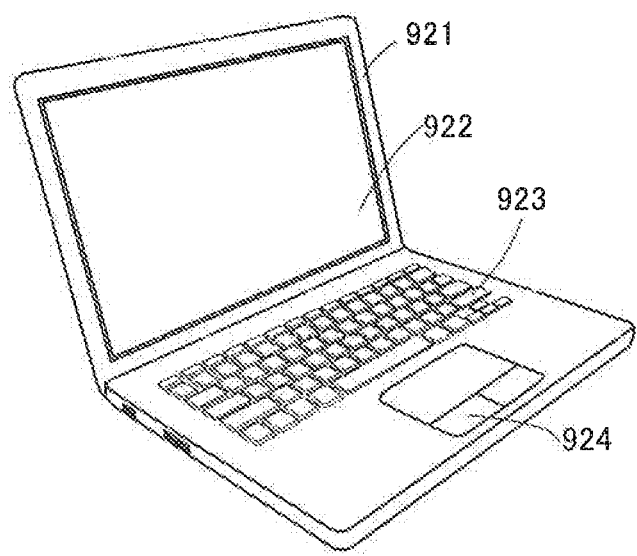

FIG. 41C illustrates a notebook personal computer, which includes a housing 921, a display portion 922, a keyboard 923, a pointing device 924, and the like.

Figure 41D:
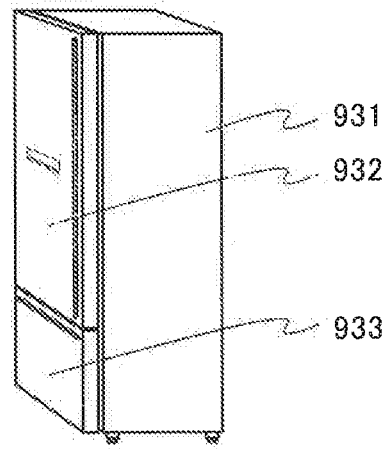

FIG. 41D illustrates an electric refrigerator-freezer, which includes a housing 931, a door for a refrigerator 932, a door for a freezer 933, and the like.

Figure 41E:
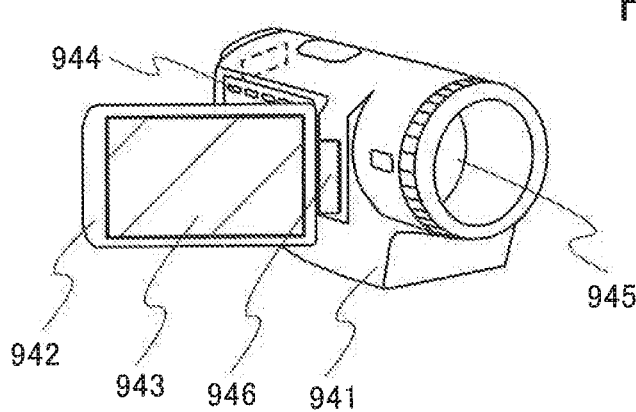

FIG. 41E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 41F:
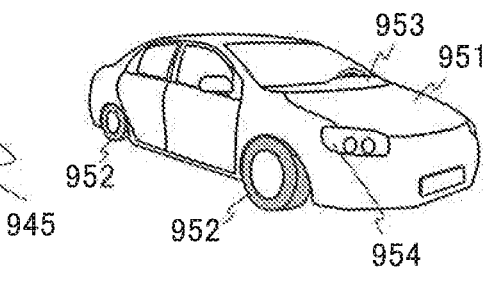

FIG. 41F illustrates a car including a car body 951, wheels 952, a dashboard 953, lights 954, and the like.

The structures described in this embodiment can be used in appropriate combination with any of the structures described in the other embodiments and examples as appropriate.

Example 1

In this example, a plurality of metal-oxide-semiconductor (MOS) elements 600, which differ in the thicknesses of a hafnium oxide film and a silicon oxynitride film, were fabricated in order that, in the stacked-layer structure including a silicon oxynitride film, the hafnium oxide film, and the silicon oxynitride film, the amount of fixed charges produced from the hafnium oxide film was measured. In addition, capacitance-voltage (C-V) measurements of the fabricated MOS elements 600 were performed.

Figure 42A:
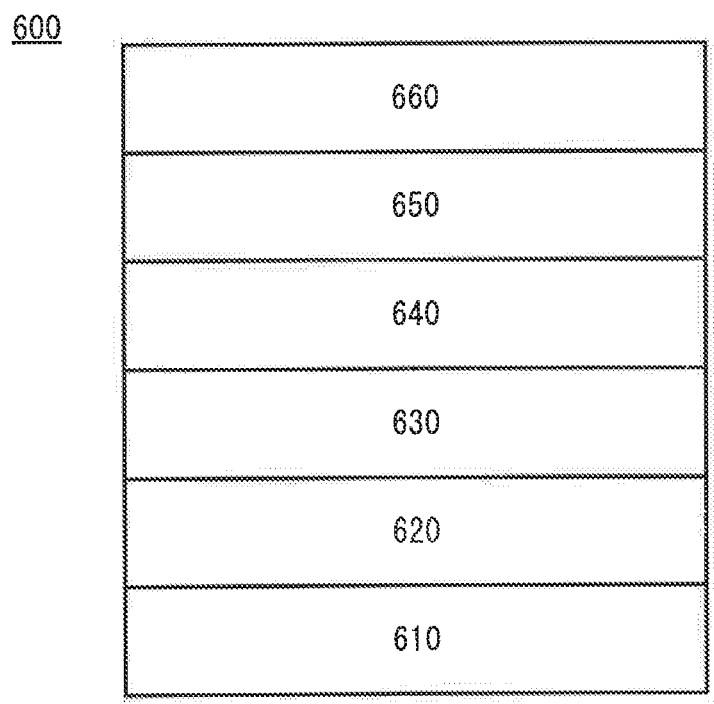
FIG. 42A shows a structure of samples of Example.

As illustrated in FIG. 42A, the MOS elements 600 include an n-type silicon 620 over a conductor 610, an oxide 630 over the n-type silicon 620, a fixed charge layer 640 over the oxide 630, an oxide 650 over the fixed charge layer 640, and a conductor 660 over the oxide 630.

A method of fabricating samples of this example is described below. The thickness of the fixed charge layer 640 was set to 5 nm for Sample 1, 10 nm for Sample 2, and 20 nm for Sample 3. Five types of each of Samples 1 to 3 were fabricated under Conditions a to e for the thickness of the oxide 650: Condition a was 30 nm; Condition b, 55 nm; Condition c, 80 nm; Condition d, 120 nm; and Condition e, 160 nm.

Sample 1-a, Sample 1-b, Sample 1-c, Sample 1-d, Sample 1-e, Sample 2-a, Sample 2-b, Sample 2-c, Sample 2-d, Sample 2-c, Sample 3-a, Sample 3-b, Sample 3-c, Sample 3-d, and Sample 3-e were fabricated as 15 types of samples in total.

First, an n-type silicon wafer was prepared as the n-type silicon 620.

Next, as the oxide 630, the silicon oxynitride film was formed to a thickness of 10 nm over the n-type silicon wafer by a plasma CVD method. In the film formation, 1.0 sccm of silane and 800 sccm of dinitrogen monoxide were used as deposition gases, the pressure in a reaction chamber was 40 Pa, the substrate temperature was 500° C., and high-frequency (RF) power at 150 W was applied.

Next, as the fixed charge layer 640, the hafnium oxide film was formed over the silicon oxynitride film by a sputtering method. In the film formation, 25 sccm of oxygen and 25 sccm of argon were used as sputtering gases, the pressure in a treatment chamber was 0.7 Pa, the substrate temperature was 200° C., and high-frequency (RF) power at 2.5 kW was applied. As a sputtering target, hafnium oxide (HfOx) was used.

The thickness of the hafnium oxide film was set to 5 nm for Samples 1-a, 1-b, 1-c, 1-d, and 1-c. The thickness of the hafnium oxide film was set to 10 nm for Samples 2-a, 2-b, 2-c, 2-d, and 2-c. The thickness of the hafnium oxide film was set to 20 nm for Samples 3-a, 3-b, 3-c, 3-d, and 3-e.

Then, as the oxide 650, the silicon oxynitride film was formed over the hafnium oxide film by a plasma CVD method. In the film formation, 1.0 sccm of silane and 800 sccm of dinitrogen monoxide were used as deposition gases, the pressure in a reaction chamber was 40 Pa, the substrate temperature was 500° C., and high-frequency (RF) power at 150 W was applied.

The thickness of the silicon oxynitride film was set to 30 nm for Samples 1-a, 2-a, and 3-a. The thickness of the silicon oxynitride film was set to 55 nm for Samples 1-b, 2-b, and 3-b. The thickness of the silicon oxynitride film was set to 80 nm for Samples 1-c, 2-c, and 3-c. The thickness of the silicon oxynitride film was set to 120 nm for Samples 1-d, 2-d, and 3-d. The thickness of the silicon oxynitride film was set to 160 nm for Samples 1-e, 2-c, and 3-e.

Next, heat treatment was performed. The heat treatment was performed at 550° C. in an oxygen atmosphere for an hour.

Next, as the conductor 660, a stacked-layer structure including a titanium nitride film, a tungsten film, and an aluminum film was formed.

First, a 30-nm-thick titanium nitride film was formed over the silicon oxynitride film by a sputtering method. In the formation of the titanium nitride film, 50 sccm of nitrogen was used as a sputtering gas, the pressure in a treatment chamber was 0.2 Pa, the substrate was not heated, and a DC power at 12 kW was applied. As a sputtering target, titanium (Ti) was used.

Further, a 135-nm-thick tungsten film was formed over the titanium nitride film by a sputtering method. In the formation of the tungsten film, 100 sccm of argon was used as a sputtering gas, the pressure in a treatment chamber was 2.0 Pa, the substrate temperature was 230° C., and a DC power at 4 kW was applied. As a sputtering target, tungsten (W) was used.

Next, heat treatment was performed. The heat treatment was performed at 400° C. in a nitrogen atmosphere for an hour.

Then, a 200-nm-thick aluminum film was formed over the tungsten film by a sputtering method. As a sputtering gas, 50 sccm of argon was used, the pressure in a treatment chamber was 0.4 Pa, the substrate was not heated, and a DC power at 1 kW was applied. As a sputtering target, aluminum (Al) was used.

Lastly, as the conductor 610, a 400-nm-thick aluminum film was formed on the rear surface of the n-type silicon wafer by a sputtering method. As a sputtering gas, 50 sccm of argon was used, the pressure in the treatment chamber was 0.4 Pa, the substrate was not heated, and a DC power at 1 kW was applied. As a sputtering target, aluminum (Al) was used.

Next, the C-V characteristics of the fabricated samples were measured. The C-V characteristics were measured with one sweep of the gate voltage $V_g$ from −10 V to +10 V at room temperature at a measurement frequency of 10 kHz. Note that the sweep was performed in 0.5 V increments from −10 V to −2 V and from +5 V to +10 V and in 0.1 V increments from −2 V to +5 V.

Figure 42B:
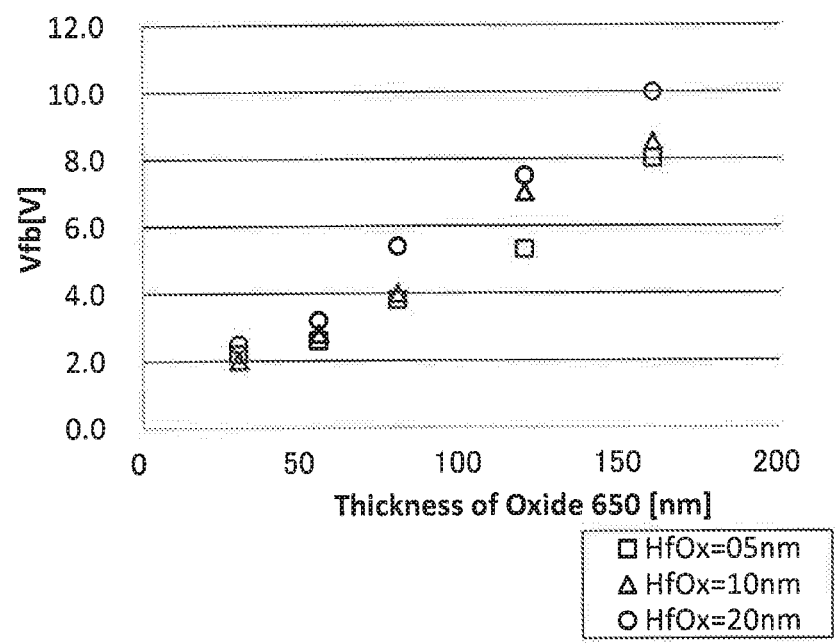
FIG. 42B shows $V_{fb}$ of transistors.

FIG. 42B shows the results of the flat band voltages $V_{fb}$ of Samples 1 to 3 which were measured using the C-V characteristics. Note that in this example, the term flat band voltage $V_{fb}$ refers to a voltage needed to cancel the effect of the fixed charges in the oxide 630, the fixed charge layer 640, and the oxide 650. The results of Samples 1-a to 1-e are indicated by the white squares, the results of Samples 2-a to 2-e are indicated by the white triangles, and the results of Samples 3-a to 3-e are indicated by the white circles.

These results show that, the larger the thickness of the oxide 650 becomes, the more the flat band voltage $V_{fb}$ shifts in the positive direction. In addition, the larger the thickness of the fixed charge layer 640 becomes, the more the flat band voltage $V_{fb}$ shifts in the positive direction. Therefore, the flat band voltage $V_{fb}$ can be controlled by appropriate adjustment of the thicknesses of the oxide 650 and the fixed charge layer 640.

Example 2

In this example, a semiconductor device including transistors of one embodiment of the present invention and the like was fabricated, and a cross section thereof was observed by scanning transmission electron microscopy (STEM).

In the fabrication of the semiconductor device, an SOI substrate was used, and, on the SOI substrate, a first transistor including a channel formation region in a silicon single crystal semiconductor, a first wiring, and a second wiring were formed (first layer).

Next, over the first layer, a second transistor including a channel formation region in an In—Ga—Zn oxide, a first capacitor, a third wiring, and a fourth wiring were formed (second layer). The second transistor includes a multi-layer film including a tungsten film that functions as a top-gate electrode, a silicon oxynitride film that functions as a gate insulating film, a tungsten film that functions as a back gate electrode, a silicon oxynitride film that functions as a gate insulating film and accumulates fixed charges, a hafnium oxide film, and a silicon oxynitride film.

Next, over the second layer, a third transistor including a channel formation region in an In—Ga—Zn oxide, a second capacitor, a fifth wiring, a sixth wiring and a seventh wiring were formed (third layer). The third transistor includes a multi-layer film including a tungsten film that functions as a top-gate electrode, a silicon oxynitride film that functions as a gate insulating film, a tungsten film that functions as a back gate electrode, a silicon oxynitride film that functions as a gate insulating film and accumulates fixed charges, a hafnium oxide film, and a silicon oxynitride film. Next, a polyimide film that functions as a protective film was formed over the third layer. Through the above process, the semiconductor device was fabricated.

Figure 43:
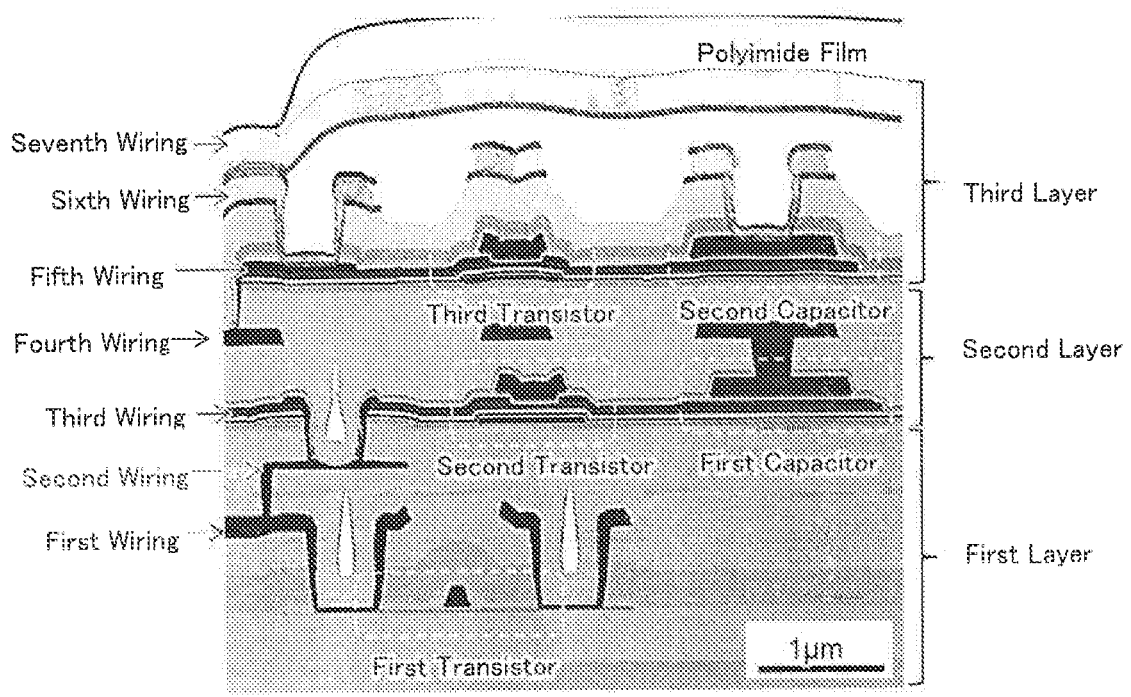
FIG. 43 is a STEM cross-sectional image of a semiconductor device of Example.

Next, a cross section of the semiconductor device was observed by STEM. FIG. 43 is a STEM cross-sectional image. This shows that the semiconductor device including the first to third transistors, the first and second capacitors, and the first to seventh wirings were favorably fabricated.

This application is based on Japanese Patent Application serial no. 2015-154018 filed with Japan Patent Office on Aug. 4, 2015 and 2016-023269 filed with Japan Patent Office on Feb. 10, 2016, the entire contents of which are hereby incorporated by reference.

What is claimed is:
1. A semiconductor device comprising:
a first transistor comprising a first oxide semiconductor over a substrate; and
a second transistor comprising a second oxide semiconductor over the substrate,
wherein the first oxide semiconductor overlaps a first conductor with a first insulator, a first charge retention layer, and a second insulator provided therebetween,
wherein the second oxide semiconductor overlaps a second conductor with a third insulator, a second charge retention layer, and a fourth insulator provided therebetween, and wherein a thickness of the first charge retention layer and a thickness of the second charge retention layer are different from each other.

2. The semiconductor device according to claim 1, wherein each of the first charge retention layer and the second charge retention layer comprises any one of hafnium oxide, hafnium oxynitride, aluminum oxide, and aluminum oxynitride.

3. The semiconductor device according to claim 1, wherein the first charge retention layer and the second charge retention layer comprise a same material.

4. The semiconductor device according to claim 1, wherein the first insulator and the third insulator comprise one of silicon oxide and silicon oxynitride.

5. The semiconductor device according to claim 1, wherein a thickness of the first insulator and a thickness of the third insulator are the same.

6. The semiconductor device according to claim 1, wherein the second insulator and the fourth insulator comprise one of silicon oxide and silicon oxynitride.

7. The semiconductor device according to claim 1, wherein a thickness of the second insulator and a thickness of the fourth insulator are the same.

8. The semiconductor device according to claim 1, wherein the first insulator is provided over the first conductor, the first charge retention layer is provided over the first insulator, and the second insulator is provided over the first charge retention layer.

9. The semiconductor device according to claim 1, wherein the third insulator is provided over the second conductor, the second charge retention layer is provided over the third insulator, and the fourth insulator is provided over the second charge retention layer.

10. An electronic device comprising:
the semiconductor device according to claim 1; and
at least one of a battery, an antenna, a housing, and an operation switch.

11. A semiconductor device comprising:
a first transistor comprising a first oxide semiconductor over a substrate; and
a second transistor comprising a second oxide semiconductor over the substrate,
wherein the first oxide semiconductor overlaps a first conductor with at least a first insulating film and a first charge retention layer provided therebetween,
wherein the second oxide semiconductor overlaps a second conductor with at least a second insulating film and a second charge retention layer provided therebetween,
wherein each of the first insulating film and the second insulating film comprises silicon and oxygen,
wherein each of the first charge retention layer and the second charge retention layer comprises any one of hafnium oxide, hafnium oxynitride, aluminum oxide, and aluminum oxynitride, and
wherein a thickness of the first charge retention layer and a thickness of the second charge retention layer are different from each other.

12. The semiconductor device according to claim 11, wherein the first charge retention layer and the second charge retention layer comprise a same material.

13. The semiconductor device according to claim 11, wherein the first insulating film and the second insulating film comprise one of silicon oxide and silicon oxynitride.

14. The semiconductor device according to claim 11, wherein a thickness of the first insulating film and a thickness of the second insulating film are same.

15. The semiconductor device according to claim 11, wherein the first insulating film is provided over the first charge retention layer, and
wherein the second insulating film is provided over the second charge retention layer.

16. An electronic device comprising:
the semiconductor device according to claim 11; and
at least one of a battery, an antenna, a housing, and an operation switch.

* * * * *